US009276170B2

(12) United States Patent
Wang et al.

(10) Patent No.: US 9,276,170 B2
(45) Date of Patent: Mar. 1, 2016

(54) SEMICONDUCTOR LIGHT EMITTING ELEMENT AND METHOD OF MANUFACTURING SEMICONDUCTOR LIGHT EMITTING ELEMENT

(71) Applicant: TOYODA GOSEI CO., LTD., Kiyosu-shi, Aichi-ken (JP)

(72) Inventors: Honglin Wang, Ichihara (JP); Eisuke Yokoyama, Ichihara (JP)

(73) Assignee: TOYODA GOSEI CO., LTD., Aichi (JP)

( * ) Notice: Subject to any disclaimer, the term of this patent is extended or adjusted under 35 U.S.C. 154(b) by 0 days.

(21) Appl. No.: 14/060,000

(22) Filed: Oct. 22, 2013

(65) Prior Publication Data

US 2014/0110744 A1    Apr. 24, 2014

(30) Foreign Application Priority Data

Oct. 23, 2012  (JP) ................................. 2012-234187
Nov. 20, 2012  (JP) ................................. 2012-254089

(51) Int. Cl.

| H01L 27/15 | (2006.01) |
|---|---|
| H01L 29/26 | (2006.01) |
| H01L 31/12 | (2006.01) |

(Continued)

(52) U.S. Cl.
CPC ............ *H01L 33/20* (2013.01); *H01L 33/0095* (2013.01); *H01L 31/0352* (2013.01); *H01L 33/02* (2013.01); *H01L 33/24* (2013.01); *H01L 33/42* (2013.01)

(58) Field of Classification Search
CPC ....... H01L 33/005; H01L 33/02; H01L 33/20; H01L 33/42; H01L 33/62; H01L 33/00075; H01L 33/0079; H01L 33/0095; H01L 33/22; H01L 33/24; H01L 33/32; H01L 33/38; H01L 33/486; H01L 33/54; H01L 33/0075; H01L 31/0352
USPC ................................... 257/79, 95, 99; 438/26
See application file for complete search history.

(56) References Cited

U.S. PATENT DOCUMENTS

| 5,428,227 A * | 6/1995 | Satoh ............................... 257/95 |
| 2005/0221527 A1* | 10/2005 | Yeh et al. ......................... 438/46 |

(Continued)

FOREIGN PATENT DOCUMENTS

| CN | 101604718 A | 12/2009 |
| EP | 2498305 A2 * | 9/2012 |

(Continued)

*Primary Examiner* — Teresa M Arroyo
(74) *Attorney, Agent, or Firm* — Sughrue Mion, PLLC

(57) ABSTRACT

A semiconductor light emitting element includes a laminated semiconductor layer including a light emitting layer that emits light by passing a current, the laminated semiconductor layer has a lower semiconductor bottom surface, a semiconductor side surface that rises from an edge of the lower semiconductor bottom surface upwardly and outwardly of the laminated semiconductor layer, and a lower semiconductor top surface that faces upward by extending inwardly of the laminated semiconductor layer from an upper edge of the semiconductor side surface, an edge of the lower semiconductor top surface includes first and second linear portions extending linearly and plural connecting portions connecting the first and second linear portions, and, when viewed from a direction perpendicular to the lower semiconductor top surface, each connecting portion is positioned inside a point of intersection of extended lines of the first and second linear portions connected to the connecting portion.

4 Claims, 33 Drawing Sheets

(51) Int. Cl.
*H01L 33/00* (2010.01)
*H01L 33/20* (2010.01)
*H01L 31/0352* (2006.01)
*H01L 33/02* (2010.01)
*H01L 33/24* (2010.01)
*H01L 33/42* (2010.01)

(56) References Cited

U.S. PATENT DOCUMENTS

2008/0048206 A1* 2/2008 Lee et al. .................. 257/103
2008/0142814 A1* 6/2008 Chu et al. .................. 257/79
2010/0289000 A1* 11/2010 Kojima ...................... 257/13
2012/0164773 A1* 6/2012 Tu et al. ..................... 438/47

FOREIGN PATENT DOCUMENTS

| | | |
|---|---|---|
| JP | 8-293476 A | 11/1996 |
| JP | 2006-228855 A | 8/2006 |
| JP | 2007-116114 A | 5/2007 |
| JP | 2007-294566 A | 11/2007 |
| JP | 2012-64656 A | 3/2012 |
| WO | WO 2014141972 A1 * | 9/2014 |

* cited by examiner

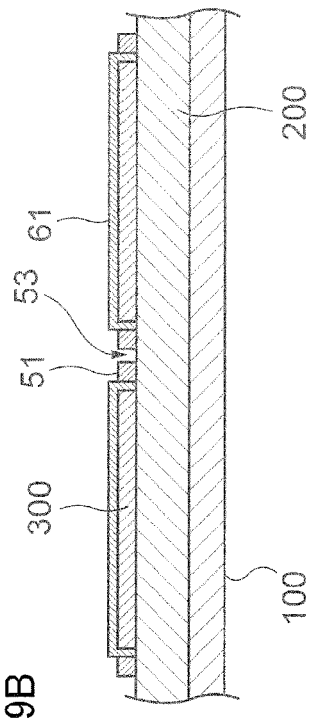
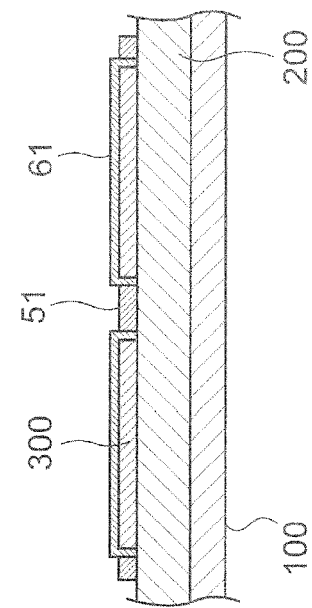
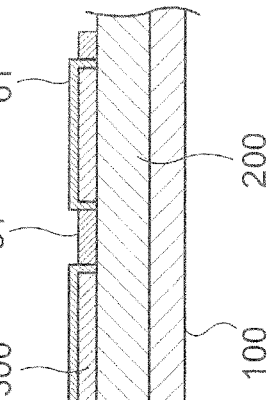
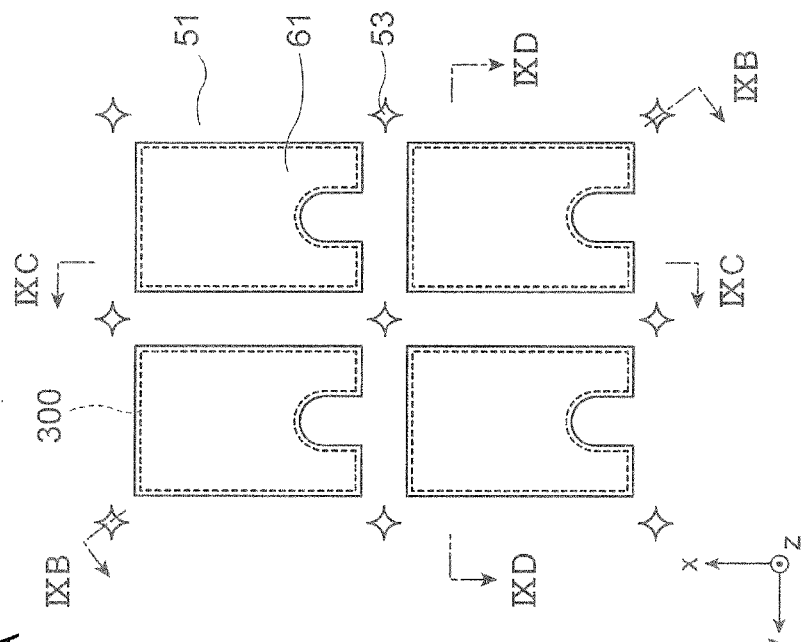

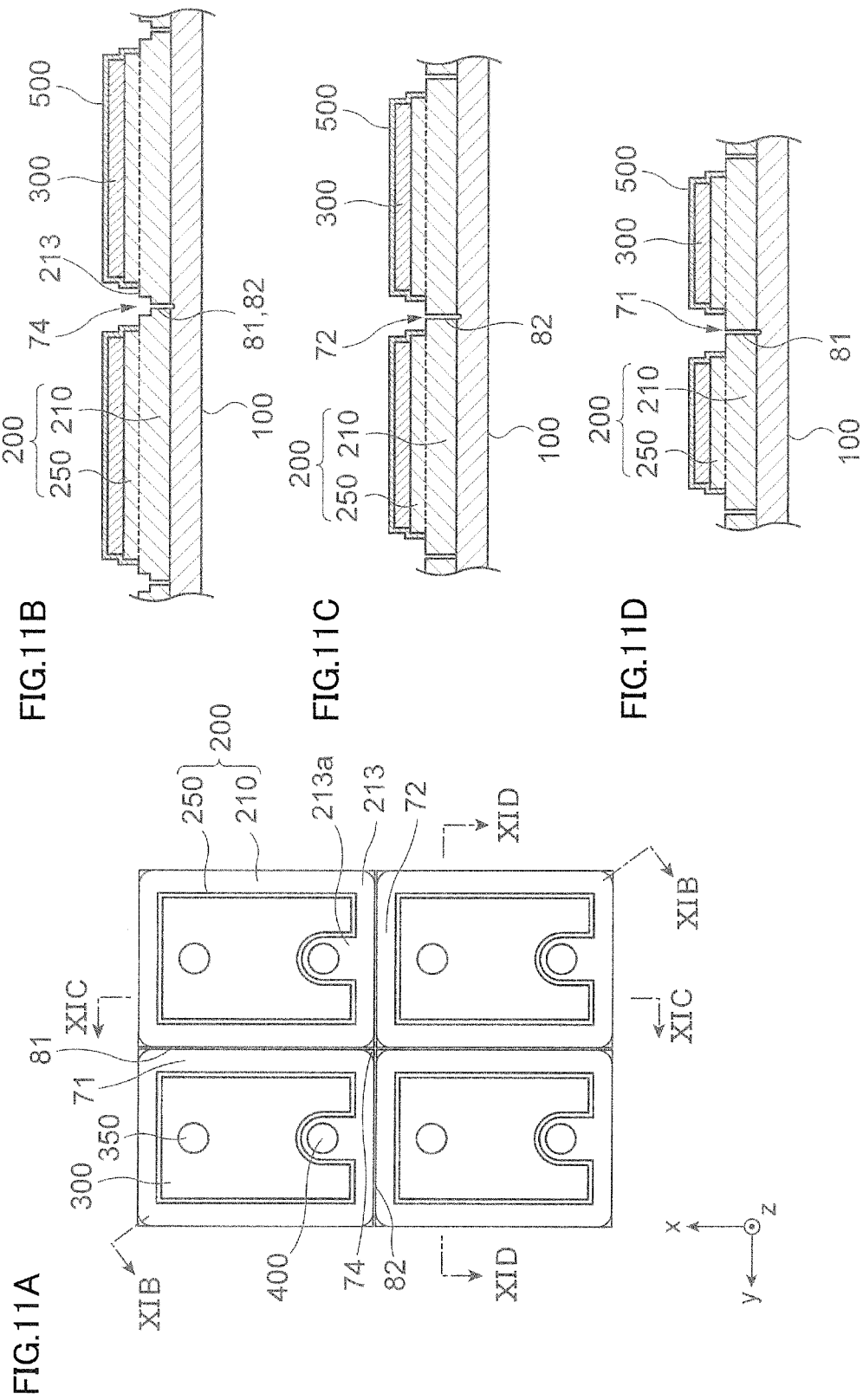

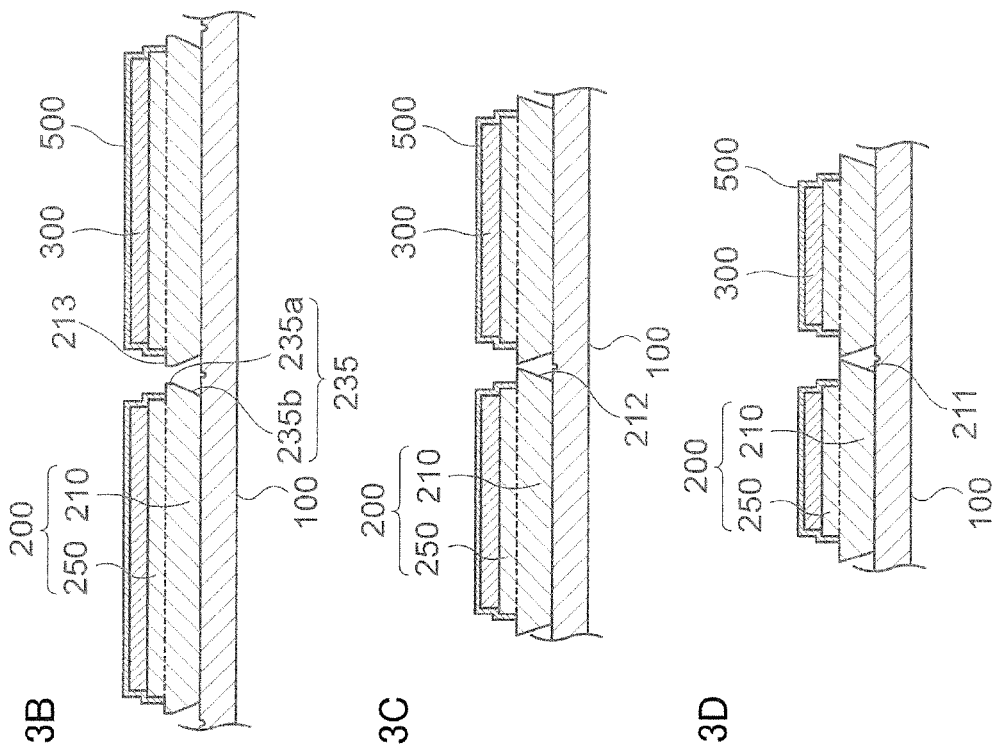
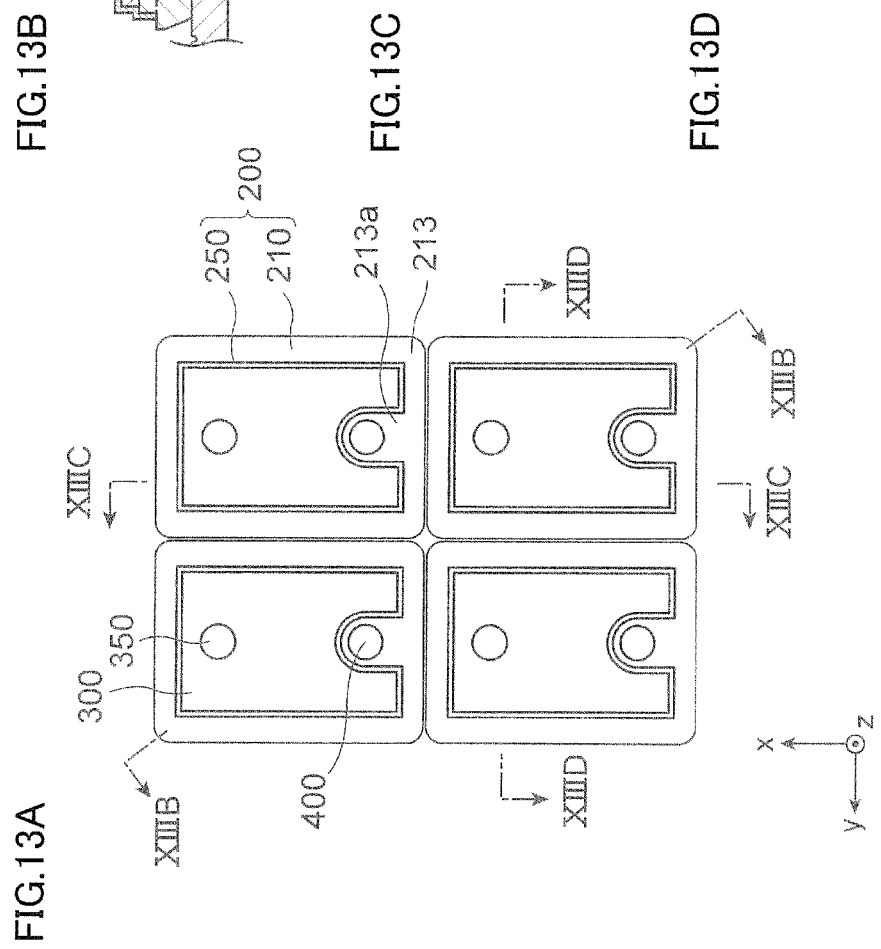

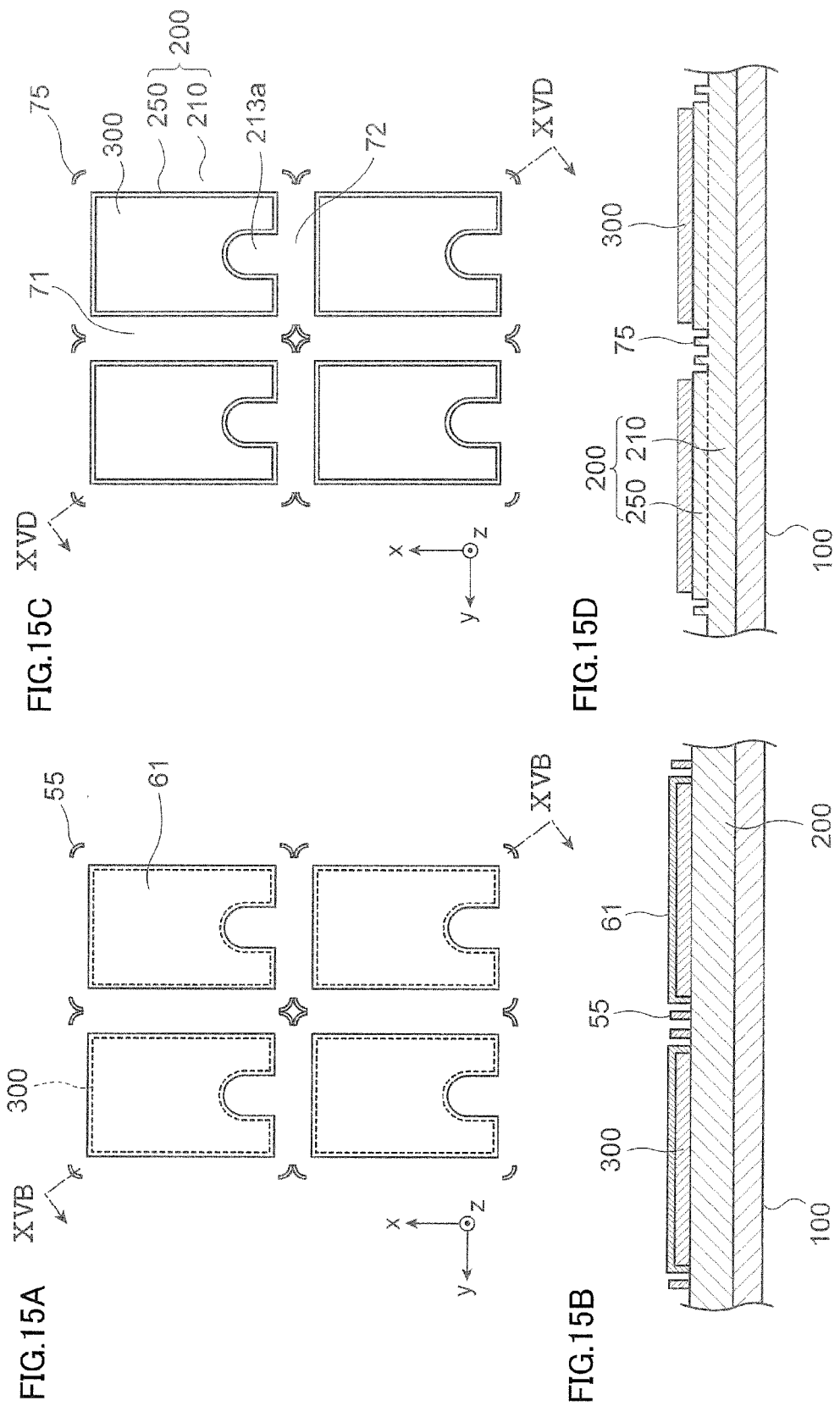

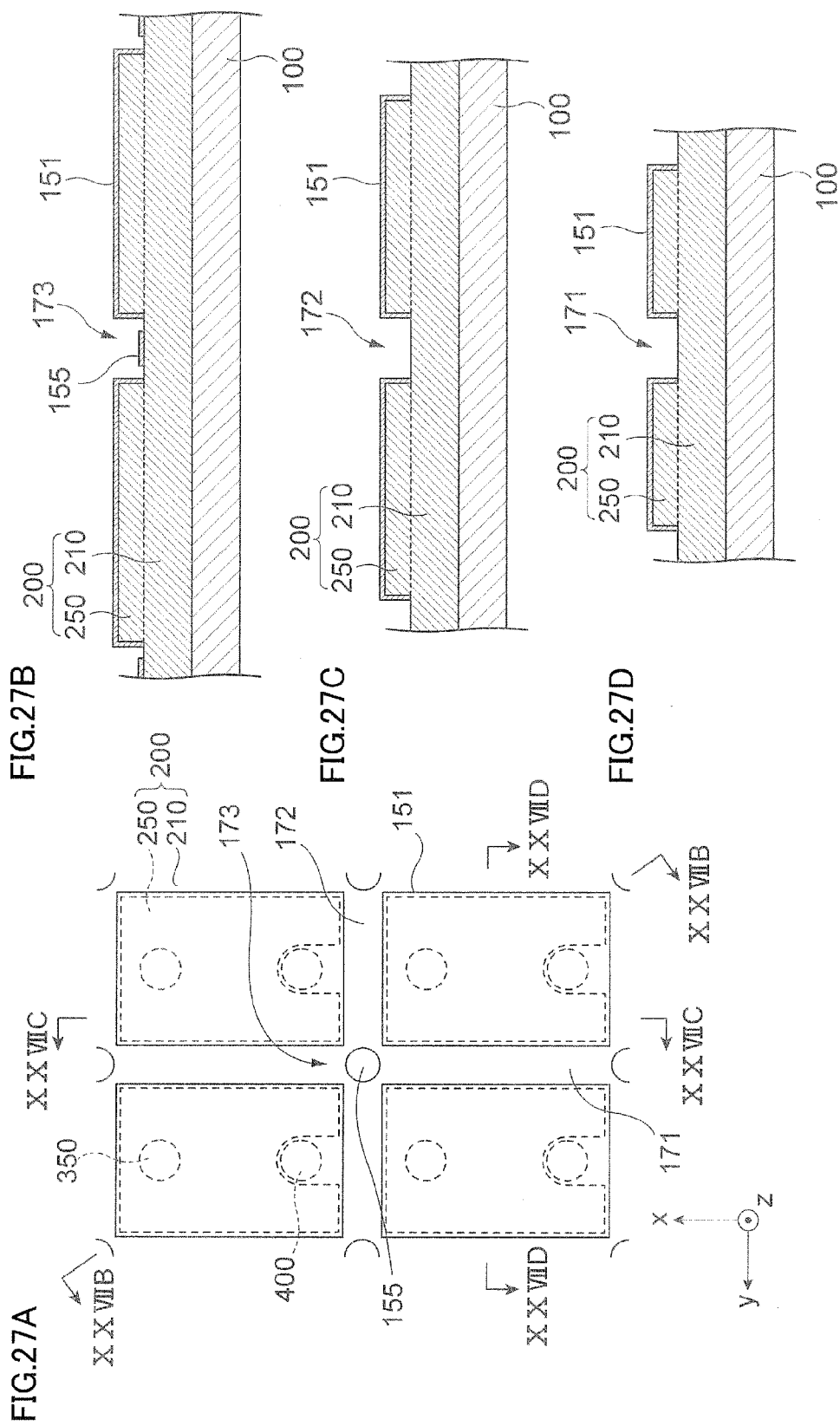

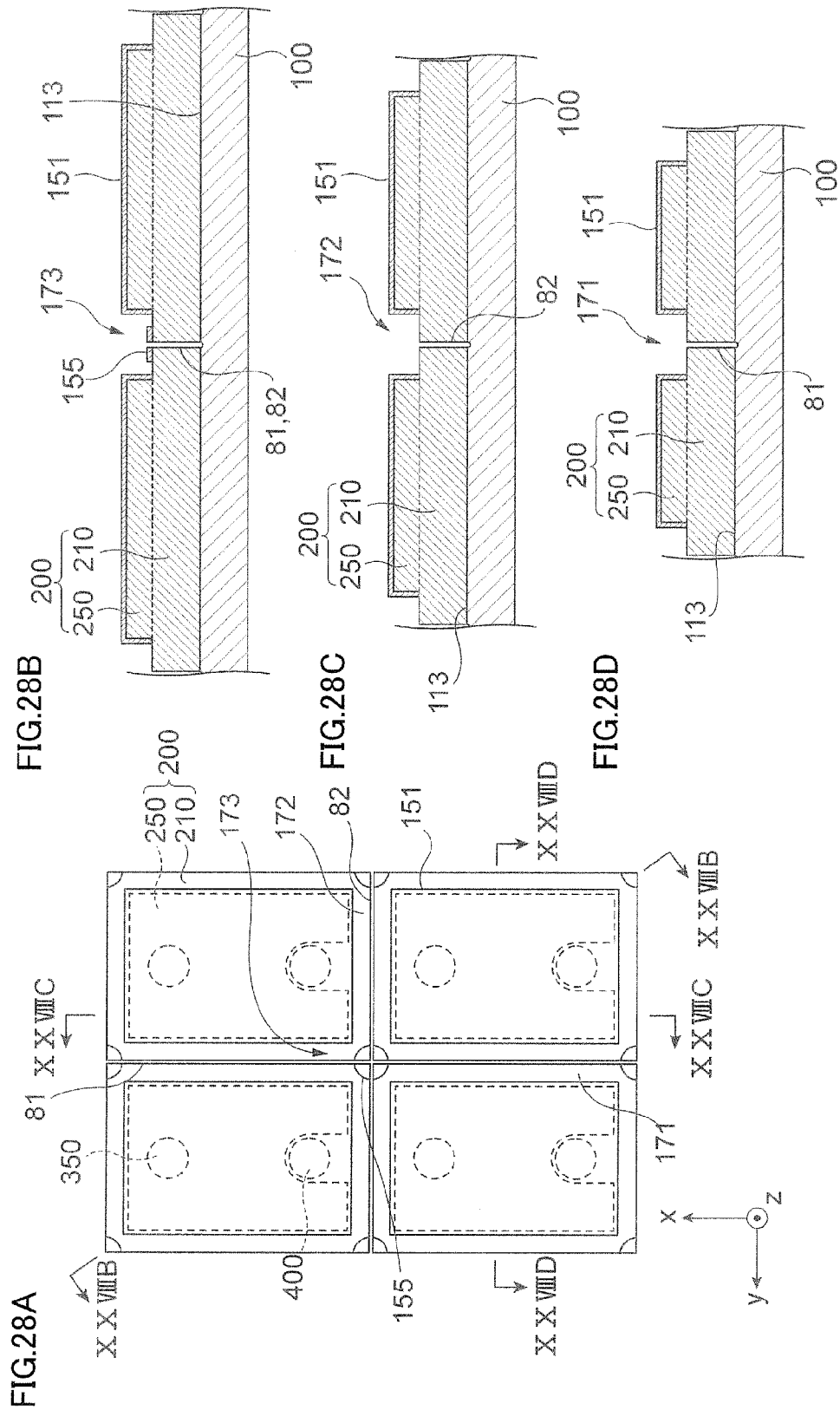

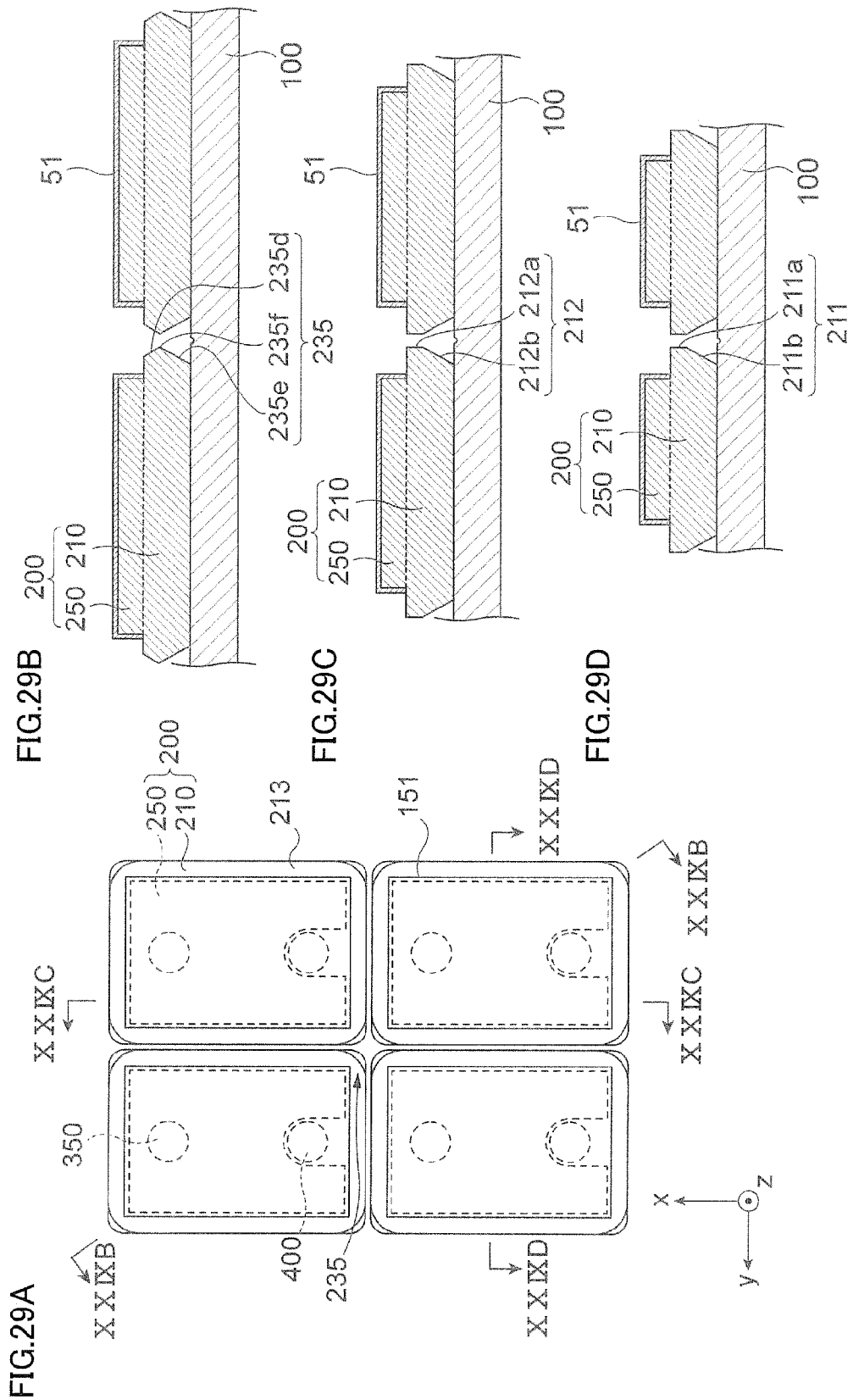

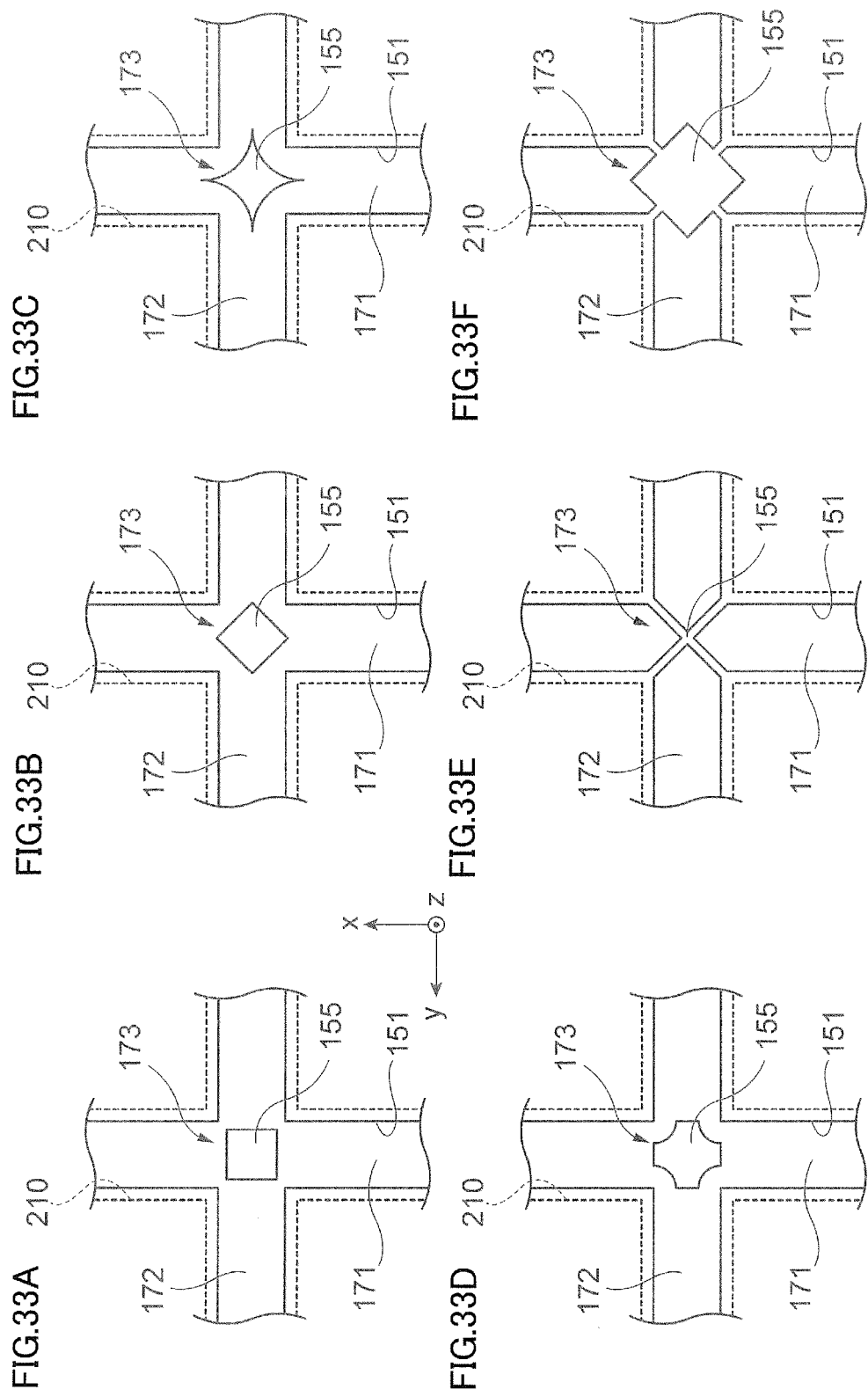

SEMICONDUCTOR LIGHT EMITTING ELEMENT AND METHOD OF MANUFACTURING SEMICONDUCTOR LIGHT EMITTING ELEMENT

CROSS REFERENCE TO RELATED APPLICATIONS

This application is based on and claims priority under 35 USC §119 from Japanese Patent Applications Nos. 2012-234187 and 2012-254089 filed Oct. 23, 2012 and Nov. 20, 2012, respectively.

BACKGROUND

1. Technical Field

The present invention relates to a semiconductor light emitting element and a method of manufacturing a semiconductor light emitting element.

2. Related Art

A semiconductor light emitting element in which a group III nitride semiconductor layer containing a light emitting layer that emits light by passing a current is laminated on a substrate is known.

In such a semiconductor light emitting element, there is a technique that improves light extraction efficiency in the semiconductor light emitting element by causing a side surface of the group III nitride semiconductor layer to be inclined outwardly with respect to a normal to a top surface of the substrate so that a shape of a cross section of the group III nitride semiconductor layer becomes narrow toward a substrate side (refer to Japanese Patent Application Laid-Open Publication No. 2007-116114).

Incidentally, in the case where the side surface of the semiconductor layer is inclined outwardly with respect to the normal to the top surface of the substrate in the semiconductor light emitting element, there is a possibility that cracking occurs in an end portion of the semiconductor layer.

It is an object of the present invention to provide a semiconductor light emitting element that suppresses cracking in the semiconductor layer.

SUMMARY

According to an aspect of the present invention, there is provided a semiconductor light emitting element including: a semiconductor layer including a light emitting layer that emits light by passing a current, wherein the semiconductor layer has a semiconductor bottom surface, a semiconductor side surface that rises from a first edge of the semiconductor bottom surface upwardly and outwardly of the semiconductor layer, and a semiconductor top surface that faces upward by extending inwardly of the semiconductor layer from a second edge in an upper portion of the semiconductor side surface, and the second edge includes plural linear portions that extend linearly and plural connecting portions, each of which connects the adjacent linear portions, and when viewed from a direction perpendicular to the semiconductor top surface, each of the plural connecting portions is positioned inside a point of intersection of extended lines of two linear portions that are connected to the connecting portion.

Moreover, in the semiconductor light emitting element according to the present invention, a thickness of the connecting portion in the semiconductor layer is larger than a thickness of the linear portion in the semiconductor layer.

Further, in the semiconductor light emitting element according to the present invention, the plural linear portions include, when the semiconductor layer is viewed from the direction perpendicular to the semiconductor top surface, a first linear portion that extends in a first direction and a second linear portion that extends in a second direction perpendicular to the first direction and is connected to the first linear portion via the connecting portion, and when the semiconductor layer is viewed from the direction perpendicular to the semiconductor top surface, X, Y and L satisfy the following relation: $L^2 = A \times (X^2 + Y^2)$, $0 < A \le 0.95$, where it is assumed that a shortest distance from the first linear portion to the first edge is X, a shortest distance from the second linear portion to the first edge is Y, and a shortest distance from a point of intersection of a straight line and the connecting portion to the first edge is L, the straight line connecting a shortest distance from a point of intersection of an extended line of the first linear portion and an extended line of the second linear portion to the first edge.

Still further, in the semiconductor light emitting element according to the present invention, the connecting portion has an arc shape when the semiconductor layer is viewed from the direction perpendicular to the semiconductor top surface.

Moreover, in the semiconductor light emitting element according to the present invention, the semiconductor side surface includes a linear portion side surface that rises from the first edge toward the linear portion in the second edge and a connecting side surface that rises from the first edge toward the connecting portion in the second edge, and the connecting side surface includes an outward inclined surface that is inclined upwardly and outwardly of the semiconductor layer from the first edge and an inward inclined surface that is inclined upwardly and inwardly of the semiconductor layer from an upper end of the outward inclined surface toward the connecting portion in the second edge.

Moreover, according to another aspect of the present invention, there is provided a method of manufacturing a semiconductor light emitting element, including: a covering portion forming process that forms a covering portion to cover a partial region on a semiconductor layer in a semiconductor lamination substrate, which is formed by laminating the semiconductor layer that includes a light emitting layer to emit light by passing a current and is composed of a group III nitride on a substrate, the covering portion being composed of a material different from the material of the semiconductor layer; a dividing groove forming process that forms plural dividing grooves that intersect each other in the covering portion and divide the semiconductor layer into plural regions by locally removing the semiconductor layer in the semiconductor lamination substrate, in which the covering portion is formed, from a side where the covering portion is formed to reach the substrate; and a wet etching process that performs wet etching on the semiconductor lamination substrate in which the covering portion and the plural dividing grooves are formed.

Moreover, in the method of manufacturing a semiconductor light emitting element according to the present invention, in the covering portion forming process, the covering portion is formed by an insulating film having an insulating property, and other covering portion constituted by the insulating film is formed to cover a region on the semiconductor layer different from the region covered by the covering portion, and in the dividing groove forming process, the plural dividing grooves are formed to intersect each other in the covering portion and not to pass through the other covering portion.

Further, the method of manufacturing a semiconductor light emitting element further includes, prior to the covering portion forming process, a semiconductor removing process that locally removes part of the semiconductor layer in the semiconductor lamination substrate from a side opposite to the substrate to form plural grooves in which the semiconductor layer is recessed toward the substrate, the plural grooves intersecting each other, to thereby separate the semiconductor layer in the side opposite to the substrate into plural regions, wherein, in the covering portion forming process, the covering portion is formed at an intersecting portion where the plural grooves intersect each other, and in the dividing groove forming process, the plural dividing grooves are formed to extend along the plural grooves and intersect each other at the intersecting portion.

Still further, in the method of manufacturing a semiconductor light emitting element according to the present invention, in the covering portion forming process, by forming the covering portion on a partial region in the semiconductor layer, an altered region that alters the partial region in the semiconductor layer is formed.

Moreover, according to still another aspect of the present invention, there is provided a method of manufacturing a semiconductor light emitting element, including: a semiconductor removing process that locally removes part of a semiconductor layer in a semiconductor lamination substrate, which is formed by laminating the semiconductor layer that includes a light emitting layer to emit light by passing a current and is composed of a group III nitride on a substrate, from a side opposite to the substrate, to thereby form an asperity portion in which the semiconductor layer is partially recessed and partially projected; a dividing groove forming process that locally removes part of the semiconductor layer in the semiconductor lamination substrate, in which the asperity portion is formed, from the side opposite to the substrate to reach the substrate, to thereby form plural dividing grooves that intersect each other in the asperity portion and divide the semiconductor layer into plural regions; and a wet etching process that performs wet etching on the semiconductor lamination substrate in which the asperity portion and the plural dividing grooves are formed.

According to the present invention, it is possible to provide a semiconductor light emitting element that suppresses cracking in the semiconductor layer.

BRIEF DESCRIPTION OF THE DRAWINGS

Exemplary embodiments of the present invention will be described in detail based on the following figures, wherein:

FIGS. 9A to 9D are diagrams showing the semiconductor lamination substrate, in which a transparent conductive layer and a resist have been formed, obtained by executing processes up to a resist forming process;

FIGS. 11A to 11D are diagrams showing the semiconductor lamination substrate, in which a first irradiation line and a second irradiation line have been formed, obtained by executing an electrode forming process and a surface laser process;

FIGS. 13A to 13D are diagrams showing the semiconductor lamination substrate obtained by executing a second etching process;

FIGS. 15A to 15D are diagrams for illustrating a method of manufacturing a semiconductor light emitting element in a second mode;

FIGS. 27A to 27D are diagrams showing the semiconductor lamination substrate, in which masks and protecting films have been formed, obtained by executing a film forming process;

FIGS. 28A to 28D are diagrams showing the semiconductor lamination substrate, in which a first irradiation line and a second irradiation line are formed, obtained by executing a surface laser process;

FIGS. 29A to 29D are diagrams showing the semiconductor lamination substrate obtained by executing a wet etching process;

FIGS. 33A to 33F are diagrams showing other shapes of the mask formed in the film forming process.

DETAILED DESCRIPTION

Figure 1:
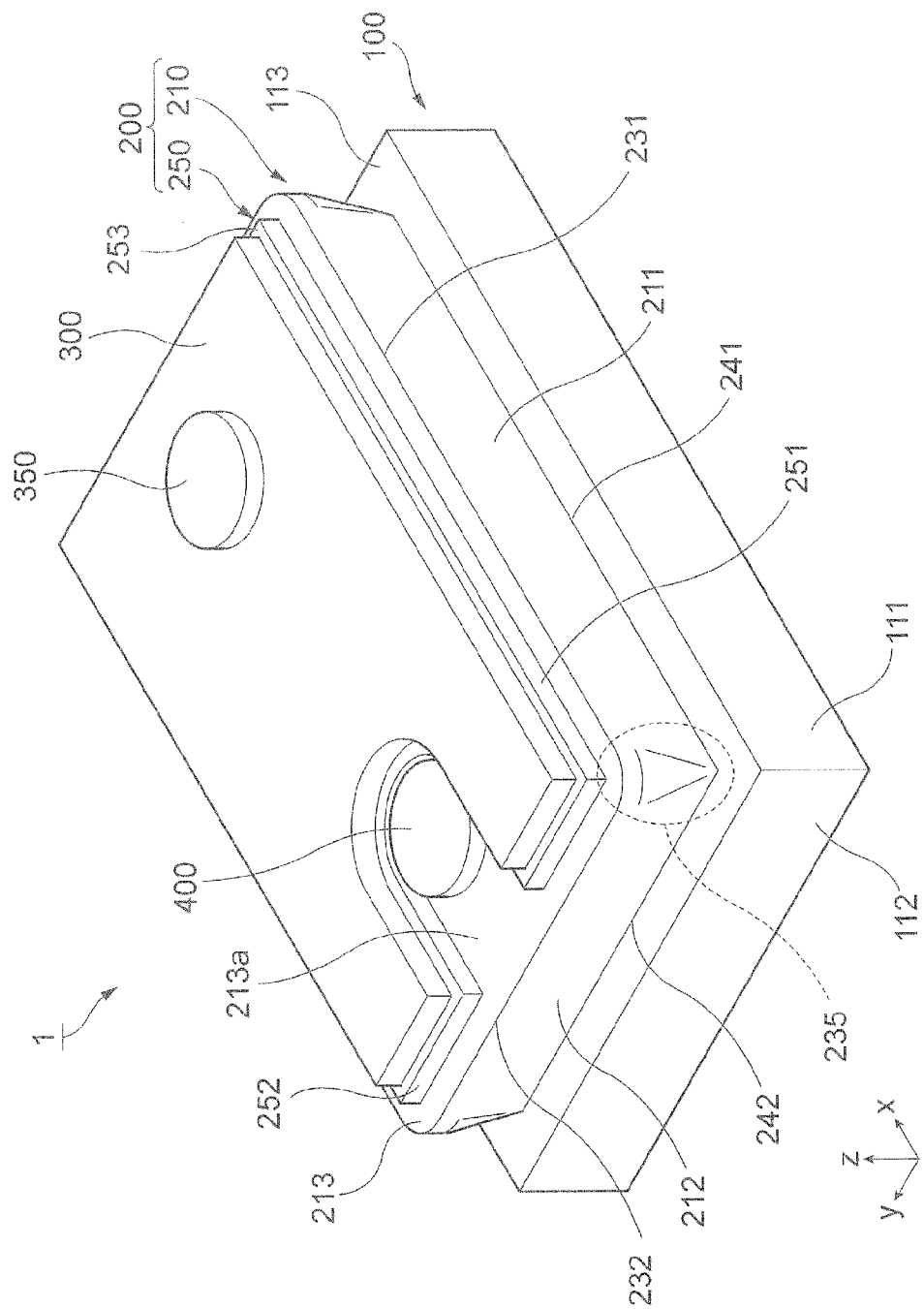
FIG. 1 is an example of a perspective view of a semiconductor light emitting element to which a first exemplary embodiment is applied.

Hereinafter, exemplary embodiments according to the present invention will be described in detail with reference to accompanying drawings. It should be noted that there are some cases where a size or a thickness of each component in the drawings that are referred to in the following description is different from a dimension of an actual semiconductor light emitting element and the like.

First Exemplary Embodiment

Structure of Semiconductor Light Emitting Element

Figure 2:
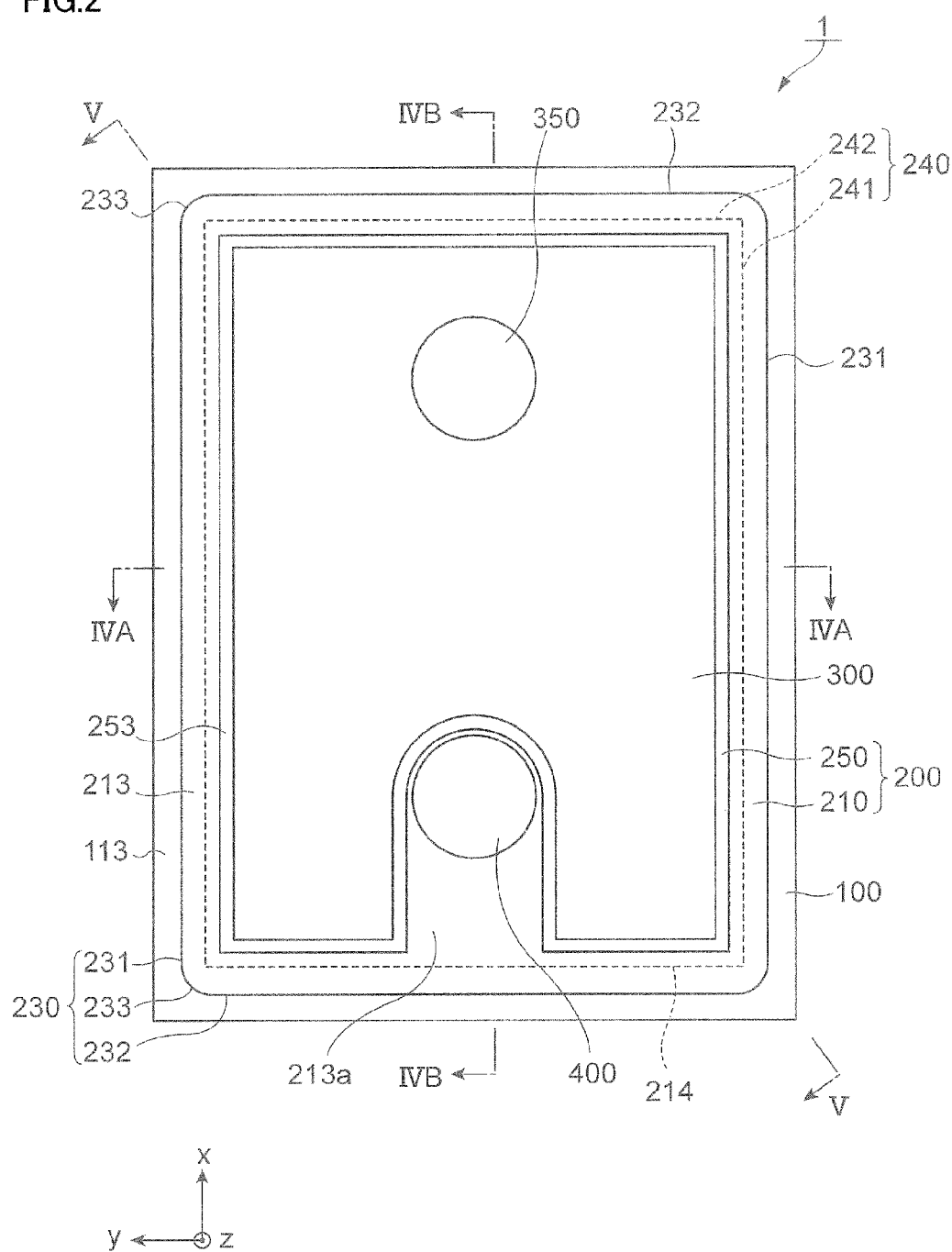
FIG. 2 is an example of a top view of the semiconductor light emitting element shown in FIG. 1.

FIG. 1 is an example of a perspective view of a semiconductor light emitting element 1 to which a first exemplary embodiment is applied, and FIG. 2 is an example of a top view of the semiconductor light emitting element 1 shown in FIG. 1.

As shown in FIGS. 1 and 2, the semiconductor light emitting element 1 of the exemplary embodiment includes: a substrate 100; a laminated semiconductor layer 200, which is an example of a semiconductor layer, laminated on the substrate 100; a transparent conductive layer 300 laminated on the laminated semiconductor layer 200; a p-electrode 350 formed on the transparent conductive layer 300; and an n-electrode 400 formed on the laminated semiconductor layer 200.

In addition, the laminated semiconductor layer 200 of the exemplary embodiment includes a lower semiconductor layer 210 laminated on the substrate 100 and an upper semiconductor layer 250 laminated on the lower semiconductor layer 210. It should be noted that, in this example, the n-electrode 400 is formed on the lower semiconductor layer 210 (a semiconductor exposure surface 213a, which will be described later).

Moreover, as shown in FIG. 1, the semiconductor light emitting element 1 of the exemplary embodiment has a shape of substantially a rectangular parallelepiped. Then, as shown in FIG. 2, the semiconductor light emitting element 1 has substantially a rectangular shape including long sides and short sides in a case of being viewed from a side where the p-electrode 350 and the n-electrode 400 are formed.

In the exemplary embodiment, in the case where the semiconductor light emitting element 1 is viewed from the side where the p-electrode 350 and the n-electrode 400 are formed, a direction along the long sides is regarded as a first direction x and a direction along the short sides is regarded as a second direction y. Moreover, a direction that is perpendicular to the first direction x and the second direction y, and proceeds from the substrate 100 side toward the laminated semiconductor layer 200 side within the semiconductor light emitting element 1 is regarded as a third direction z.

Further, as shown in FIG. 1, the substrate 100 of the exemplary embodiment has a shape that is substantially a rectangular parallelepiped. Then, as shown in FIG. 2, the substrate 100 has substantially a rectangle shape including long sides along the first direction x and short sides along the second direction y in a case of being viewed from a side where the laminated semiconductor layer 200 is laminated. Consequently, the substrate 100 includes four substrate side surfaces, substrate top surface 113 on which the laminated semiconductor layer 200 is laminated, and a substrate bottom surface 114 facing the substrate top surface 113 via the four substrate side surfaces (refer to FIG. 3, which will be described later). Then, each of the substrate top surface 113 and the substrate bottom surface 114 has a rectangular shape including two long sides along the first direction x and two short sides along the second direction y.

Moreover, in the exemplary embodiment, of the four substrate side surfaces, each of two substrate side surfaces on the two long sides along the first direction x is referred to as a first substrate side surface 111, and each of two substrate side surfaces on the two short sides along the second direction y is referred to as a second substrate side surface 112.

In this example, as the substrate 100, a sapphire single crystal in which a C-plane is assumed to be the substrate top surface 113 is used. It should be noted that, as a plane direction of the substrate top surface 113, it is desirable to use the C-plane of a sapphire single crystal that is likely to obtain the laminated semiconductor layer 200 with good quality. Then, as the substrate top surface 113, it is further desirable to use a plane that is provided with a minute off angle with respect to the C-plane of the sapphire single crystal. In the case of providing the off angle, 1° or less is applied as the off angle. In the exemplary embodiment, it is simply said that the substrate top surface 113 is a C-plane, including the case where the off angle is provided. Further, the sapphire single crystal used as the substrate 110 may contain trace amounts of impurities.

Moreover, as shown in FIGS. 1 and 2, the lower semiconductor layer 210 of the exemplary embodiment has a shape of substantially a rectangular parallelepiped. Accordingly, the lower semiconductor layer 210 includes: a lower semiconductor top surface 213, as an example of a semiconductor top surface, on which the upper semiconductor layer 250 is laminated; a lower semiconductor bottom surface 214 (refer to FIGS. 4A and 4B, which will be described later), as an example of a semiconductor bottom surface, that faces the lower semiconductor top surface 213 and contacts the substrate top surface 113; and a lower semiconductor side surface, which is an example of a semiconductor side surface, provided to enclose an edge of the lower semiconductor top surface 213 (a top surface edge 230, which will be described later) and an edge of the lower semiconductor bottom surface 214 (a bottom surface edge 240, which will be described later).

In the exemplary embodiment, an area of the lower semiconductor bottom surface 214 in the lower semiconductor 210 is formed smaller than an area of the substrate top surface 113 in the substrate 100. Moreover, an area of the lower semiconductor top surface 213 in the lower semiconductor 210 is formed smaller than the area of the substrate top surface 113. Accordingly, an edge of the substrate top surface 113 of the substrate 100 is exposed to the outside, and as shown in FIG. 2, in a case where the semiconductor light emitting element 1 is viewed from the side on which the p-electrode 350 and the n-electrode 400 are formed, the edge of the substrate top surface 113 exposed to the outside can be observed.

Further, in this example, the area of the lower semiconductor bottom surface 214 is formed smaller than the area of the lower semiconductor top surface 213.

In addition, as shown in FIGS. 1 and 2, on the lower semiconductor top surface 213 in the exemplary embodiment, the semiconductor exposure surface 213a is formed, which is exposed by cutting out a part of the upper semiconductor layer 250. The n-electrode 400 is, as described above, provided on the semiconductor exposure surface 213a.

As shown in FIG. 2, the lower semiconductor top surface 213 of the exemplary embodiment has a shape that is analogous to a rectangle with arc-shaped four corners (a so-called rectangle with rounded corners). In other words, the top surface edge 230 of the lower semiconductor top surface 213 includes: a first linear portion 231 that is linear along the first direction x; a second linear portion 232 that is linear along the second direction y; and a connecting portion 233 having an arc shape to connect the first linear portion 231 and the second linear portion 232. In the exemplary embodiment, two first linear portions 231, two second linear portions 232 and four connecting portions 233 are provided.

Here, the top surface edge 230 is an example of a second edge, and in the exemplary embodiment, a linear portion is configured with the first linear portion 231 and the second linear portion 232.

Moreover, as shown in FIG. 1, the lower semiconductor side surface of the lower semiconductor layer 210 includes: two first lower semiconductor side surfaces 211 that extend from the first linear portions 231 of the lower semiconductor top surface 213 toward the substrate top surface 113; and two second lower semiconductor side surfaces 212 that extend from the second linear portions 232 of the lower semiconductor top surface 213 toward the substrate top surface 113. Further, the lower semiconductor side surface of the lower semiconductor layer 210 includes four connecting side surfaces 235 that extend from the connecting portions 233 of the lower semiconductor top surface 213 toward the substrate top surface 113.

Further, as shown in FIG. 2, the bottom surface edge 240 as an example of a first edge in the lower semiconductor bottom surface 214 in the exemplary embodiment has a rectangular shape. Specifically, the bottom surface edge 240 of the lower semiconductor bottom surface 214 includes: first linear portions 241 that correspond to a boundaries between the first lower semiconductor side surfaces 211 and the lower semiconductor bottom surface 214; and second linear portions 242 that correspond to a boundaries between the second lower semiconductor side surfaces 212 and the lower semiconductor bottom surface 214. The first linear portion 241 and the second linear portion 242 extend substantially perpendicular to each other, and cross each other.

It should be noted that a detailed structure of the lower semiconductor layer 210 will be described later.

Further, as shown in FIGS. 1 and 2, the upper semiconductor layer 250 in the exemplary embodiment has a shape of substantially a rectangular parallelepiped. Consequently, the upper semiconductor layer 250 includes: four upper semiconductor side surfaces; an upper semiconductor top surface 253 on which the transparent conductive layer 300 is laminated; and an upper semiconductor bottom surface (not shown) that faces the upper semiconductor top surface 253 via the four upper semiconductor side surfaces and contacts the lower semiconductor top surface 213 of the lower semiconductor layer 210. In the exemplary embodiment, of the four upper semiconductor side surfaces in the upper semiconductor layer 250, each of the two upper semiconductor side surfaces extending along the first direction x is referred to as a first upper semiconductor side surface 251, and each of the two upper semiconductor side surfaces extending along the second direction y is referred to as a second upper semiconductor side surface 252. It should be noted that, of the two second upper semiconductor side surfaces 252, one second upper semiconductor side surface 252 includes a portion that is curved along the semiconductor exposure surface 213a of the lower semiconductor top surface 213.

In the exemplary embodiment, each of the two first upper semiconductor side surfaces 251 and each of the two second upper semiconductor side surfaces 252 are provided substantially perpendicular to the lower semiconductor top surface 213 in the lower semiconductor layer 210.

Here, in the exemplary embodiment, an area of the upper semiconductor bottom surface in the upper semiconductor layer 250 is formed smaller than an area of the lower semiconductor top surface 213 in the lower semiconductor layer 210. Accordingly, a partial region in the lower semiconductor top surface 213 of the lower semiconductor layer 210 is exposed to the outside.

Still further, as shown in FIGS. 1 and 2, the transparent conductive layer 300 of the exemplary embodiment is formed to cover substantially an entire surface of the upper semiconductor top surface 253 in the upper semiconductor layer 250.

It should be noted that the transparent conductive layer 300 is not limited to the shape like this; but, for example, the transparent conductive layer 300 is formed may be formed in a lattice pattern or a tree pattern with some spacing.

Subsequently, description will be given of a lamination structure of the substrate 100, the laminated semiconductor layer 200 and the transparent conductive layer 300 in the semiconductor light emitting element 1 of the exemplary embodiment.

Figure 3:
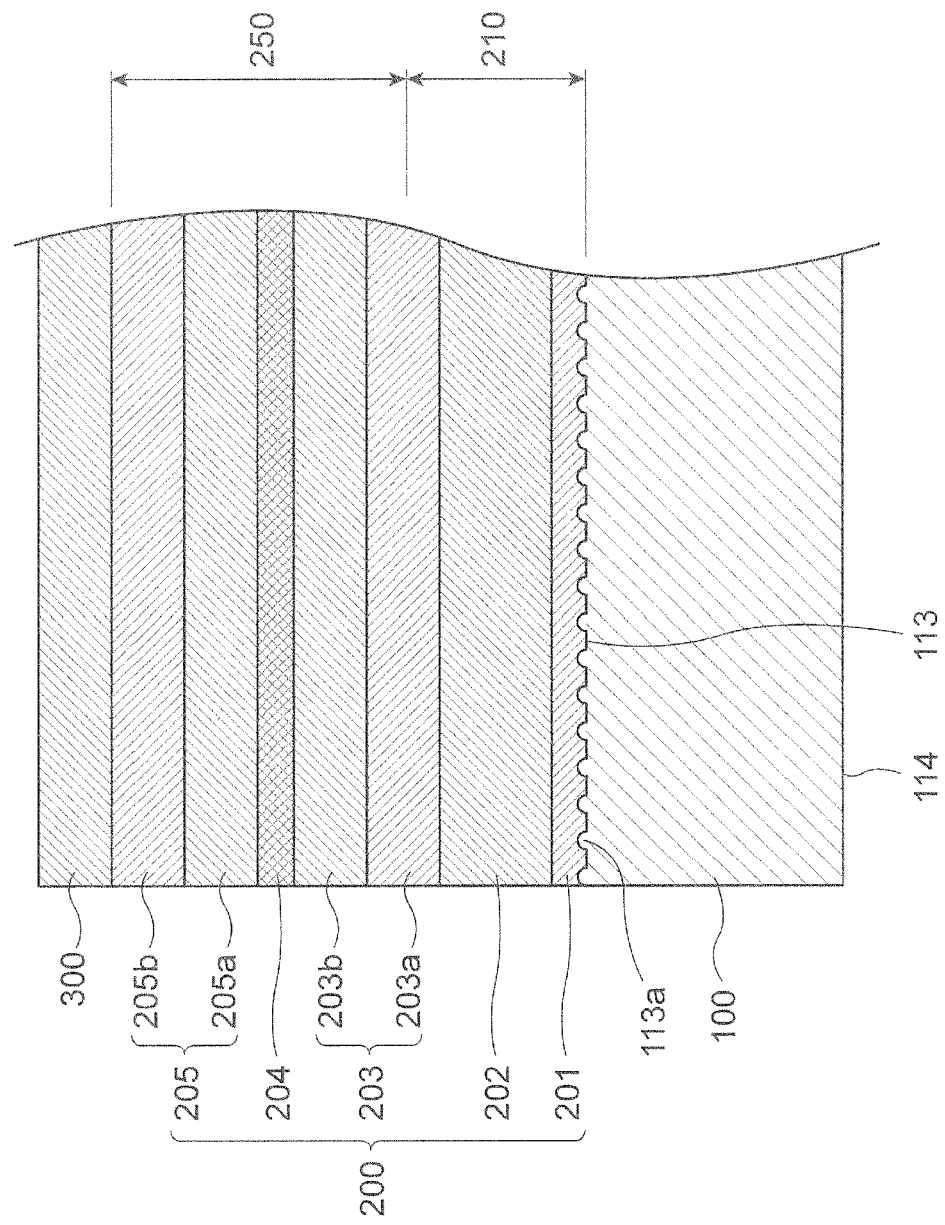
FIG. 3 is an example of a vertical cross-sectional view of a substrate, a laminated semiconductor layer and a transparent conductive layer, to which the first exemplary embodiment is applied.

FIG. 3 is an example of a vertical cross-sectional view of the substrate 100, the laminated semiconductor layer 200 and the transparent conductive layer 300, to which the exemplary embodiment is applied. It should be noted that, in the exemplary embodiment, a cross section of the substrate 200 along the direction perpendicular to the substrate top surface 113 is referred to as the vertical cross section in some cases.

As shown in FIG. 3, in the substrate 100 of the exemplary embodiment, plural convex portions 113a that project toward the laminated semiconductor layer 200 are formed on the flat substrate top surface 113. It is preferable that the width of each of the convex portions 113a is 0.05 μm to 5 μm, and the height of each of the convex portions 113a is 0.05 μm to 5 μm.

It should be noted that, on the substrate top surface 113 of the substrate 110, the convex portions 113a are not necessarily provided; however, from a standpoint of improving crystallinity of the laminated semiconductor layer 200 to be laminated on the substrate 100 and light emitting efficiency in the semiconductor light emitting element 1, it is preferable to provide the plural convex portions 113a on the substrate top surface 113.

Moreover, as shown in FIG. 3, the laminated semiconductor layer 200 of the exemplary embodiment is laminated on both of the substrate top surface 113 of the substrate 100 and the convex portions 113a formed on the substrate top surface 113.

The laminated semiconductor layer 200 of the exemplary embodiment includes: an intermediate layer 201 laminated on the substrate 100; a base layer 202 laminated on the intermediate layer 201; an n-type semiconductor layer 203 laminated on the base layer 202; a light emitting layer 204 laminated on the n-type semiconductor layer 203; and a p-type semiconductor layer 205 laminated on the light emitting layer 204.

The n-type semiconductor layer 203 is configured with an n-contact layer 203a laminated on the base layer 202 and an n-cladding layer 203b laminated on the n-contact layer 203a. It should be noted that the n-contact layer 203a is capable of also serving as the n-cladding layer 203b.

The p-type semiconductor layer 205 is configured with a p-cladding layer 205a laminated on the light emitting layer 204 and a p-contact layer 205b laminated on the p-cladding layer 205a. It should be noted that the p-contact layer 205b is capable of also serving as the p-cladding layer 205a.

It should be noted that, in the exemplary embodiment, the lower semiconductor layer 210 is configured with the intermediate layer 201, the base layer 202 and part of the n-contact layer 203a located on the base layer 202 side. Further, the upper semiconductor layer 250 is configured with part of the n-contact layer 203a located on the n-cladding layer 203b side, the n-cladding layer 203b, the light emitting layer 204, the p-cladding layer 205a and the p-contact layer 205b.

Subsequently, description will be given of each layer constituting the laminated semiconductor layer 200.

It should be noted that, in the following description, AlGaN and GaInN are described with the compositional ratio of each element being omitted in some cases.

<Intermediate Layer>

The intermediate layer 201 is provided to mediate a difference in lattice constant between the substrate 100 and the base layer 202. In particular, in the case where the substrate 100 is configured with a sapphire single crystal in which the C-plane is a principal plane, the intermediate layer 201 has a function of facilitating the formation of a single crystal layer which is c-axis oriented on the C-plane ((0001) plane) of the substrate 100. Consequently, by forming the intermediate layer 201, it is possible to improve crystallinity of the base layer 202 to be laminated thereon.

The intermediate layer 201 of the exemplary embodiment is formed of AlN. It should be noted that, as the intermediate layer 201, other than AlN, those composed of polycrystal $Al_xGa_{1-x}N$ ($0 \leq x \leq 1$) or single crystal $Al_xGa_{1-x}N$ ($0 \leq x \leq 1$) may be used.

The thickness of the intermediate layer 201 is preferably in the range of 0.01 µm to 0.5 µm. If the thickness of the intermediate layer 201 is less than 0.01 µm, there are some cases where an effect of the intermediate layer 201 to mediate the difference in lattice constant between the substrate 100 and the base layer 202 cannot be sufficiently obtained. Moreover, if the thickness of the intermediate layer 201 is more than 0.5 µm, there is a possibility that the time of forming process of the intermediate layer 201 becomes longer though there is no change to the function of the intermediate layer 201, and accordingly the productivity is decreased.

<Base Layer>

As the base layer 202, $Al_xGa_yIn_zN$ ($0 \leq x \leq 1$, $0 \leq y \leq 1$, $0 \leq z \leq 1$, $x+y+z=1$) can be used.

The thickness of the base layer 202 is preferably 0.1 µm or more, more preferably 0.5 µm or more, and most preferably 1 µm or more. The base layer 202 having good crystallinity is likely to be obtained by setting the thickness of the base layer 202 to be 1 µm or more.

Moreover, to improve the crystallinity of the base layer 202, it is desirable that the base layer 202 is not doped with impurities. However, in the case where conductivity of p-type or n-type is needed, acceptor impurities or donor impurities can be added.

Here, as suitable examples of the intermediate layer 201 and the base layer 202, a material containing AlGaN can be used as the intermediate layer 201 and a material containing GaN and InGaN can be used as the base layer 202. In addition, a dopant may be added to the intermediate layer 201 or the base layer 202. In this case, it is desirable to change the kinds or a doping amount of the dopant to be added between the intermediate layer 201 and the base layer 202.

<N-Contact Layer>

The n-contact layer 203a is a layer for providing the n-electrode 400. The n-contact layer 203a is preferably configured with the $Al_xGa_{1-x}N$ layer ($0 \leq x < 1$, more preferably $0 \leq x \leq 0.5$, and still more preferably $0 \leq x \leq 0.1$).

Further, the n-contact layer 203a is preferably doped with n-type impurities. It is preferable to contain the n-type impurities having a concentration of $1 \times 10^{17}/cm^3$ to $1 \times 10^{20}/cm^3$, and a concentration of $1 \times 10^{18}/cm^3$ to $1 \times 10^{19}/cm^3$ is more preferable on the point that a good ohmic contact with the n-electrode 400 can be maintained. As the n-type impurities, Si, Ge, Sn and so on are provided, and Si and Ge are preferably provided.

The thickness of the n-contact layer 203a is preferably set to 0.5 µm to 5 µm, and more preferably set in the range of 1 µm to 3 µm. If the thickness of the n-contact layer 203a is in the above-described ranges, crystallinity of the light emitting layer 204 or the like is suitably maintained. Moreover, if the thickness of the n-contact layer 203a is in the above-described ranges, electrical resistance is reduced, to thereby produce an effect of reducing an operation voltage (VF). It should be noted that the case where the thickness of the n-contact layer 203a is excessively thick will lead to decrease of productivity.

<N-Cladding Layer>

The n-cladding layer 203b performs injection of the carriers into the light emitting layer 204 and confinement of the carriers.

The n-cladding layer 203b can be formed of AlGaN, GaN, GaInN and so on. The hetero junction of these structures or the superlattice structure, in which the layer is laminated plural times, may also be used. In the case where the n-cladding layer 203b is formed of GaInN, the band gap thereof is preferably larger than that of GaInN of the light emitting layer 204.

The n-type impurity concentration of the n-cladding layer 203b is preferably in the range of $1 \times 10^{17}/cm^3$ to $1 \times 10^{20}/cm^3$, and more preferably in the range of $1 \times 10^{18}/cm^3$ to $1 \times 10^{19}/cm^3$. It is preferable to provide the impurity concentration in these ranges in terms of maintaining excellent crystallinity and reducing operation voltage of the element.

The thickness of the n-cladding layer 203b is preferably in the range of 5 nm to 500 nm, and more preferably in the range of 50 nm to 200 nm.

It should be noted that, in the case where the n-cladding layer 203b is a layer containing the superlattice structure, the layer may contain a structure in which an n-side first layer composed of the group III nitride semiconductor with a thickness of 10 nm or less and an n-side second layer composed of the group III nitride semiconductor having a composition different from that of the n-side first layer and having a thickness of 10 nm or less are laminated.

Moreover, the n-cladding layer 203b may contain a structure in which the n-side first layers and the n-side second layers are alternately and repeatedly laminated, and in this case, the structure is preferably an alternating structure of GaInN and GaN or an alternating structure of GaInN having different compositions.

<Light Emitting Layer>

As the light emitting layer 204 to be laminated on the n-cladding layer 203b, a single quantum well structure or a multiple quantum well structure can be employed.

As a well layer having a quantum well structure, the group III nitride semiconductor layer composed of $Ga_{1-y}In_yN$ (0<y<0.4) that has been adjusted to be able to obtain desirable light emission wavelength is usually used. Moreover, in the case of employing the light emitting layer 204 having the multiple quantum well structure, the above-described $Ga_{1-y}In_yN$ is employed as the well layer, and $Al_zGa_{1-z}N$ (0≤z<0.3) having a band gap energy larger than that of the well layer is employed as a barrier layer. The well layer and the barrier layer may be doped or not doped with impurities depending upon a design thereof.

<P-Cladding Layer>

The p-cladding layer 205a performs confinement of carriers within the light emitting layer 204 and injection of carriers.

As the p-cladding layer 205a, there is no particular limitation as long as the band gap energy of the composition thereof is larger than that of the light emitting layer 204 and carriers can be confined within the light emitting layer 204, but, for example, $Al_xGa_{1-x}N$ (0<x≤0.4) is desirably used. It is preferable that the p-cladding layer 205a is composed of such AlGaN in terms of confinement of carriers within the light emitting layer 204.

The p-type impurity concentration of the p-cladding layer 205a is preferably $1 \times 10^{18}/cm^3$ to $1 \times 10^{21}/cm^3$, and more preferably $1 \times 10^{19}/cm^3$ to $1 \times 10^{20}/cm^3$. If the p-type impurity concentration is in the above ranges, good p-type crystals can be obtained without deteriorating crystallinity.

Further, similar to the above-described n-cladding layer 203b, the p-cladding layer 205a may have a superlattice structure. In this case, it is preferable to have an alternating structure of AlGaN and another AlGaN having different compositional ratio or an alternating structure of AlGaN and GaN having different composition.

The thickness of the p-cladding layer 205a is not particularly limited, but preferably 1 nm to 400 nm, and more preferably 5 nm to 100 nm.

<P-Contact Layer>

The p-contact layer 205b is a layer for providing the p-electrode 350 via the transparent conductive layer 300. The p-contact layer 205b is preferably composed of $Al_xGa_{1-x}N$ (0≤x≤0.4). It is preferable that Al composition is in the above-described range in terms of allowing to maintain good crystallinity and good ohmic contact with the p-electrode 350.

The p-type impurity concentration of the p-contact layer 205b is preferably $1 \times 10^{18}/cm^3$ to $1 \times 10^{21}/cm^3$, and more preferably $5 \times 10^{19}/cm^3$ to $5 \times 10^{20}/cm^3$. It is preferable that the p-type impurity concentration is in the above ranges in a point that it becomes possible to maintain good ohmic contact and good crystallinity. As the p-type impurities, there is no particular limitation; however, for example, Mg can be provided.

The thickness of the p-contact layer 205b is not particularly limited, but is preferably 10 nm to 500 nm, and more preferably 50 nm to 200 nm. It is preferable to provide the thickness of the p-contact layer in these ranges in terms of the light emission output and the operation voltage.

<Transparent Conductive Layer>

Further, as described above, the transparent conductive layer 300 is provided on the laminated semiconductor layer 200 (the upper semiconductor top surface 253) of the exemplary embodiment.

It is preferable that the transparent conductive layer 300 has a small contact resistance with the p-type semiconductor layer 205 (the p-contact layer 205b). Moreover, in the semiconductor light emitting element 1 of the exemplary embodiment, since the light outputted from the light emitting layer 204 is extracted to the side on which the p-electrode 350 is formed, it is preferable that the transparent conductive layer 300 has excellent transparency to the light outputted from the light emitting layer 204. Still further, for uniformly passing a current over the entire surface of the p-type semiconductor layer 205, it is preferable that the transparent conductive layer 300 has excellent conductivity.

From above, as the material of the transparent conductive layer 300, for example, it is preferable to use a conductive material having optical transparency composed of conductive oxide at least containing In. Specific examples of conductive oxides containing In include: ITO (indium tin oxide ($In_2O_3$—$SnO_2$)); IZO (indium zinc oxide ($In_2O_3$—ZnO)); IGO (indium gallium oxide ($In_2O_3$—$Ga_2O_3$)); and ICO (indium cerium oxide ($In_2O_3$—$CeO_2$)). It should be noted that impurities such as fluorine may be added to these materials.

The thickness of the transparent conductive layer 300 is not particularly limited, but preferably in the range of, for example, 10 nm to 500 nm.

(Description of Detailed Structure of Lower Semiconductor Layer)

Subsequently, a detailed structure of the lower semiconductor layer 210 in the semiconductor light emitting element 1 of the exemplary embodiment will be described.

Figure 4A:
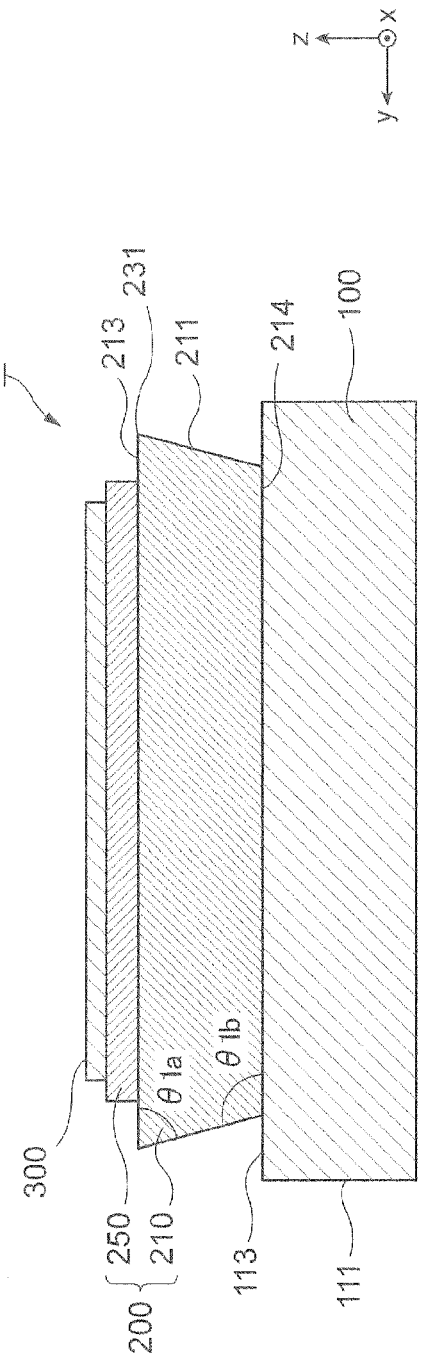
FIGS. 4A and 4B are examples of a vertical cross-sectional view of the semiconductor light emitting element to which the first exemplary embodiment is applied.
Figure 4B:
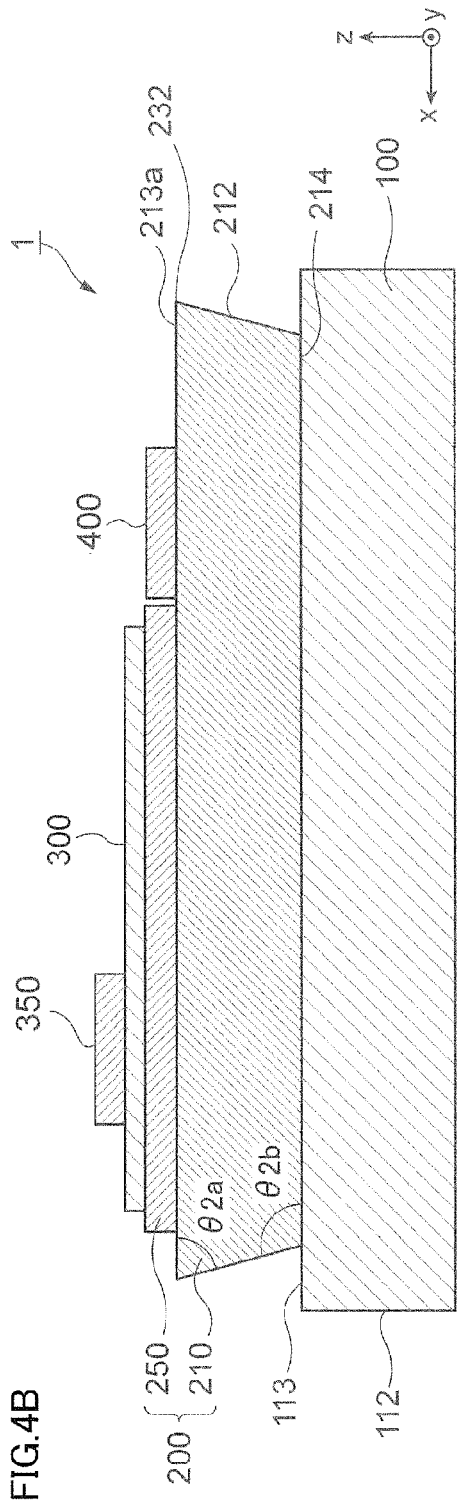
Figure 5:
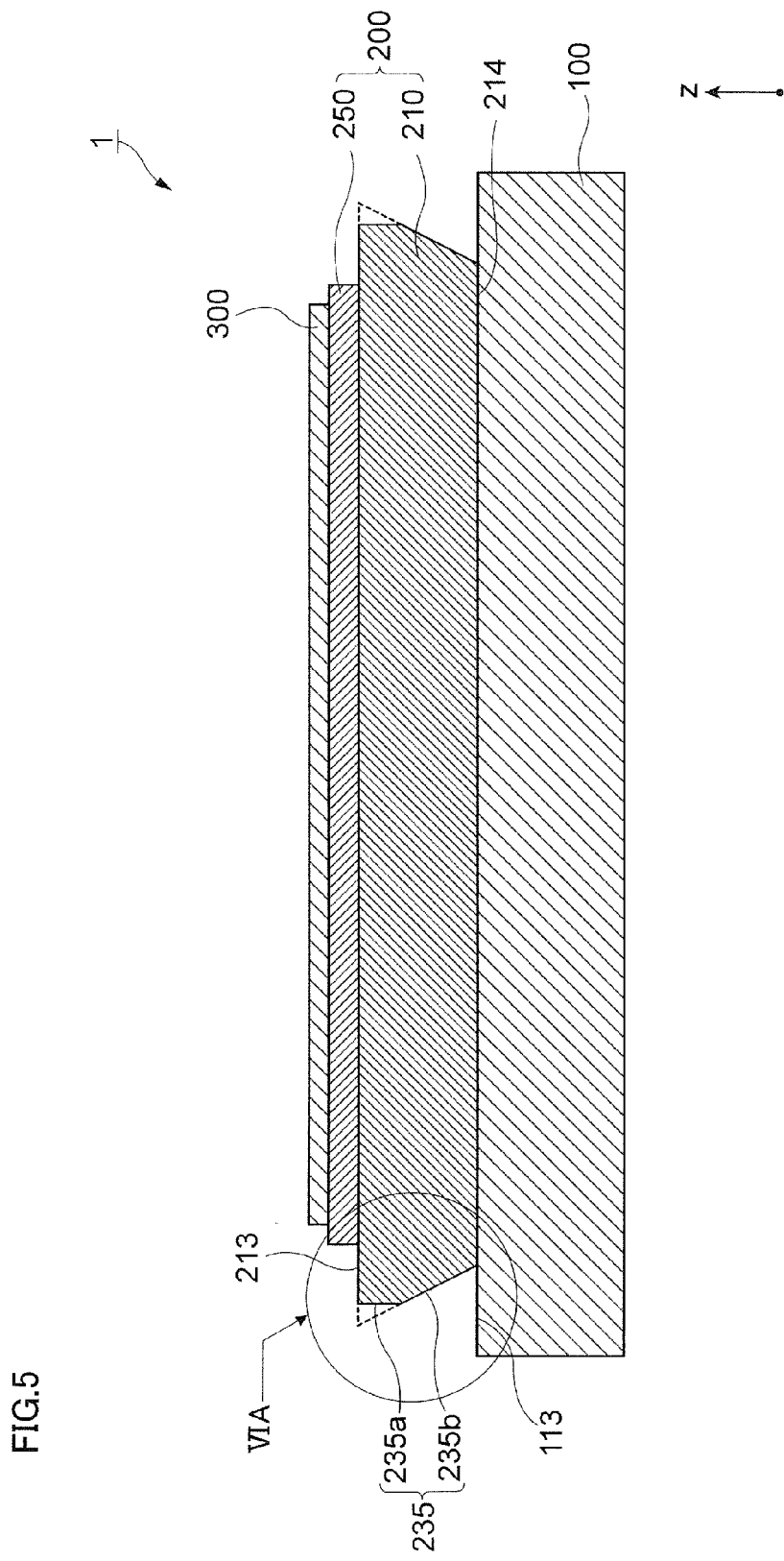
FIG. 5 is also an example of the vertical cross-sectional view of the semiconductor light emitting element to which the first exemplary embodiment is applied.

FIGS. 4A and 4B and FIG. 5 are examples of a vertical cross-sectional view of the semiconductor light emitting element 1 to which the exemplary embodiment is applied. FIG. 4A is a IVA-IVA cross-sectional view in FIG. 2, and FIG. 4B is a IVB-IVB cross-sectional view in FIG. 2. FIG. 5 is a V-V cross-sectional view in FIG. 2.

As shown in FIG. 4A, in the lower semiconductor layer 210, the angle formed by the first lower semiconductor side surface 211 and the lower semiconductor top surface 213 is assumed to be θ1a. In the exemplary embodiment, θ1a is an acute angle (θ1a<90°).

Moreover, in the lower semiconductor layer 210, the angle formed by the first lower semiconductor side surface 211 and the lower semiconductor bottom surface 214 is assumed to be θ1b. In the exemplary embodiment, θ1b is an obtuse angle (θ1b>90°).

In the exemplary embodiment, the two first lower semiconductor side surfaces 211 have a shape inclined toward the outside of the lower semiconductor layer 210 with respect to a plane that is along the first direction x and is perpendicular to the substrate top surface 113.

As shown in FIG. 4A, the thickness of the lower semiconductor layer 210 is reduced along with a move toward a boundary portion between the first lower semiconductor side surface 211 and the lower semiconductor top surface 213 (namely, the first linear portion 231) along the second direction y.

Similarly, as shown in FIG. 4B, in the lower semiconductor layer 210, the angle formed by the second lower semiconductor side surface 212 and the lower semiconductor top surface 213 is assumed to be θ2a. In the exemplary embodiment, θ2a is an acute angle (θ2a<90°).

Moreover, in the lower semiconductor layer 210, the angle formed by the second lower semiconductor side surface 212 and the lower semiconductor bottom surface 214 is assumed to be θ2b. In the exemplary embodiment, θ2b is an obtuse angle (θ2b>90°).

In the exemplary embodiment, the two second lower semiconductor side surfaces 212 have a shape inclined toward the outside of the lower semiconductor layer 210 with respect to a plane that is along the second direction y and is perpendicular to the substrate top surface 113.

As shown in FIG. 4B, the thickness of the lower semiconductor layer 210 is reduced along with a move toward a boundary portion between the second lower semiconductor side surface 212 and the lower semiconductor top surface 213 (namely, the second linear portion 232) along the first direction x.

Figure 6A:
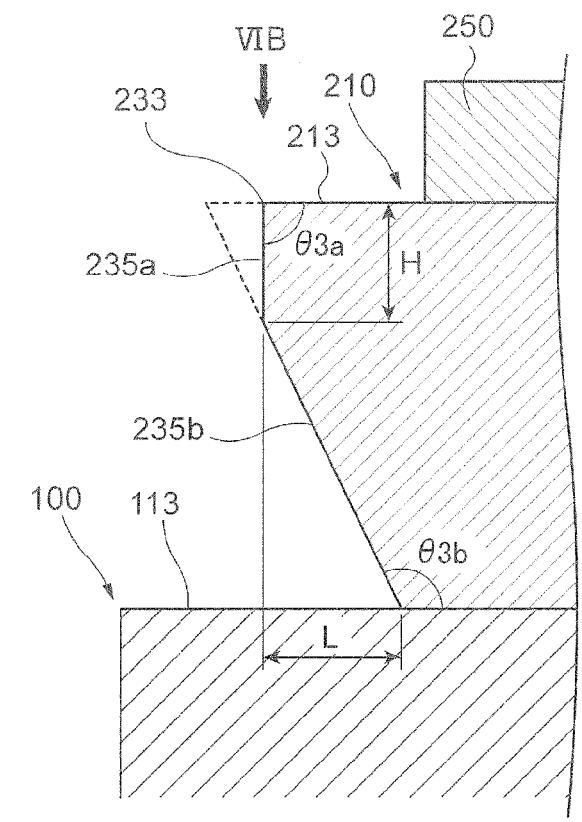
FIGS. 6A and 6B are diagrams for illustrating a structure in the vicinity of a connecting portion and a connecting side surface of a lower semiconductor layer to which the first exemplary embodiment is applied.
Figure 6B:
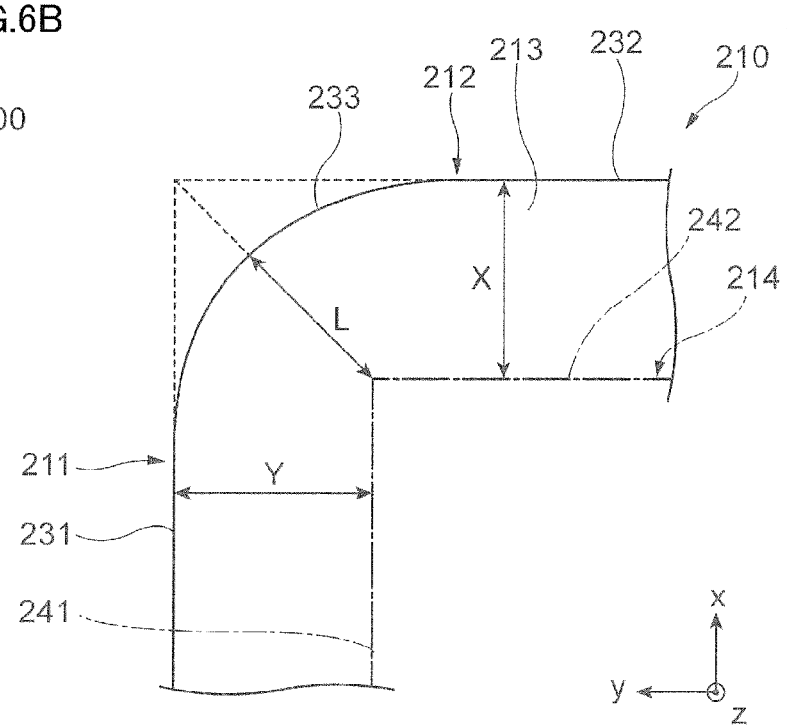

Subsequently, description will be given of a structure of the connecting portion 233 and the connecting side surface 235 in the lower semiconductor layer 210. FIG. 5 is a V-V cross sectional view in FIG. 2, which is a vertical cross-sectional view of the semiconductor light emitting element 1 that is cut to pass through the connecting portion 233 and the connecting side surface 235. FIGS. 6A and 6B are diagrams for illustrating the structure in the vicinity of the connecting portion 233 and the connecting side surface 235 of the lower semiconductor layer 210 to which the exemplary embodiment is applied, and FIG. 6A is an enlarged view of a VIA portion in FIG. 5, and FIG. 6B is a diagram showing the lower semiconductor layer 210 in FIG. 6A as viewed from the VIB direction.

Here, in FIG. 6B, the lower semiconductor bottom surface 214 is illustrated by projection onto the lower semiconductor top surface 213, and the lower semiconductor bottom surface 214 projected onto the lower semiconductor top surface 213 is represented by an alternate long and short dashed line. It should be noted that, in FIG. 6B, illustration of the substrate 100 and the upper semiconductor layer 250 is omitted.

The connecting side surface 235 of the lower semiconductor layer 210 includes, as shown in FIG. 5 and FIG. 6A: a perpendicular portion 235a that extends from the connecting portion 233 of the lower semiconductor top surface 213 toward the substrate 100; and an inclined portion 235b that is inclined to the perpendicular portion 235a and extends from a portion below the perpendicular portion 235a toward the substrate top surface 113. It should be noted that the perpendicular portion 235a is provided along the third direction z, and an angle formed between the perpendicular portion 235a and the inclined portion 235b is an obtuse angle.

Moreover, as shown in FIG. 6A, if an angle formed between the perpendicular portion 235a of the connecting side surface 235 and the lower semiconductor top surface 213 is assumed to be θ3a, θ3a is substantially 90°.

Further, if an angle formed between the inclined portion 235b of the connecting side surface 235 and the lower semiconductor bottom surface 214 is assumed to be θ3b, θ3b is an obtuse angle (θ3b>90°). It should be noted that, in the exemplary embodiment, θ3b is larger than θ1b and θ2b (θ3b>θ1b, θ3b>θ2b).

As shown in FIG. 5, the inclined portion 235b has a shape inclined to a plane that is perpendicular to the substrate top surface 113. Moreover, the shape of the inclined portion 235b gradually changes to follow the perpendicular portion 235a along with a move from the lower semiconductor bottom surface 214 side toward the perpendicular portion 235a side.

Here, since the connecting side surface 235 includes the perpendicular portion 235a and the inclined portion 235b, the lower semiconductor layer 210 of the exemplary embodiment has a thickness along the third direction z in the vicinity of the connecting side surface 235. Specifically, as shown in FIG. 6A, the height of the perpendicular portion 235a is assumed to be H (>0) in the connecting side surface 235 in the exemplary embodiment, and thereby the thickness of the connecting portion 233 in the lower semiconductor layer 210 becomes H.

Moreover, as described above, the connecting portion 233 of the lower semiconductor top surface 213 has a shape of an arc in the case where the lower semiconductor top surface 213 is viewed from the side on which the n-electrode 400 is formed.

Then, as shown in FIG. 6B, in the case where the lower semiconductor top surface 213 is viewed along the third direction z from the side on which the n-electrode 400 is formed, the connecting portion 233 is positioned inside of a point of intersection of an extended line of the first linear portion 231 and an extended line of the second linear portion 232. Accordingly, in the case of being viewed along the third direction z, the connecting portion 233 is positioned inside of a rectangle enclosed by the first linear portion 231, the extended line of the first linear portion 231, the second linear portion 232 and the extended line of the second linear portion 232 (also refer to FIG. 2).

Here, conventionally, in the semiconductor light emitting element 1 having a structure in which the first lower semiconductor side surface 211 and the second lower semiconductor side surface 212 of the lower semiconductor layer 210 are inclined to a direction that is perpendicular to the substrate top surface 113, there was a tendency that lower semiconductor layer 210 was easily broken on impact. In FIGS. 6A and 6B, an example of an outer edge of the lower semiconductor layer 210 in the conventional semiconductor light emitting element 1 having such an inclined structure is indicated by broken lines.

In the conventional semiconductor light emitting element 1 having the structure in which the first lower semiconductor side surface 211 and the second lower semiconductor side surface 212 are inclined to the direction that is perpendicular to the substrate top surface 113, an edge of the lower semiconductor top surface 213 in the lower semiconductor layer 210 has a shape of substantially a rectangle. In other words, as indicated by the broken lines in FIG. 6B, the lower semiconductor top surface 213 in the conventional semiconductor light emitting element 1 does not include the connecting portion 233, and the first linear portion 231 and the second linear portion 232 intersect each other. That is, in the conventional semiconductor light emitting element 1, the lower semiconductor top surface 213, the first lower semiconductor side surface 211 and the second lower semiconductor side surface 212 directly intersect one another, and at a boundary portion of the lower semiconductor top surface 213, the first lower semiconductor side surface 211 and the second lower semiconductor side surface 212, a pointed corner projected outwardly (hereinafter, referred to as a pointed end portion) is formed.

Since the side surface of the lower semiconductor layer 210 (the first lower semiconductor side surface 211 and the second lower semiconductor side surface 212) is provided to be inclined to the lower semiconductor top surface 213 and the lower semiconductor bottom surface 214, in the pointed end portion positioned at the boundary of the lower semiconductor top surface 213, the first lower semiconductor side surface 211 and the second lower semiconductor side surface 212, as indicated by the broken line in FIG. 6A, the thickness is reduced along with a move from a center portion of the lower semiconductor layer 210 toward the outside. Consequently, in the conventional semiconductor light emitting element 1, the pointed end portion of the lower semiconductor layer 210 has low strength compared to other portions.

Moreover, in the conventional semiconductor light emitting element 1, since the pointed end portion of the lower semiconductor layer 210 is projected compared to the other portions, the pointed end portion of the lower semiconductor layer 210 is apt to hit other members and the like at a working time in a case where, for example, the semiconductor light emitting element 1 is manufactured, or the semiconductor light emitting element 1 is applied to a lamp.

Here, in general, in a member having a pointed shape, when a force is applied from the outside to the pointed part, the force is hardly dispersed and concentrated to the pointed part. For example, in the conventional semiconductor light emitting element 1, in a case where the lower semiconductor layer 210 hits other members or the like and a force is added to the lower semiconductor layer 210 from the outside, the force is apt to be concentrated to the pointed end portion of the lower semiconductor layer 210.

In the conventional semiconductor light emitting element 1, since the thickness of the pointed end portion of the lower semiconductor layer 210 is small as described above, there is a possibility that the lower semiconductor layer 210 is apt to become chipped at the pointed end portion when a force is added to the lower semiconductor layer 210 from the outside.

In contrast, in the semiconductor light emitting element 1 of the exemplary embodiment, the connecting side surface 235 is formed between the first lower semiconductor side surface 211 and the second lower semiconductor side surface 212 in the lower semiconductor layer 210. Moreover, in the semiconductor light emitting element 1 of the exemplary embodiment, in the case where the lower semiconductor layer 210 is viewed from the third direction z, the connecting portion 233, which is a boundary between the connecting side surface 235 and the lower semiconductor top surface 213, is formed between the first linear portion 231 and the second linear portion 232 in the top surface edge 230 of the lower semiconductor top surface 213. Then, the connecting portion 233 is, in the case of being viewed along the third direction z, positioned inside of a rectangle enclosed by the first linear portion 231, the extended line of the first linear portion 231, the second linear portion 232 and the extended line of the second linear portion 232.

In other words, in the semiconductor light emitting element 1 of the exemplary embodiment, the lower semiconductor top surface, the first lower semiconductor side surface 211 and the second lower semiconductor side surface 212 do not directly intersect one another in the lower semiconductor layer 210; and therefore, the pointed end portion as in the conventional example is not formed.

Consequently, in the exemplary embodiment, an amount of projection of the lower semiconductor layer 210 is small compared to the conventional semiconductor light emitting element 1 having the pointed end portion. As a result, in the semiconductor light emitting element 1 of the exemplary embodiment, it is possible to suppress the collision of the lower semiconductor layer 210 with other semiconductor light emitting elements 1 or other members. Then, in the semiconductor light emitting element 1 of the exemplary embodiment, by suppressing the collision of the lower semiconductor layer 210 with other members or the like, it becomes possible to suppress occurrence of cracking or chipping in the laminated semiconductor layer 200 (the lower semiconductor layer 210) compared to a case where the present configuration is not employed.

Moreover, in the semiconductor light emitting element 1 of the exemplary embodiment, the connecting portion 233 in the lower semiconductor top surface 213 has a shape of an arc in the case of being viewed from the third direction z. In other words, the connecting portion 233 has a shape in which a force is apt to be dispersed in comparison with the case of having a pointed shape. Consequently, in the exemplary embodiment, in a case where a force is applied from the outside via the lower semiconductor top surface 213, for example, it is possible to suppress concentration of the force in the lower semiconductor layer 210 compared to a case where the present configuration is not employed. As a result, in the semiconductor light emitting element 1 of the exemplary embodiment, even in a case where the connecting portion 233 of the lower semiconductor layer 210 collides with other semiconductor light emitting elements 1 or other members, it becomes possible to suppress occurrence of cracking or chipping in the laminated semiconductor layer 200 (the lower semiconductor layer 210) compared to a case where the present configuration is not employed.

Further, as described above, in the semiconductor light emitting element 1 of the exemplary embodiment, the thickness of the connecting portion 233 in the lower semiconductor layer 210 becomes H (>0). In other words, as described above, the lower semiconductor layer 210 of the exemplary embodiment has a thickness in the connecting portion 233 whereas the first linear portion 231 and the second linear portion 232 has no thickness in the lower semiconductor layer 210.

This makes it possible to increase the strength of the lower semiconductor layer 210 compared to the case where, for example, the pointed end portion has no thickness in the lower semiconductor layer 210 as in the conventional example.

Accordingly, compared to a case where the present configuration is not employed, it becomes possible to suppress occurrence of cracking or chipping in the lower semiconductor layer 210 in the semiconductor light emitting element 1.

It should be noted that the thickness H at the boundary between the connecting side surface 235 and the lower semiconductor top surface 213 in the lower semiconductor layer 210 (the height of the perpendicular portion 235a in the connecting side surface 235) is preferably not less than ½ of the thickness of the lower semiconductor layer 210 (namely, a distance between the lower semiconductor top surface 213 and the lower semiconductor bottom surface 214 along the third direction z).

By setting the height of the perpendicular portion 235a at such a range, an area of the inclined portion 235b is increased compared to a case where, for example, the height H is more than ½ of the thickness of the lower semiconductor layer 210. Accordingly, compared to a case where the present configuration is not employed, light outputted from the light emitting layer 204 (refer to FIG. 3 or the like) in the semiconductor light emitting element 1 (refer to FIG. 1) is easily extracted to the outside of the semiconductor light emitting element 1 via the inclined portion 235b, and thereby, it becomes possible to suppress deterioration of an output of the semiconductor light emitting element 1.

Here, in the semiconductor light emitting element 1 of the exemplary embodiment, as shown in FIG. 6B, a shortest distance between the second linear portion 242 in the bottom surface edge 240 (refer to FIG. 2) of the lower semiconductor bottom surface 214 projected onto the lower semiconductor top surface 213 and the second linear portion 232 in the top surface edge 230 (refer to FIG. 2) is assumed to be X. Similarly, a shortest distance between the first linear portion 241 in the bottom surface edge 240 projected onto the lower semiconductor top surface 213 and the first linear portion 231 in the top surface edge 230 is assumed to be Y.

Moreover, as shown in FIG. 6B, a distance from a point of intersection of the first linear portion 241 and the second linear portion 242 in the bottom surface edge 240 to a center portion of the connecting portion 233 in the top surface edge 230 is assumed to be L. It should be noted that, in this example, the center portion of the connecting portion 233 means a point of intersection of a straight line that extends from the point of intersection of the first linear portion 241 and the second linear portion 242 in the bottom surface edge 240 toward the point of intersection of the extended line of the first linear portion 231 and the extended line of the second linear portion 232 in the top surface edge 230 (namely, a straight line that connects the shortest distance between the point of intersection of the extended line of the first linear portion 231 and the extended line of the second linear portion 232 and the bottom surface edge 240) and the connecting portion 233.

In the exemplary embodiment, the distance L is preferably in the range represented by the following expression.

$$L^2 = A \times (X^2 + Y^2)  0 < A \leq 0.95 \tag{1}$$

By setting the distance L in the range represented by the expression (1), it is possible to reduce the amount of projection of the lower semiconductor layer 210 in the connecting portion 233 and the connecting side surface 235 compared to the case where the present configuration is not employed. Here, in a case where the amount of projection of the lower semiconductor layer 210 is large, if the lower semiconductor layer 210 receives a force, the force is prone to concentrate on the projected portion, and accordingly, there is a tendency that the lower semiconductor layer 210 is apt to be broken, as described above.

Consequently, by making the amount of projection of the lower semiconductor layer 210 small as in the exemplary embodiment, it becomes possible to suppress occurrence of chipping or cracking in the lower semiconductor layer 210 compared to the case where the present configuration is not employed.

It should be noted that, in the semiconductor light emitting element 1 of the exemplary embodiment, as described above, the first lower semiconductor side surface 211 and the second lower semiconductor side surface 212 of the lower semiconductor 210 are provided to be inclined to the lower semiconductor top surface 213 and the lower semiconductor bottom surface 214. Consequently, in the lower semiconductor layer 210, the thickness is reduced in the boundary portion between the first lower semiconductor side surface 211 and the lower semiconductor top surface 213 (the first linear portion 231) and the boundary portion between the second lower semiconductor side surface 212 and the lower semiconductor top surface 213 (the second linear portion 232), and the lower semiconductor layer 210 has a pointed shape on the vertical cross section (refer to FIGS. 4A and 4B).

However, the first linear portion 231 and the second linear portion 232 have a shape of substantially a straight line in the case of being viewed from the direction perpendicular to the lower semiconductor top surface 213. Accordingly, even in a case where a force is applied to the vicinity of the first linear portion 231 or the second linear portion 232 in the lower semiconductor layer 210 from the outside via the lower semiconductor top surface 213, the force is hardly concentrated on the first linear portion 231 or the second linear portion 232.

Consequently, in the case where the lower semiconductor layer 210 has a pointed shape on a vertical cross section in the first linear portion 231 and the second linear portion 232, chipping or cracking in the lower semiconductor layer 210 is rarely generated.

It should be noted that, in the exemplary embodiment, the shape of the connecting portion 233 in the case of being viewed from the third direction z was an arc shape; however, the shape of the connecting portion 233 is not limited thereto. As described above, as long as the connecting portion 233 is positioned inside the point of intersection of the extended line of the first linear portion 231 and the extended line of the second linear portion 232, the shape of the connecting portion 233 as viewed from the third direction z may be a straight line shape, a curved line shape, a polygonal line shape or the like and a combination thereof.

Moreover, it is unnecessary for the above-described first linear portion 231, second linear portion 232 or the like to strictly form a perfect straight line shape; however, it is sufficient to have a form that is substantially approximate to a straight line as a whole.

Moreover, in the exemplary embodiment, description was given of an example in which the semiconductor light emitting element 1 had a shape of substantially a rectangular parallelepiped, and a shape of the semiconductor light emitting element 1 as viewed from the side on which the p-electrode 350 and the n-electrode 400 were formed was substantially a rectangle; however, the shape of the semiconductor light emitting element 1 is not limited thereto.

For example, as long as the lower semiconductor layer 210 includes the connecting portion 233 and the connecting side surface 235 as described above, the shape of the semiconductor light emitting element 1 as viewed from the side on which the p-electrode 350 and the n-electrode 400 were formed may be a shape that is approximate to a square or a parallelogram, or may be a shape that is approximate to a polygon other than a quadrangle (a triangle or a hexagon).

(Method of Manufacturing Semiconductor Light Emitting Element)
<First Mode>

Figure 7:
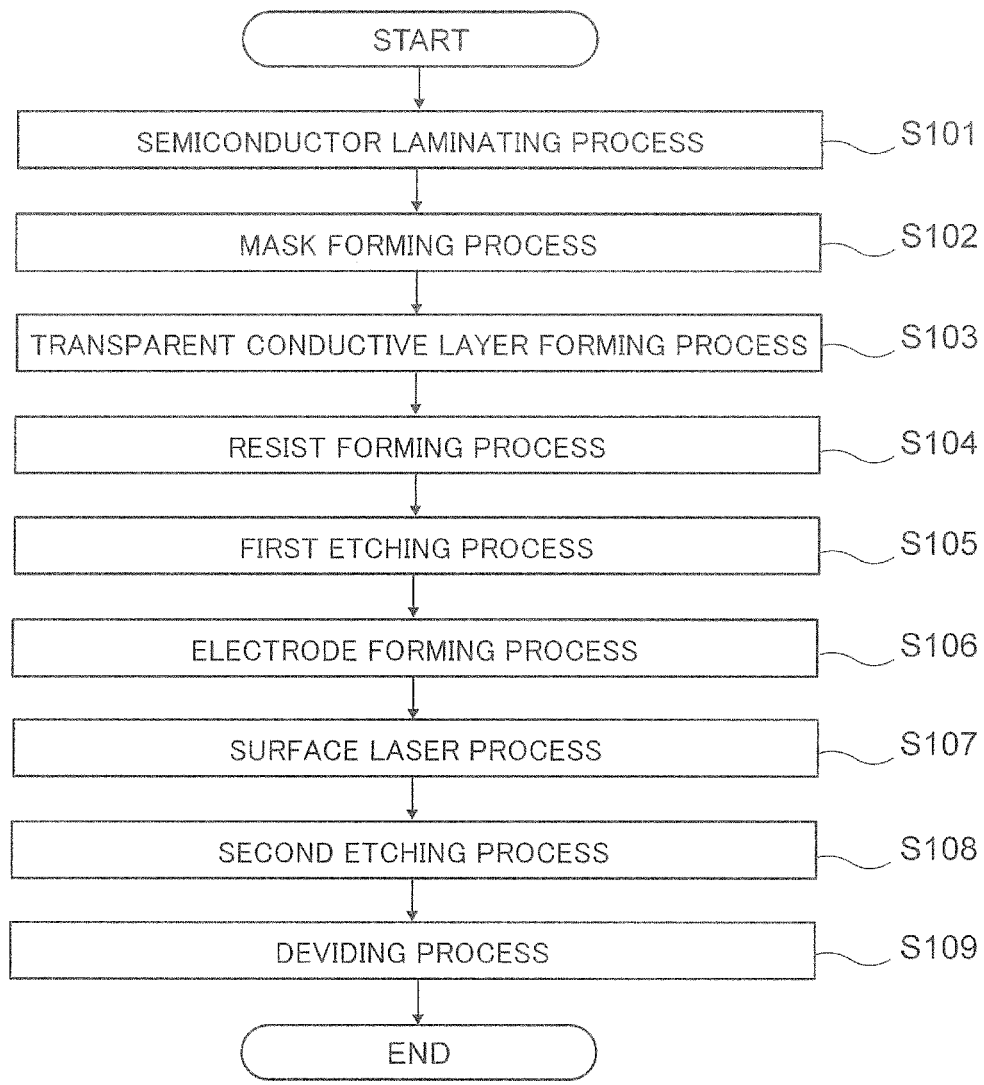
FIG. 7 is a flowchart showing an example of a method of manufacturing a semiconductor light emitting element to which a first mode of the first exemplary embodiment is applied.

Subsequently, description will be given of a first mode of a method of manufacturing the semiconductor light emitting element 1 of the exemplary embodiment. It should be noted that, in the first mode of the method of manufacturing the semiconductor light emitting element 1, plural semiconductor light emitting elements 1 are obtained by laminating the laminated semiconductor layer 200 on the wafer-shaped substrate 100, forming plural transparent conductive layers 300, plural p-electrodes 350 and plural n-electrodes 400 on the laminated semiconductor layer 200 and dividing thereof. FIG. 7 is a flowchart showing an example of the method of manufacturing the semiconductor light emitting element 1 to which the exemplary embodiment is applied.

In this example, first, a semiconductor laminating process, in which the laminated semiconductor layer 200 is formed on the wafer-shaped substrate 100 to form a wafer-shaped semiconductor lamination substrate 20 (refer to FIGS. 8A to 8C, which will be described later), is carried out (step 101).

Next, a mask forming process, in which a mask 51 (refer to FIG. 8, which will be described later) composed of SiO$_2$ or the like is formed on the laminated semiconductor layer 200 of the semiconductor lamination substrate 20 formed in step 101, is carried out (step 102).

Next, a transparent conductive layer forming process, in which the transparent conductive layer 300 is formed on the laminated semiconductor layer 200 of the semiconductor lamination substrate 20, on which the mask 51 has been formed in step 102, is carried out (step 103).

Subsequently, a resist forming process, in which a resist 61 (refer to FIG. 9, which will be described later) is formed on the laminated semiconductor layer 200 and the transparent conductive layer 300 of the semiconductor lamination substrate 20, on which the transparent conductive layer 300 has been formed in step 103, is carried out (step 104).

Next, a first etching process, in which plural first groove portions 71 and plural second groove portions 72 (both refer to FIG. 10, which will be described later) and the like are formed on the semiconductor lamination substrate 20, on which the resist 61 has been formed in step 104, by removing a part of the laminated semiconductor layer 200 by the etching, is carried out (step 105).

It should be noted that, in the exemplary embodiment, the mask forming process in step 102, the resist forming process in step 104 and the first etching process in step 105 correspond to a semiconductor removing process.

Next, an electrode forming process, in which the n-electrode 400 and the p-electrode 350 are formed on the laminated semiconductor layer 200, from which part of the laminated semiconductor layer 200 has been removed in step 105, and the transparent conductive layer 300 of the semiconductor lamination substrate 20, respectively, and a protecting film 500 is formed on the laminated semiconductor layer 200 and the transparent conductive layer 300, is carried out (step 106).

Subsequently, a surface laser process, in which a first irradiation line 81 and a second irradiation line 82 (both refer to FIGS. 11A to 11D, which will be described later) are formed by irradiating the semiconductor lamination substrate 20, on which the n-electrode 400, the p-electrode 350 and the protecting film 500 have been formed in step 106, from the front surface side of the semiconductor lamination substrate 20, on which the n-electrode 400 and the p-electrode 350 are formed, with laser light along the first direction x and the second direction y, is carried out (step 107).

Next, a second etching process as an example of the wet etching process is carried out on the semiconductor lamination substrate 20, on which the first irradiation line 81 and the second irradiation line 82 have been formed in step 107 (step 108).

Next, a dividing process, in which plural semiconductor light emitting elements 1 formed into individual pieces are obtained by dividing the semiconductor lamination substrate 20, which has been subjected to the wet etching in step 108, along the first irradiation line 81 and the second irradiation line 82, is carried out (step 109).

In the exemplary embodiment, the surface laser process in step 107 corresponds to a dividing groove forming process, and the second etching process in step 108 corresponds to the wet etching process.

Subsequently, the above-described processes of the respective steps will be described in order.
(Semiconductor Laminating Process)

In the semiconductor laminating process in step 101, first, for example, the wafer-shaped substrate 100 (refer to FIG. 1) composed of a sapphire single crystal, in which C-plane is a principal plane, is prepared, and a surface treatment is applied. As the surface treatment, plural concave portions 113a (refer to FIG. 3) are formed on the substrate top surface 113 (refer to FIG. 1) in the wafer-shaped substrate 100 by use of, for example, the wet etching, the dry etching, the sputtering method or the like.

Next, the intermediate layer 201 (refer to FIG. 3) composed of AlN is formed on the wafer-shaped substrate 100, which has been subjected to the surface treatment, by the sputtering method or the like. It should be noted that the intermediate layer 201 is formed not only by the sputtering method, but also by an MOCVD method.

Subsequently, on the wafer-shaped substrate 100 on which the intermediate layer 201 has been formed, the base layer 202, the n-type semiconductor layer 203 (the n-contact layer 203a and the n-cladding layer 203b), the light emitting layer 204 and the p-type semiconductor layer 205 (the p-cladding layer 205a and the p-contact layer 205b), which are composed of the group III nitride, are sequentially laminated to form the semiconductor lamination substrate 20 (refer to FIGS. 8A to 8C, which will be described later), in which the laminated semiconductor layer 200 is laminated on the wafer-shaped substrate 100 (refer to FIG. 3).

As a method for laminating these layers, the MOCVD method (metal-organic chemical vapor deposition method), an HVPE method (hydride vapor phase epitaxy method), an MBE method (molecular beam epitaxy method), the sputtering method or the like can be used. As an especially preferred lamination method, the MOCVD method is provided in terms of layer thickness controlling properties and volume productivity.

Here, in the exemplary embodiment, the plural concave portions 113a are formed on the substrate top surface 113 of the substrate 100. When the intermediate layer 201 composed of AlN, the base layer 202 and the n-contact layer 203a composed of the group III nitride semiconductor layer, such as GaN, and the like are laminated on such a substrate top surface 113 of the substrate 100, first, plural island-shaped crystals extending toward the direction perpendicular to the substrate top surface 113 are formed. Then, by continuing further lamination, the group III nitride grows toward the direction perpendicular to the substrate top surface 113, and the plural island-shaped crystals are tied to one another, and thereby a flat crystal growth surface is obtained in due time.

Accordingly, each of the intermediate layer 201, the base layer 202, the n-contact layer 203a and the like is formed from the lower semiconductor bottom surface 214 side toward the lower semiconductor top surface 213 side so that cystallinity of the group III nitride is gradually improved.

Consequently, the lower semiconductor layer 210 as a whole is also formed from the lower semiconductor bottom surface 214 side toward the lower semiconductor top surface 213 side so that cystallinity of the group III nitride is gradually improved.

Further, in the exemplary embodiment, in the case where the laminated semiconductor layer 200 is laminated on the substrate 100 composed of sapphire by the MOCVD method, the crystal of the group III nitride constituting the laminated semiconductor 200 grows so that a (000-1) plane, which is an N-polarity plane, faces the substrate top surface 113 side of the substrate 100, and a (0001) plane, which is a polarity plane of the group III element (for example, a Ga-polarity plane) faces the upper semiconductor top surface 253 side of the upper semiconductor layer 250.
(Mask Forming Process)

Subsequently, the mask forming process in step 102 will be described.

Figure 8B:
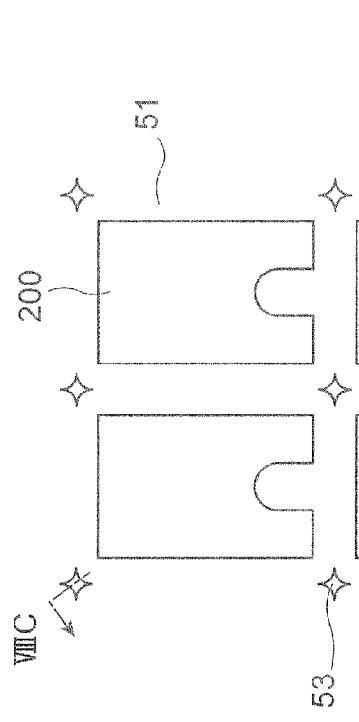
FIGS. 8A to 8C are diagrams showing a semiconductor lamination substrate, in which a mask has been formed, obtained by executing a mask forming process.
Figure 8C:
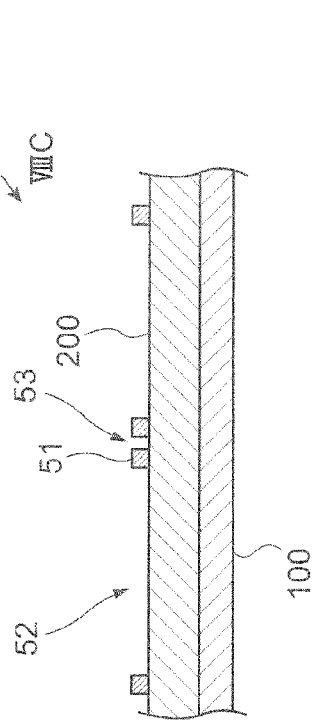
Figure 8A:
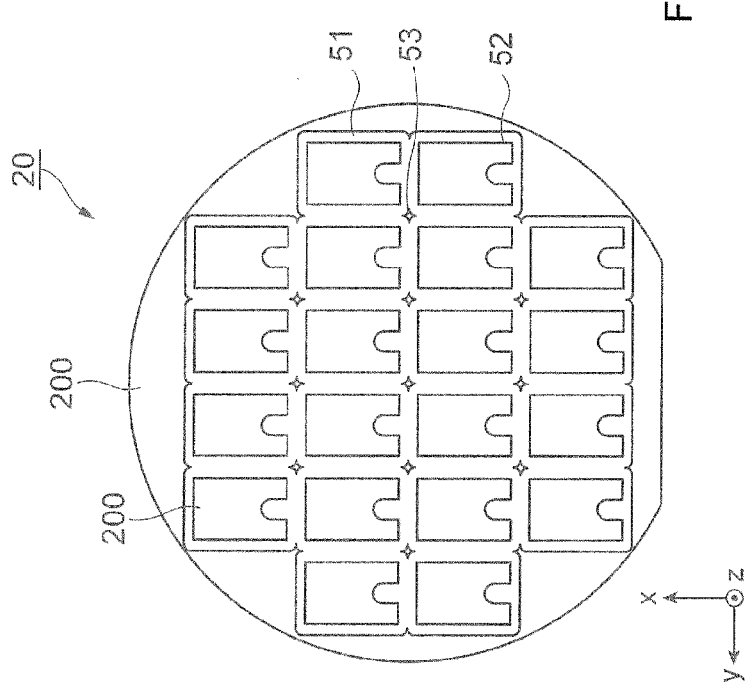

FIGS. 8A to 8C are diagrams showing the semiconductor lamination substrate 20, in which the mask 51 has been formed, obtained by carrying out the mask forming process. FIG. 8A is a top view in which the semiconductor lamination substrate 20 after the mask 51 is formed is viewed from the side where the mask 51 is formed, FIG. 8B is an enlarged top view that enlarges part of FIG. 8A, and FIG. 8C is a VIIIC-VIIIC cross-sectional view of FIG. 8B.

In the mask forming process in step 102, the mask 51, as an example of a covering portion, is formed on the laminated semiconductor layer 200 of the semiconductor lamination substrate 20 obtained in the semiconductor laminating process in step 101.

The mask 51 is laminated on a partial region on the laminated semiconductor layer 200, which corresponds to expected formation positions of the plural semiconductor light emitting elements 1 (refer to FIG. 1) formed from the semiconductor lamination substrate 20 (hereinafter, referred to as expected element-formation positions).

In the exemplary embodiment, the expected formation positions of the plural semiconductor light emitting elements 1 (refer to FIG. 1) formed from the semiconductor lamination substrate 20 (hereinafter, referred to as the expected element-formation positions) are set in a matrix on the semiconductor lamination substrate 20.

The mask 51 is provided along the first direction x and the second direction y so as to enclose the expected element-formation position. In the mask 51, plural first holes 52, which are provided corresponding to the respective expected element-formation positions, are formed. Moreover, in the mask 51, second holes 53 are formed at four corners of the respective expected element-formation positions that are also centers of adjacent four expected element-formation positions.

As shown in FIG. 8A, the laminated semiconductor layer 200 is exposed from each of the first holes 52 and second holes 53. It should be noted that, of the expected element-formation positions, on the regions corresponding to the semiconductor exposure surfaces 213a (refer to FIG. 1), the mask 51 is formed, and thereby the laminated semiconductor layer 200 is not exposed.

As shown in FIGS. 8A and 8B, in the case being viewed from the third direction z, each of the first holes 52 has a shape approximate to a rectangle.

As shown in FIGS. 8A and 8B, each of the second holes 53 has a shape, in which four outer circumferences of an arc, whose center angle is 90°, face one another so as to make each of the four corners in the expected element-formation position have an arc shape. Consequently, at the four corners of each of the expected element-formation positions, the second holes 53 having a shape extending in a cross in the first direction x and the second direction y are formed.

The mask 51 is used to adjust the thickness or the like of the laminated semiconductor layer 200 to be removed when part of the laminated semiconductor layer 200 is removed by an etching treatment in the first etching process in step 105, which will be described later. It should be noted that, though details will be described later, in the first etching process in step 105, removal of the laminated semiconductor layer 200 is carried out by, for example, the etching method such as the wet etching and the dry etching.

As the mask 51 in the exemplary embodiment, it is preferable to use a material capable of being removed, together with the laminated semiconductor layer 200, by an etching solution such as an acid or an etching gas used in the etching in the first etching process in step 105. As a material used for the mask 51 like this, for example, $SiO_2$ or the like is provided; however, the material is not limited thereto.

Moreover, the thickness of the mask 51 is set in accordance with the thickness of the laminated semiconductor layer 200 to be removed in the first etching process in step 105, the thickness of the laminated semiconductor layer 200 to be left without being removed, kind of the etching solution or the etching gas used in the etching, and the like. In the case of using $SiO_2$ as the mask 51, the thickness of the mask 51 is preferably in the range of, for example, 0.01 μm to 5 μm, and more preferably, in the range of 0.05 μm to 1 μm.

The mask 51 can be formed by a conventionally known CVD method, deposition method, sputtering method or the like.

Moreover, to form the first holes 52 and the second holes 53 in the mask 51 to cause the mask 51 to have the above-described shape, a method can be used in which a resist pattern is formed by a conventionally known photolithography method, and the mask 51 in the portion not covered with the resist is removed by the conventionally known etching method or the like.

It should be noted that the method of forming the mask 51 is not limited thereto, but any conventionally known method can be appropriately used.

(Transparent Conductive Layer Forming Process)

Next, the transparent conductive layer forming process in step 103 will be explained.

The transparent conductive layers 300 (refer to FIGS. 9A to 9D, which will be described later) are formed on the laminated semiconductor layer 200 exposed from the plural first holes 52 in the mask 51 formed in step 102 so as to correspond to each of the plural expected element-formation positions.

The transparent conductive layer 300 can use, for example, a conductive material having optical transparency constituted by oxides containing In.

Then, the transparent conductive layer 300 can be formed by providing these materials on the laminated semiconductor layer 200 by any well-known method in this technical field. It should be noted that a thermal annealing process may be performed for improving transparency or reducing resistance of the transparent conductive layer 300 after forming the transparent conductive layer 300 on the laminated semiconductor layer 200.

(Resist Forming Process)

Subsequently, the resist forming process in step 104 will be described.

FIGS. 9A to 9D are diagrams showing the semiconductor lamination substrate 20, in which the transparent conductive layer 300 and the resist 61 have been formed, obtained by carrying out the processes up to the resist forming process in step 104. FIG. 9A is a top view of part of the semiconductor lamination substrate 20, after the transparent conductive layer 300 and the resist 61 are formed, as viewed from the side where the transparent conductive layer 300 and the resist 61 are formed. FIG. 9B is a IXB-IXB cross-sectional view of FIG. 9A, FIG. 9C is a IXC-IXC cross-sectional view of FIG. 9A, and FIG. 9D is a IXD-IXD cross-sectional view of FIG. 9A.

As shown in FIGS. 9A to 9D, the resists 61, as another example of the covering portion, are provided on the laminated semiconductor layer 200 exposed from the first holes 52 in the mask 51 formed in the mask forming process in step 102 and the transparent conductive layers 300 formed in step 103. It should be noted that the resists 61 are not formed on the mask 51 and the laminated semiconductor layer 200 exposed from the second holes 53.

As the resist 61, any conventionally known material can be used. Moreover, as a method of forming the resist 61, the conventionally known photolithographic method or the like can be employed.

(First Etching Process)

Subsequently, the first etching process in step 105 will be described.

Figure 10A:
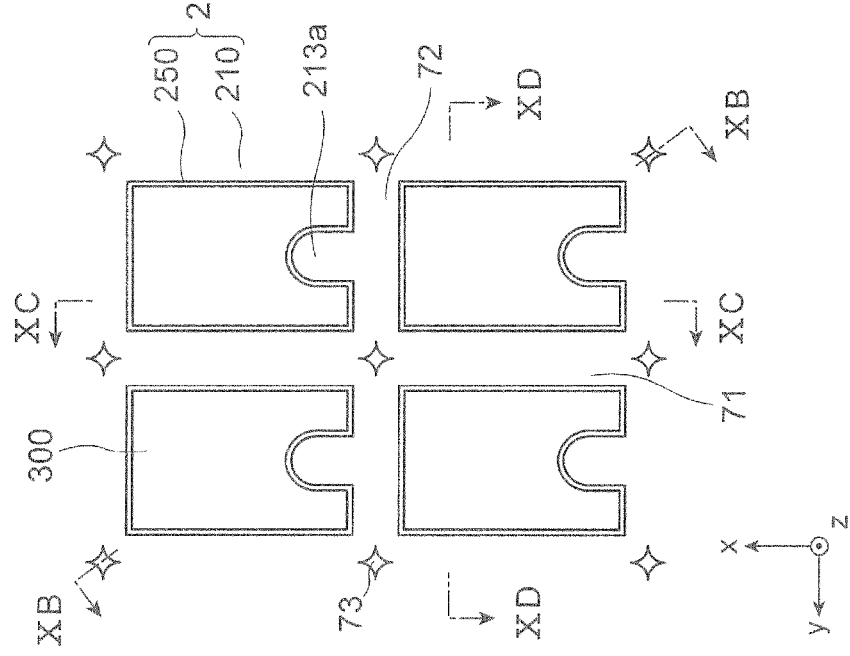
FIGS. 10A to 10D are diagrams showing the semiconductor lamination substrate, in which a first groove portion, a second groove portion, a concave portion and a semiconductor exposure surface are formed, obtained by executing a first etching process.
Figure 10B:
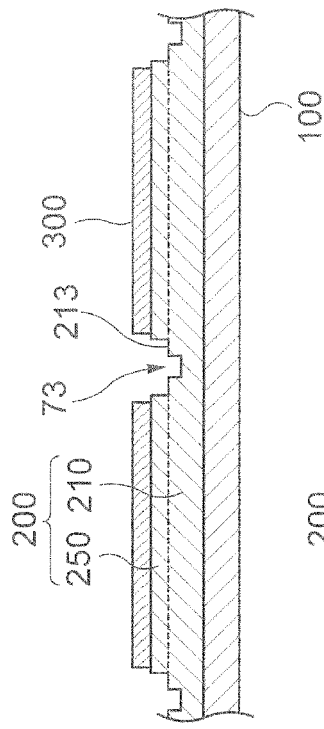
Figure 10C:
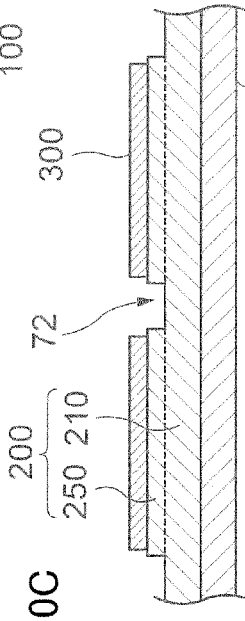
Figure 10D:
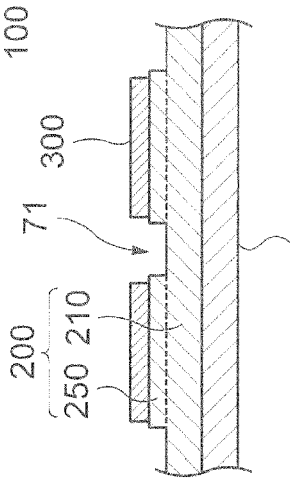

FIGS. 10A to 10D are diagrams showing the semiconductor lamination substrate 20, in which the first groove portion 71, the second groove portion 72, a concave portion 73 and the semiconductor exposure surface 213a have been formed, obtained by carrying out the first etching process in step 105. FIG. 10A is a top view of part of the semiconductor lamination substrate 20, after the first groove portion 71 and the second groove portion 72 are formed, as viewed from the side where the first groove portion 71 and the second groove portion 72 are formed. FIG. 10B is a XB-XB cross-sectional view of FIG. 10A, FIG. 10C is a XC-XC cross-sectional view of FIG. 10A, and FIG. 10D is a XD-XD cross-sectional view of FIG. 10A.

In the first etching process in step 105, part of the n-contact layer 203a (refer to FIG. 3) is exposed by removing part of the laminated semiconductor layer 200 from the semiconductor lamination substrate 20 in which the resists 61 have been formed by the resist forming process in step 104. Consequently, the first groove portion 71, the second groove portion 72, the concave portion 73 and the semiconductor exposure surface 213a are formed.

As shown in FIG. 10A, the plural first groove portions 71 are formed, each of which is provided along the first direction x. The plural first groove portions 71 are arranged substantially in parallel with one another so as to cause the intervals between the adjacent first groove portions 71 to be equal with one another. Similarly, the plural second groove portions 72 are formed, each of which is provided along the second direction y. The plural second groove portions 72 are arranged substantially in parallel with one another so as to cause the intervals between the adjacent second groove portions 72 to be equal with one another.

In the exemplary embodiment, the interval between the adjacent first groove portions 71 is smaller than the interval between the adjacent second groove portions 72.

Moreover, the plural semiconductor exposure surfaces 213a are formed. In this example, the plural semiconductor exposure surfaces 213a are arranged in line along the second direction y, each of which is provided to be connected to the second groove portion 72.

As shown in FIGS. 10A to 10D, by forming the first groove portions 71 and the second groove portions 72, in the laminated semiconductor layer 200, the lower semiconductor layer 210, which is provided over an entire region of the wafer-shaped substrate 100, and the upper semiconductor layer 250, which is provided on the lower semiconductor layer 210 and divided into plural regions by the first groove portions 71 and the second groove portions 72, are formed.

As shown in FIG. 10A, the shape of the upper semiconductor layer 250 as viewed from the third direction z is analogous to a rectangle in which a direction along the first direction x is assumed to be a long side and a direction along the second direction y is assumed to be a short side.

Moreover, as shown in FIG. 10A, the concave portion 73, as an example of an asperity portion, is formed in a region where the first groove portion 71 and the second groove portion 72 intersect with each other. Then, as shown in FIG. 10B, the concave portion 73 is provided in the first groove portion 71 or the second groove portion 72 so as to be further recessed toward the substrate 100, and thereby the n-contact layer 203a (refer to FIG. 3) is exposed.

In the case of being viewed from the third direction z, as shown in FIG. 10A, the wall surfaces of the concave portion 73 has a cross shape in which four arcs face one another. It should be noted that each of the arc-shaped wall surfaces constituting the concave portion 73 corresponds to the shape of the connecting portion 233 in the semiconductor light emitting element 1 formed from the semiconductor lamination substrate 20.

As a method for removing part of the laminated semiconductor layer 200 to form the first groove portions 71, the second groove portions 72, the concave portions 73 and the semiconductor exposure surfaces 213a, the etching method can be used. The use of the etching method makes it possible to suppress damage to the portion of the laminated semiconductor layer 200 which is not removed, compared to the case where, for example, the laminated semiconductor layer 200 is removed by use of a method such as a dicing method or a scribing method.

As the etching method, in the case of the dry etching, for example, the method such as reactive ion etching, ion milling, focused beam etching or ECR etching can be used, and in the case of the wet etching, for example, mixed acid of sulfuric acid and phosphoric acid can be used.

The etching in the first etching process in step 105 proceeds from the top surface side of the laminated semiconductor layer 200 (the side opposite to the substrate 100), and the laminated semiconductor layer 200 is removed from the top surface side thereof.

Here, in the exemplary embodiment, in the above-described mask forming process in step 102, the mask 51 (refer to FIGS. 8A to 8C and FIGS. 9A to 9D) for adjusting the thickness of the laminated semiconductor layer 200 to be removed is formed on a partial region of the laminated semiconductor layer 200. Moreover, in the above-described resist forming process in step 104, the resists 61 (refer to FIGS. 9A to 9D) that prevent removal of the laminated semiconductor layer 200 and the transparent conductive layer 300 by the etching are formed on a partial region of the laminated semiconductor layer 200 and the transparent conductive layer 300.

Accordingly, of the laminated semiconductor layer 200 in the semiconductor lamination substrate 20, in the region where the mask 51 is formed, first, the mask 51 is removed by the etching, and thereafter, the etching of the laminated semiconductor layer 200 is started. Consequently, in the region where the mask 51 is formed, part of the laminated semiconductor layer 200 is removed; however, an amount of the removed laminated semiconductor layer 200 is small compared to the region where neither the mask 51 nor the resists 61 are formed (the regions exposed from the second holes 53 (refer to FIGS. 9A and 9B)).

Moreover, of the laminated semiconductor layer 200 and the transparent conductive layer 300, in the regions where the resists 61 are formed, the etching does not proceed, and accordingly, the laminated semiconductor layer 200 and the transparent conductive layer 300 are not removed.

On the other hand, of the laminated semiconductor layer 200, in the regions where neither the mask 51 nor the resists 61 are formed (the regions exposed from the second holes 53), the etching proceeds without being prevented by the mask 51 and the resists 61.

Of the semiconductor lamination substrate 20, in the regions where the mask is formed, it is preferable that the etching is finished at a point in time when part of the laminated semiconductor layer 200 is removed and the n-contact layer 203a is exposed.

Consequently, in the regions of the semiconductor lamination substrate 20 where the mask 51 is formed, the first groove portions 71, the second groove portions 72 and the semiconductor exposure surfaces 213a that expose the n-contact layer 203a are formed by removing part of the laminated semiconductor layer 200 by the etching.

Moreover, in the regions where neither the mask 51 nor the resists 61 are formed (the regions exposed from the second holes 53), the laminated semiconductor layer 200 (the n-contact layer 203a) is shaved according to the shape of the second holes 53 by the etching, to thereby form the concave portions 73 for exposing the n-contact layer 203*a*. It should be noted that, on the laminated semiconductor layer 200 that is exposed form the second hole 53, since neither the mask 51 nor the resist 61 are formed, the laminated semiconductor layer 200 is shaved more than the first groove portion 71, the second groove portion 72 and the semiconductor exposure surface 213*a*, and accordingly, the concave portion 73 is formed to be recessed in the first groove portion 71 or the second groove portion 72.

Still further, in the regions of the laminated semiconductor layer 200 and the transparent conductive layer 300 where the resists 61 are formed, the laminated semiconductor layer 200 and the transparent conductive layer 300 are not removed and left.

In the first etching process in step 105, by the above-described processes, part of the laminated semiconductor layer 200 is removed in the semiconductor lamination substrate 20, to thereby form the first groove portions 71, the second groove portions 72, the concave portions 73 and the semiconductor exposure surfaces 213*a*, as well as the lower semiconductor layer 210 and the upper semiconductor layer 250 that has been divided into the plural regions.

(Electrode Forming Process)

Subsequently, the electrode forming process in step 106 will be described.

In the electrode forming process in step 106, the p-electrode 350 (refer to FIG. 1 and FIGS. 11A to 11D, which will be described later) is formed on a predetermined position on each of the transparent conductive layers 300, and the n-electrode 400 (refer to FIG. 1 and FIGS. 11A to 11D, which will be described later) is formed on each of the semiconductor exposure surfaces 213*a*.

As the p-electrode 350 and the n-electrode 400, various types of compositions and structures are known, and these known compositions and structures can be used without any limitation.

Moreover, as the methods for forming the p-electrode 350 and the n-electrode 400, known methods such as a vacuum deposition method and the sputtering method can be employed without any limitation.

Further, in the electrode forming process in step 106, a protecting film 500 (refer to FIGS. 11A to 11D, which will be described later) composed of $SiO_2$ or the like is formed to cover the top surface and side surface of the upper semiconductor layer 250, the transparent conductive layer 300, the p-electrodes 350 and the n-electrodes 400 except for a partial region in each of the surfaces of the p-electrodes 350 and the n-electrodes 400, the first groove portions 71 and the second groove portions 72.

(Surface Laser Process)

Subsequently, the surface laser process in step 107 will be described.

FIGS. 11A to 11D are diagrams showing the semiconductor lamination substrate 20, in which the first irradiation line 81 and the second irradiation line 82 have been formed, obtained by carrying out the electrode forming process in step 106 and the surface laser process in step 107. FIG. 11A is a top view of part of the semiconductor lamination substrate 20, after the first irradiation line 81 and the second irradiation line 82 are formed, as viewed from the side where the first irradiation line 81 and the second irradiation line 82 are formed. FIG. 11B is an XIB-XIB cross-sectional view of FIG. 11A, FIG. 11C is an XIC-XIC cross-sectional view of FIG. 11A, and FIG. 11D is an XID-XID cross-sectional view of FIG. 11A. It should be noted that, in FIG. 11A, illustration of the protecting film 500 is omitted.

In the surface laser process in step 107, the first irradiation line 81 and the second irradiation line 82, as an example of dividing grooves, are formed by irradiating the semiconductor lamination substrate 20 with laser light along the first groove portions 71 and the second groove portions 72 formed in the first etching process in step 105 from the laminated semiconductor layer 200 side to remove part of the laminated semiconductor layer 200.

The first irradiation line 81 is, as shown in FIG. 11A, formed along the first groove portion 71 and the first direction x. Moreover, the first irradiation line 81 is, as shown in FIG. 11D, formed to divide the laminated semiconductor layer 200 (the lower semiconductor layer 210) and reaches the inside of the substrate 100.

Similarly, the second irradiation line 82 is, as shown in FIG. 11A, formed along the second groove portion 72 and the second direction y. Then, the second irradiation line 82 is, as shown in FIG. 11C, formed to divide the laminated semiconductor layer 200 and reaches the inside of the substrate 100.

Accordingly, the lower semiconductor layer 200 is divided into the plural portions by the first irradiation line 81 and the second irradiation line 82.

Moreover, as described above, at a portion where the first groove portion 71 and the second groove portion 72 intersect each other, the concave portion 73 (refer to FIGS. 10A and 10B) is provided, and the first irradiation line 81 and the second irradiation line 82 are provided to intersect each other at the concave portion 73. Then, as shown in FIG. 11A, the concave portion 73 is divided by the first irradiation line 81 and the second irradiation line 82, to thereby form four steps 74 that includes a curved surface 74*a* (refer to FIG. 12), which has a curved shape when viewed from the third direction z.

Figure 12:
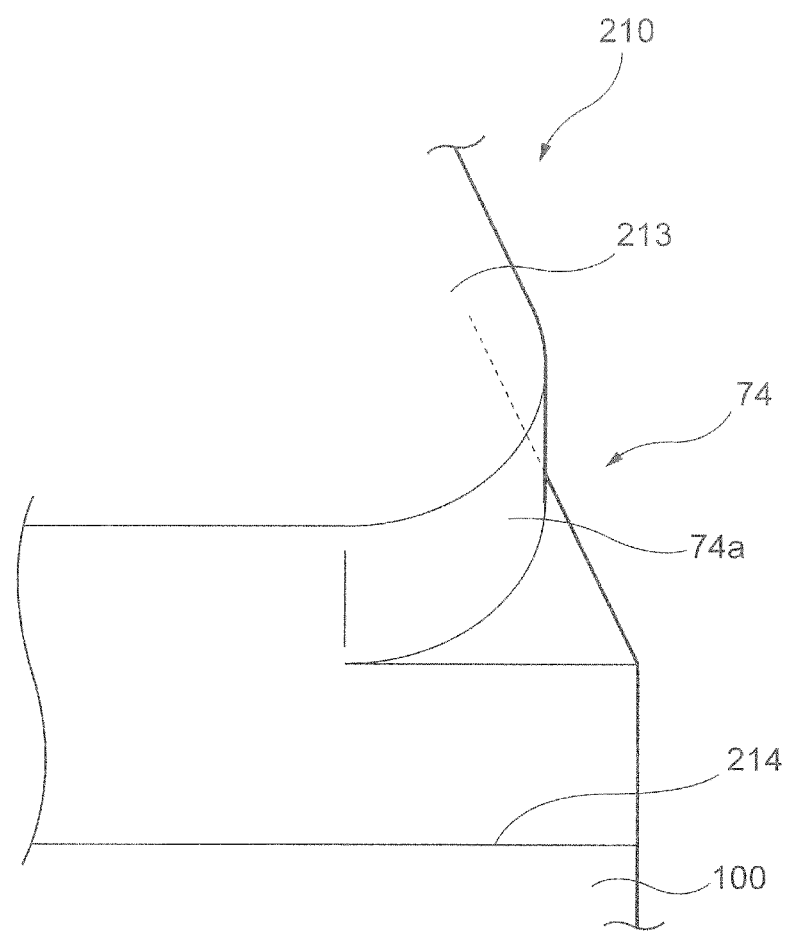
FIG. 12 is a diagram showing a structure of vicinity of steps in the lower semiconductor layer after the surface laser process is finished.

FIG. 12 is a diagram showing a structure in the vicinity of the steps 74 in the lower semiconductor layer 210 after the surface laser process in step 104 is finished. It should be noted that, in FIG. 12, of the plural (four) steps 74 that are formed by dividing the concave portion 73 by the first irradiation line 81 and the second irradiation line 82, one step 74 is indicated.

As shown in FIG. 12 and FIG. 11A, in the lower semiconductor layer 210 in which the first irradiation line 81 and the second irradiation line 82 have been formed in the surface laser process in step 107, the curved surfaces 74*a* are formed on the lower semiconductor top surface 213 side that is in contact with the upper semiconductor layer 250, to thereby provide a shape of a rectangle with rounded corners, in which the corner portion has an arc shape when viewed from the third direction z. In contrast, of the lower semiconductor layer 210, the lower semiconductor bottom surface 214 that is in contact with the substrate 100 has a rectangular shape when viewed from the third direction z.

Consequently, the lower semiconductor layer 210 has a shape of substantially a rectangular parallelepiped as a whole, and at four corners in the case of being viewed from the third direction z, the steps 74, each of which includes the arc-shaped curved surface 74*a*, are formed by the curved surfaces 74*a*.

(Second Etching Process)

Subsequently, the second etching process in step 108 will be described.

FIGS. 13A to 13D are diagrams showing the semiconductor lamination substrate 20 obtained by carrying out the second etching process in step 108. FIG. 13A is a top view of part of the semiconductor lamination substrate 20, after the wet etching is finished, as viewed from the side where the p-electrodes 350 and the n-electrodes 400 are formed. FIG. 13B is a XIIIB-XIIIB cross-sectional view of FIG. 13A, FIG. 13C is a XIIIC-XIIIC cross-sectional view of FIG. 13A, and FIG.

13D is a XIIID-XIIID cross-sectional view of FIG. 13A. It should be noted that, in FIG. 13A, illustration of the protecting film 500 is omitted.

In the second etching process in step 108, by performing the wet etching on the semiconductor lamination substrate 20, in which the first irradiation line 81 and the second irradiation line 82 have been formed in the surface laser process in step 107, the first lower semiconductor side surfaces 211 (refer to FIG. 1), the second lower semiconductor side surfaces 212 (refer to FIG. 2) and the connecting side surfaces 235 (refer to FIG. 1) are formed.

The wet etching is carried out by dipping the semiconductor lamination substrate 20, in which the first irradiation line 81 and the second irradiation line 82 have been formed, in a state where the protecting film 500 is left into an etching solution, such as orthophosphoric acid, that is heated to a predetermined temperature.

When the semiconductor lamination substrate 20, in which the first irradiation line 81 and the second irradiation line 82 have been formed in the surface laser process in step 107, is dipped into the etching solution, the etching solution enters into the first irradiation line 81 and the second irradiation line 82. In the first irradiation line 81 and the second irradiation line 82, the lower semiconductor layer 210 is exposed. Accordingly, the exposed lower semiconductor layer 210 erodes by the etching solution entered into the first irradiation line 81 and the second irradiation line 82. On the other hand, the protecting film 500 or the transparent conductive layer 300 and the upper semiconductor layer 250 that are covered with the protecting film 500 do not erode by the etching solution.

Here, in the exemplary embodiment, in the lower semiconductor layer 210, there is a difference in a degree of erosion by the etching solution between a side in contact with the upper semiconductor layer 250 (the lower semiconductor top surface 213 side) and the other side in contact with the substrate 100 (the lower semiconductor bottom surface 214 side). Specifically, the lower semiconductor bottom surface 214 side in the lower semiconductor layer 210 easily erodes by the etching solution compared to the lower semiconductor top surface 213 side in the lower semiconductor layer 210.

The reason thereof is as follows.

In general, AlN constituting the intermediate layer 201 (refer to FIG. 3) in the exemplary embodiment has a property of easily eroding by the etching solution, such as the orthophosphoric acid, compared to AlGaN, GaN, InGaN or the like constituting the base layer 202 (refer to FIG. 3) and the n-contact layer 203a (refer to FIG. 3) in the exemplary embodiment.

Moreover, as described above, in the exemplary embodiment, each of the intermediate layer 201, the base layer 202 and the n-contact layer 203a constituting the lower semiconductor layer 210 is formed from the side close to the substrate 100 toward the side in contact with the upper semiconductor layer 250 so that cystallinity thereof is gradually improved.

Further, as described above, the group III nitride semiconductor constituting the lower semiconductor layer 210 in the exemplary embodiment grows so that the N-polarity plane faces the substrate top surface 113 of the substrate 100. Then, in general, it is known that, in the case where the wet etching is performed on the group III nitride semiconductor, the etching proceeds from the N-polarity plane side.

From the above reason, in the lower semiconductor layer 210 of the exemplary embodiment, the lower semiconductor bottom surface 214 side easily erodes by the etching solution compared to the lower semiconductor top surface 213 side.

Accordingly, in the portions of the lower semiconductor layer 210 except for the steps 74, as shown in FIGS. 13C and 13D, the lower semiconductor bottom surface 214 side is shaved more than the lower semiconductor top surface 213 side as the etching proceeds. Then, as shown in FIGS. 13C and 13D, the first lower semiconductor side surfaces 211 and the second lower semiconductor side surfaces 212 that are inclined to the direction perpendicular to the substrate top surface 113 of the substrate 100 are formed.

On the other hand, in the regions of the lower semiconductor layer 210 where the steps 74 are formed, the etching proceeds differently compared to that in the regions where the steps 74 are not formed. Subsequently, description will be given of the etching in the steps 74 in the lower semiconductor layer 210.

Figure 14A:
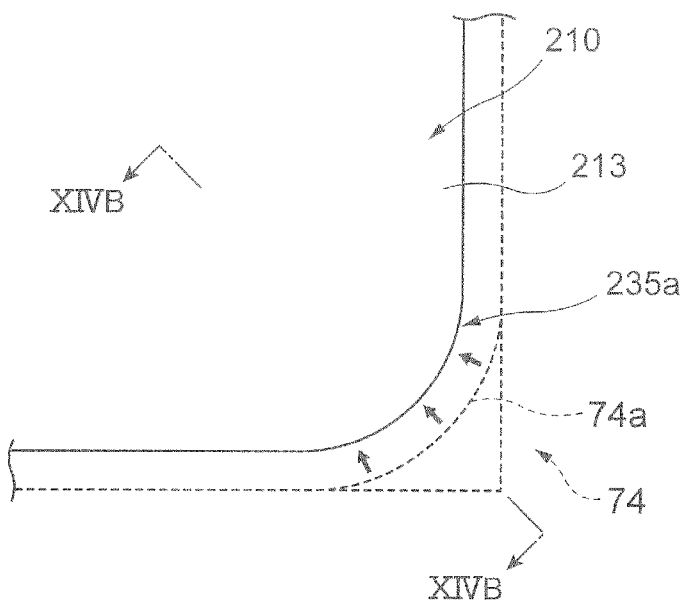
FIGS. 14A and 14B are diagrams showing proceeding of wet etching in the vicinity of steps in the lower semiconductor layer.
Figure 14B:
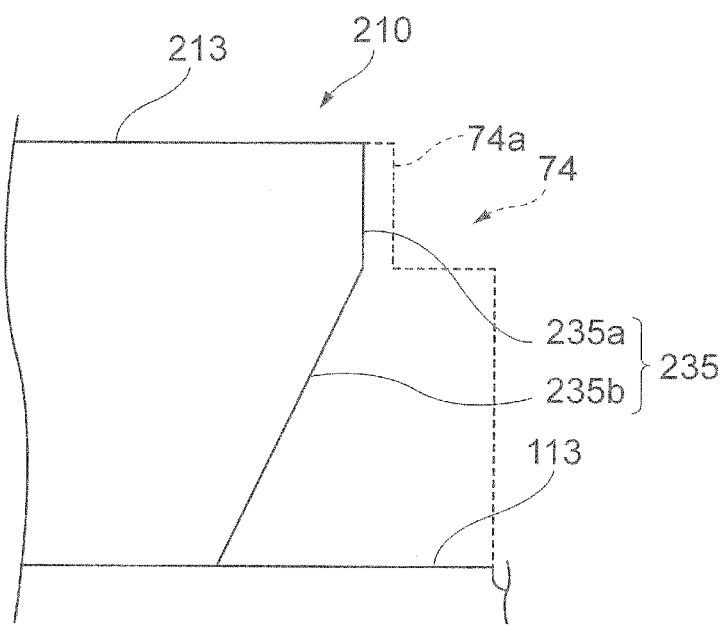

FIGS. 14A and 14B are diagrams for illustrating proceeding of the wet etching in the vicinity of the steps 74 in the lower semiconductor layer 210. FIG. 14A is a top view of the vicinity of the steps 74 in the lower semiconductor layer 210 in the semiconductor lamination substrate 20 as viewed from the lower semiconductor top surface 213 side, and FIG. 14B is a XIVB-XIVB cross-sectional view in FIG. 14A. It should be noted that, in FIGS. 14A and 14B, illustration of the upper semiconductor layer 250 and the protecting film 500 is omitted.

Here, in the region of the lower semiconductor layer 210 that is enclosed by the first irradiation line 81 and the second irradiation line 82, in a case where a plane extending in a direction perpendicular to the substrate top surface 113 (the third direction z) exists, as the curved surface 74a in the step 74, removal of the laminated semiconductor layer 200 (the lower semiconductor layer 210) depending on the shape of the curved surface 74a is performed by the wet etching inside the curved surface 74a (on a side away from the first irradiation line 81 and the second irradiation line 82).

Accordingly, in the wet etching carried out in the second etching process of the exemplary embodiment, as shown in FIG. 14A, the lower semiconductor layer 210 erodes inwardly thereof while keeping the shape of the curved surface 74a in the step 74.

In other words, as shown in FIG. 14A, the lower semiconductor layer 210 is removed from the curved surface 74a toward the inside of the lower semiconductor layer 210 so as to form an arc shape when viewed from the third direction z.

Consequently, as shown in FIGS. 14A, 14B and FIG. 1, the perpendicular portion 235a that extends in the third direction z and presents an arc shape as viewed from the third direction z is formed, and the connecting portion 233 having an arc shape is formed in the boundary portion between the lower semiconductor top surface 213 and the perpendicular portion 235a.

On the other hand, in the step 74 of the lower semiconductor layer 210, in the region closer to the lower semiconductor bottom surface 214 than the curved surface 74a (the lower region in the step 74), similar to the above-described regions of the lower semiconductor layer 210 other than the steps 74, the etching easily proceeds as the region comes closer to the substrate 100.

Accordingly, as shown in FIG. 14B, in the region of the step 74 closer to the lower semiconductor bottom surface 214 than the curved surface 74a, the lower semiconductor bottom surface 214 side is shaved more than the lower semiconductor top surface 213 side. This forms the inclined portion 235b that is inclined to the direction perpendicular to the substrate top surface 113 of the substrate 100 and the perpendicular portion 235a.

As described above, by the second etching process in step 108, the connecting side surface 235 including the perpendicular portion 235a and the inclined portion 235b is formed between the first lower semiconductor side surface 211 and the second lower semiconductor side surface 212. Then, in the lower semiconductor top surface 213 of the lower semiconductor layer 210, the first linear portions 231, the second linear portions 232 and the connecting portions 233 are formed.

(Dividing Process)

In the dividing process in step 109, the semiconductor lamination substrate 20, in which the lower semiconductor layer 210 has been separated into plural regions by the second etching process in step 108, is cut and divided into the plural semiconductor light emitting elements 1.

It should be noted that, before dividing the semiconductor lamination substrate 20 into the plural semiconductor light emitting elements 1, a process of grinding and polishing the substrate bottom surface 114 of the substrate 100 may be provided so as to cause the substrate 100 in the semiconductor lamination substrate 20 to have a predetermined thickness.

The thickness of the substrate 100 after grinding and polishing is in a range of 60 μm to 300 μm, preferably in a range of 80 μm to 250 μm, and more preferably in a range of 100 μm to 200 μm. By providing the thickness of the substrate 100 within the above ranges, the semiconductor lamination substrate 20 can be efficiently divided in the dividing process in step 109.

In the dividing process in step 109, first, laser irradiation is applied to the inside of the substrate 100 along the first irradiation lines 21 and the second irradiation lines 22 from the substrate bottom surface 114 (refer to FIG. 3) side of the wafer-shaped substrate 100 in the semiconductor lamination substrate 20. Accordingly, inside the substrate 100, plural modified regions, in which sapphire single crystal is modified along the first irradiation lines 21 and the second irradiation lines 22, are formed.

Subsequently, by pressing a blade from the substrate bottom surface 114 side of the wafer-shaped substrate 100 along the modified regions formed along the first irradiation lines 21 and the second irradiation lines 22, cracks starting on the modified regions are caused, to thereby divide the wafer-shaped substrate 100 into plural substrates 100. At this time, on each of the divided substrates 100, there exist the lower semiconductor layer 210, the upper semiconductor layer 250, the transparent conductive layer 300, the p-electrode 350 and the n-electrode 400.

By the division, the first substrate side surfaces 111 and the second substrate side surfaces 112 in the substrate 100 are formed.

Then, through the above processes, the semiconductor light emitting element 1 shown in FIG. 1 can be obtained.

Here, conventionally, when the semiconductor lamination substrate 20 is divided into the plural semiconductor light emitting elements 1, there are some cases where vibration or the like occurs to the semiconductor lamination substrate 20, and also there are some cases where the lower semiconductor layers 210 in the semiconductor lamination substrate 20 collide with each other, and thereby chipping or the like occurs in the lower semiconductor layer 210.

In the semiconductor lamination substrate 20 in the exemplary embodiment, as described above, the connecting side surface 235 is formed at a portion that connects the first lower semiconductor side surface 211 and the second lower semiconductor side surface 212 in the lower semiconductor layer 210, which has been divided into the plural regions by the surface laser process in step 107 and the second etching process in step 108, and therefore, the corner portions in the lower semiconductor layer 210 are rounded, and the projection amount thereof is small.

Accordingly, compared to the case where the present configuration is not provided, in the dividing process, the lower semiconductor layers 210 hardly collide with each other, and moreover, even in the case where the lower semiconductor layers 210 collide with each other, it is possible to suppress occurrence of cracking or chipping compared to the case where the corners of the lower semiconductor layer 210 have pointed shapes, as in the conventional way.

<Second Mode>

Subsequently, description will be given of a second mode of the method of manufacturing the semiconductor light emitting element 1 (refer to FIG. 1) according to the exemplary embodiment. It should be noted that same symbols are assigned to configurations, processes and the like same as those in the first mode, and detailed description thereof will be omitted.

In the second mode, similar to the first mode, the semiconductor light emitting element 1 is obtained through the semiconductor laminating process in step 101, the mask forming process in step 102, the transparent conductive layer forming process in step 103, the resist forming process in step 104, the first etching process in step 105, the electrode forming process in step 106, the surface laser process in step 107, the second etching process in step 108 and the dividing process in step 109 (refer to FIG. 7 for each of them).

In the second mode, the semiconductor light emitting element 1 is formed in almost the same way as the first mode except for the point that the shape of a mask 55 (refer to FIGS. 15A to 15D, which will be described later) formed in the mask forming process in step 102, the shape of the laminated semiconductor layer 200 removed in the first etching process in step 105, and the way of proceeding of the wet etching of the laminated semiconductor layer 200 in the second etching process in step 108 are different from those in the first mode.

In the second mode, similar to the first mode, the mask forming process in step 102, the resist forming process in step 104 and the first etching process in step 105 correspond to the semiconductor removing process, the surface laser process in step 107 corresponds to the dividing groove forming process, and the second etching process in step 108 corresponds to the wet etching process.

FIGS. 15A to 15D are diagrams for illustrating the method of manufacturing the semiconductor light emitting element 1 in the second mode. FIGS. 15A and 15B show the semiconductor lamination substrate 20, in which the mask 55, the transparent conductive layer 300 and the resists 61 have been formed, after the processes are carried out up to the resist forming process in step 104. FIG. 15A is a top view of part of the semiconductor lamination substrate 20, after the mask 55, the transparent conductive layer 300 and the resist 61 are formed, as viewed from the side where the mask 55 is formed. FIG. 15B is a XVB-XVB cross-sectional view of FIG. 15A.

It should be noted that FIGS. 15C and 15D show the semiconductor lamination substrate 20 after the first etching process in step 105 is carried out, and details thereof will be described later.

In the second mode, in the mask forming process in step 2, the mask 55, as a still another example of the covering portion, is formed on the laminated semiconductor layer 200 of the wafer-shaped semiconductor lamination substrate 20, in which the laminated semiconductor layer 200 has been formed in step 101. Here, the shape of the mask 55 formed in the second mode is different from the shape of the mask 51 in the first mode (refer to FIGS. 8A to 8C).

In this mode, the plural masks 55 are provided on the laminated semiconductor layer 200 of the semiconductor lamination substrate 20, each of which has an arc shape when viewed from the third direction z, as shown in FIG. 15A. Then, when viewed form the third direction z, the masks 55 are provided to locations outside of the four corners of the expected element-formation position corresponding to the positions of the connecting portions 233 (refer to FIG. 1) of the semiconductor light emitting element 1 (refer to FIG. 1) formed from the semiconductor lamination substrate 20.

The mask 55 is, similar to the first mode, composed of $SiO_2$ or the like. Moreover, the thickness of the mask 51 is set in accordance with the thickness of the laminated semiconductor layer 200 to be removed in the first etching process in step 105, a kind of etching gas used in the etching, and the like.

Further, similar to the first mode, the mask 55 can be formed by the conventionally known CVD method, deposition method, sputtering method or the like.

Subsequently, the first etching process in step 105 in the second mode will be described.

FIGS. 15C and 15D are, as described above, diagrams showing the semiconductor lamination substrate 20, in which part of the laminated semiconductor layer 200 has been removed by carrying out the first etching process in step 105 in the second mode. FIG. 15C is a top view of part of the semiconductor lamination substrate 20, in which part of the laminated semiconductor layer 200 has been removed, as viewed from the side where the transparent conductive layer 300 is formed, and FIG. 15D is a XVD-XVD cross-sectional view in FIG. 15C.

As shown in FIGS. 15C and 15D, in the first etching process in step 105 in the second mode, removal of the laminated semiconductor layer 200 is carried out in accordance with the shape of the mask 55 formed in the mask forming process in step 102.

Then, in the first etching process in step 105 in the second mode, by removing part of the laminated semiconductor layer 200, the first groove portions 71, the second groove portions 72, the semiconductor exposure surfaces 213a and convex portions 75, as an example of the asperity portion, projected from the first groove portions 71 and the second groove portions 72 are formed.

As shown in FIG. 15C, the plural first groove portions 71 and the plural second groove portions 72 are formed along the first direction x and the second direction y, respectively.

Moreover, as shown in FIG. 15C, the plural convex portions 75 are formed at the regions where the first groove portions 71 and the second groove portions 72 intersect each other. Specifically, the convex portions 75 are formed in the regions where the masks 55 are formed, and when viewed from the third direction z, provided to enclose four corners of the expected element-formation position corresponding to the positions of the connecting portions 233 of the semiconductor light emitting element 1 formed from the semiconductor lamination substrate 20.

As the method of removing part of the laminated semiconductor layer 200 for forming the first groove portions 71, the second groove portions 72, the convex portions 75 and the semiconductor exposure surfaces 213a, similar to the first mode, the etching method, such as the dry etching, the wet etching or the like, is used.

Similar to the first mode, the etching in the first etching process in step 105 proceeds from the top surface side (opposite side of the substrate 100) of the laminated semiconductor layer 200, and the laminated semiconductor layer 200 is removed from the top surface side.

Here, in the second mode, in the above-described mask forming process in step 102, the masks 55 are formed on partial regions on the laminated semiconductor layer 200. Moreover, in the above-described resist forming process in step 104, the resists 61 are formed on partial regions on the laminated semiconductor layer 200 and the transparent conductive layer 300.

Accordingly, of the laminated semiconductor layer 200 of the semiconductor lamination substrate 20, in the regions where the masks 55 are formed, the masks 55 are initially removed by the etching.

Moreover, of the laminated semiconductor layer 200 of the semiconductor lamination substrate 20, in the regions where the resists 61 are formed, the etching does not proceed, and accordingly, the laminated semiconductor layer 200 and the transparent conductive layer 300 are not removed.

On the other hand, of the laminated semiconductor layer 200, in the regions where neither the masks 55 nor the resists 61 are formed, the etching proceeds without being prevented by the masks 55 or the resists 61.

Here, in the second mode, the etching is finished when part of the laminated semiconductor layer 200 is removed and the n-contact layer 203a is exposed in the regions of the laminated semiconductor layer 200, where neither the masks 55 nor the resists 61 are formed.

Consequently, in the semiconductor lamination substrate 20, the first groove portions 71 and the second groove portions 72, where the n-contact layer 203a is exposed, and the semiconductor exposure surfaces 213a are formed in the regions where neither the masks 55 nor the resists 61 are formed.

Moreover, in the second mode, in the regions of the semiconductor lamination substrate 20, where the masks 55 are formed, for example, the etching is finished when the masks 55 are removed, and by leaving the laminated semiconductor layer 200 without removing thereof, the convex portions 75 projected from the first groove portions 71 and the second groove portions 72 are formed.

Still further, in the semiconductor lamination substrate 20, on the laminated semiconductor layer 200 and the transparent conductive layer 300, on which the resists 61 are formed, the laminated semiconductor layer 200 and the transparent conductive layer 300 are left without being removed.

It should be noted that, in the second mode, it was assumed that, in the regions of the semiconductor laminated substrate 20 where the masks 55 were formed, the etching was finished when the masks 55 were removed; however, for example, part of the laminated semiconductor layer 200 positioned below the masks 55 may be removed after the masks 55 are removed.

In this case, in the regions where the masks 55 are formed, an amount of the removed laminated semiconductor layer 200 is small compared to the region where neither the masks 55 nor the resists 61 are formed. Accordingly, in the regions where the masks 55 are formed, the convex portions 75 projected from the first groove portions 71 and the second groove portions 72 are formed.

As described above, in the first etching process in step 105, in the semiconductor lamination substrate 20, the first groove portions 71, the second groove portions 72, the semiconductor exposure surfaces 213a and the convex portions 75 are formed, as well as the lower semiconductor layer 210 and the upper semiconductor layer 250 divided into the plural regions are formed.

Figure 16A:
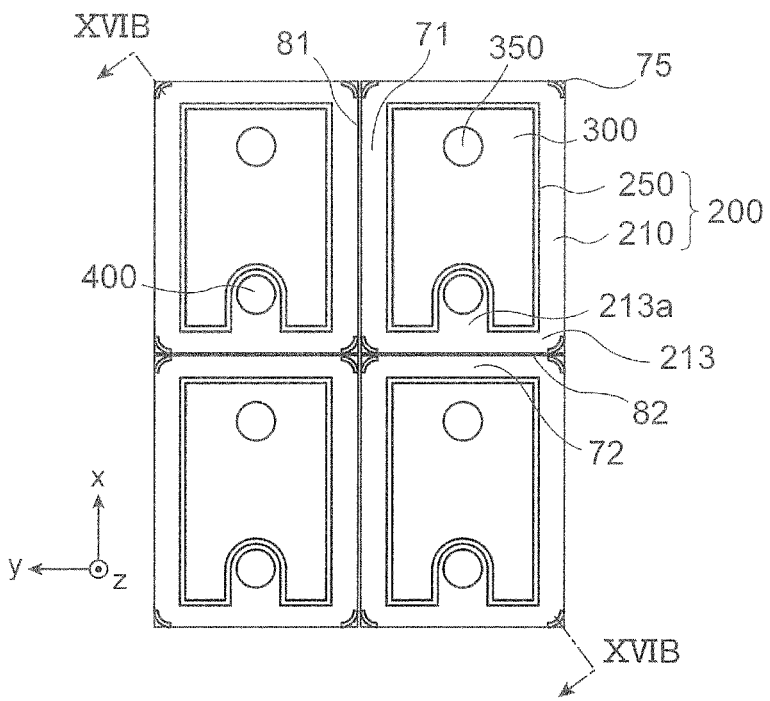
FIGS. 16A to 16C are diagrams for illustrating the second etching process in the second mode.
Figure 16B:
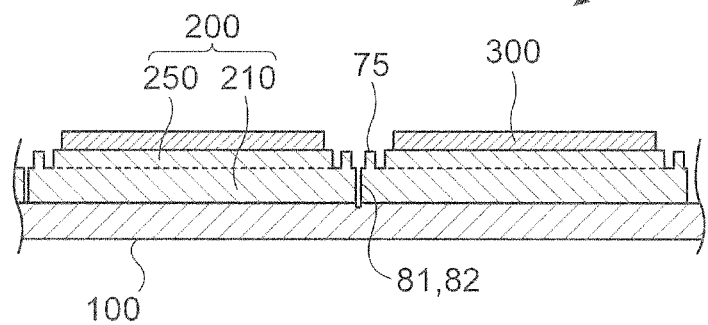
Figure 16C:
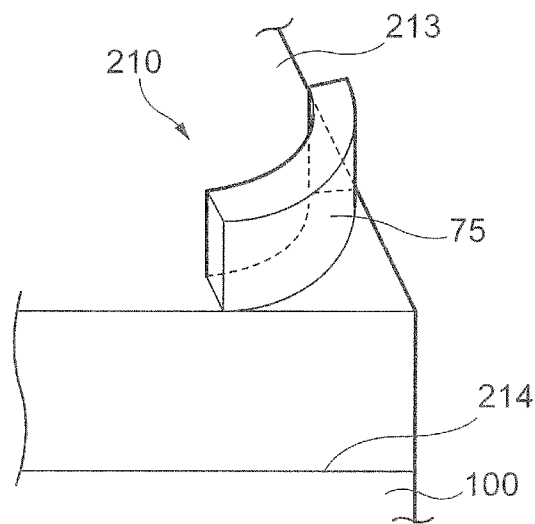

Subsequently, the second etching process in step 108 will be described. FIGS. 16A to 16C are diagrams for illustrating the second etching process in step 108 in the second mode. FIG. 16A is a top view of part of the semiconductor lamination substrate 20, which is obtained by carrying out the electrode forming process in step 106 and the surface laser process in step 107 (before carrying out the second etching process in step 108), as viewed from the side where the first irradiation line 81 and the second irradiation line 82 are formed. FIG. 16B is a XVIB-XVIB cross-sectional view in FIG. 16A. FIG. 16C is a perspective view showing vicinity of the convex portion 75 in the semiconductor lamination substrate 20 after the electrode forming process in step 106 and the surface laser process in step 107 are carried out and before the second etching process in step 108 is carried out.

Figure 17A:
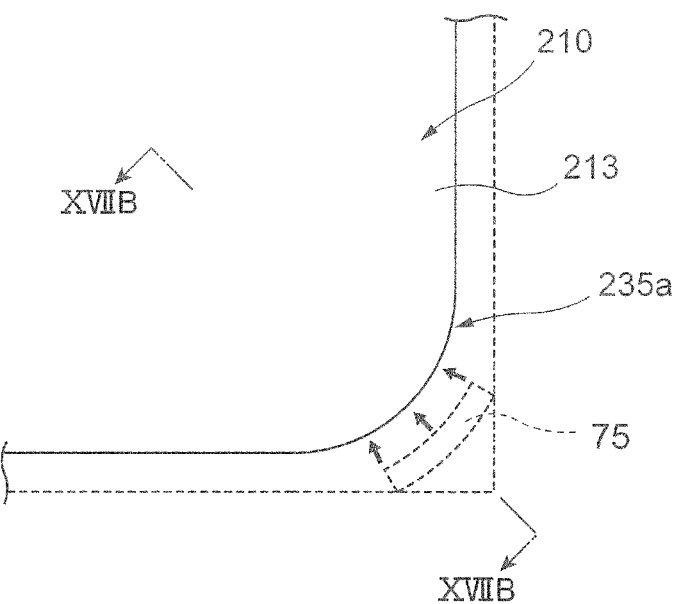
FIGS. 17A and 17B are diagrams for illustrating proceeding of the wet etching in the lower semiconductor layer in the vicinity of a convex portion.
Figure 17B:
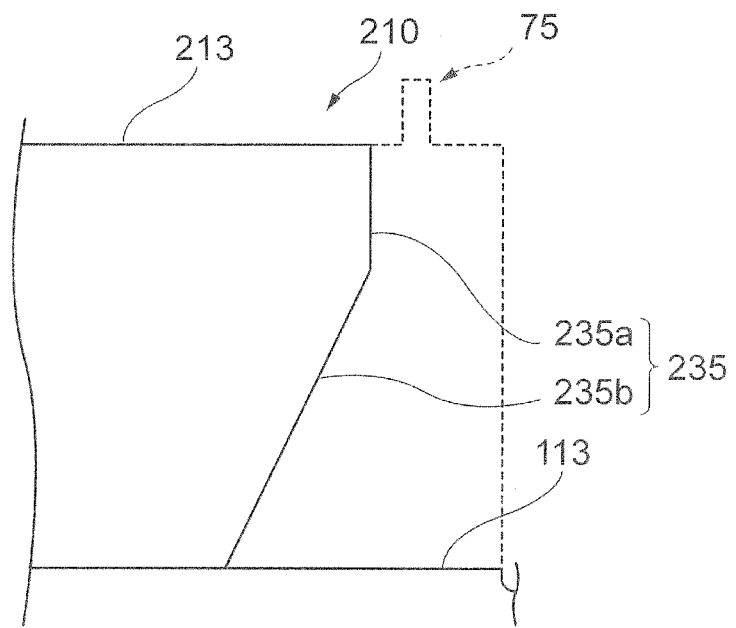

Moreover, FIGS. 17A and 17B are diagrams for illustrating proceeding of the wet etching in the lower semiconductor layer 210 in the vicinity of the convex portion 75. FIG. 17A is a top view of vicinity of the convex portion 75 in the lower semiconductor layer 210 of the semiconductor lamination substrate 20, as viewed from the lower semiconductor top surface 213 side, and FIG. 17B is a XVIIB-XVIIB cross-sectional view in FIG. 17A. It should be noted that, in FIGS. 17A and 17B, illustration of the upper semiconductor layer 250 and the protecting film 500 is omitted.

In the surface laser process in step 107, as shown in FIG. 16A, the first irradiation line 81 and the second irradiation line 82 are provided to intersect each other at a center of the four convex portions 75 that have been formed at a point of intersection of the first groove portion 71 and the second groove portion in the first etching process in step 105. Consequently, the lower semiconductor layer 210 is divided into plural portions by the first irradiation line 81 and the second irradiation line 82, and in each of the four corners of each of the divided lower semiconductors 210, one convex portion 75 is arranged.

In the second etching process in step 108, similar to the first mode, the first lower semiconductor side surfaces 211, the second lower semiconductor side surfaces 212 and the connecting side surfaces 235 (refer to FIG. 1) are formed by the wet etching.

Here, as shown in FIGS. 16A to 16C, in the laminated semiconductor layer 200 of the semiconductor lamination substrate 20 before executing the second etching process in step 108, at the four corners of the expected element-formation position, the convex portions 75 that extend along the direction perpendicular to the substrate top surface 113 (the third direction z) are formed. As described in the first mode, in the case where there exists a plane extending in the third direction z in the laminated semiconductor layer 200, the laminated semiconductor layer 200 is removed depending on the shape of the plane by the wet etching inside the plane (on a side away from the first irradiation line 81 and the second irradiation line 82).

Consequently, in the second mode, in a portion of the lower semiconductor layer 200 positioned below the convex portion 75 and inside the convex portion 75 (on a side away from the first irradiation line 81 and the second irradiation line 82), as shown in FIG. 17A, the lower semiconductor layer 200 is removed depending on the shape of the convex portion 75 so as to present an arc shape when viewed from the third direction z by performing the wet etching on the semiconductor lamination substrate 20.

Accordingly, similar to the first mode, the perpendicular portion 235a that extends along the third direction z and presents an arc shape when viewed from the third direction z is formed, and at the boundary portion between the lower semiconductor top surface 213 and the perpendicular portion 235a, the connecting portion 233 having an arc shape is formed (refer to FIG. 1).

Moreover, in the region of the lower semiconductor bottom surface 214 side of the lower semiconductor layer 210 positioned below the convex portion 75, and in the region of the lower semiconductor layer 210, where the convex portion 75 is not formed, the lower semiconductor bottom surface 214 side is shaved more than the lower semiconductor top surface 213 side.

Accordingly, as shown in FIG. 17B, in the region of the lower semiconductor bottom surface 214 side of the lower semiconductor layer 210 positioned below the convex portion 75, the inclined portion 235b that is inclined to the perpendicular portion 235a and is inclined to the direction perpendicular to the substrate top surface 113 is formed.

Moreover, in the region of the lower semiconductor layer 210, where the convex portion 75 is not formed, similar to the first mode, part of the lower semiconductor layer 210 is shaved by the etching solution entered through the first irradiation line 81 and the second irradiation line 82, to thereby form the first lower semiconductor side surfaces 211 and the second lower semiconductor side surfaces 212 that are inclined to the direction perpendicular to the substrate top surface 113 (refer to FIG. 1).

Thereafter, similar to the first mode, the semiconductor light emitting element 1 shown in FIG. 1 can be obtained by carrying out the dividing process in step 109.

<Third Mode>

Subsequently, description will be given of a third mode of the method of manufacturing the semiconductor light emitting element 1 (refer to FIG. 1) according to the exemplary embodiment. It should be noted that same symbols are assigned to configurations, processes and the like same as those in the first or second mode, and detailed description thereof will be omitted.

In the method of manufacturing the semiconductor light emitting element 1 in the third mode, in contrast to the first and second modes, the mask forming process in step 102 is not performed. In other words, in the third mode, on the semiconductor lamination substrate 20, in which the laminated semiconductor layer 200 has been formed in step 101, the transparent conductive layer forming process for forming the transparent conductive layer 300 (step 103) is carried out without executing the mask forming process. Thereafter, similar to the first and second modes, the semiconductor light emitting element 1 shown in FIG. 1 is obtained by performing the resist forming process (step 104), the first etching process (step 105), the electrode forming process (step 106), the surface laser process (step 107), the second etching process (step 108) and the dividing process (step 109).

In the third mode, the resist forming process in step 104 and the first etching process in step 105 correspond to the semiconductor removing process, the surface laser process in step 107 corresponds to the dividing groove forming process, and the second etching process in step 108 corresponds to the wet etching process.

It should be noted that, in the third mode, shapes of resists 65 formed in the resist forming process in step 104 are different from the shapes of the resists 61 formed in the first and second modes.

Figures 18A, 18B, 18C, 18D:
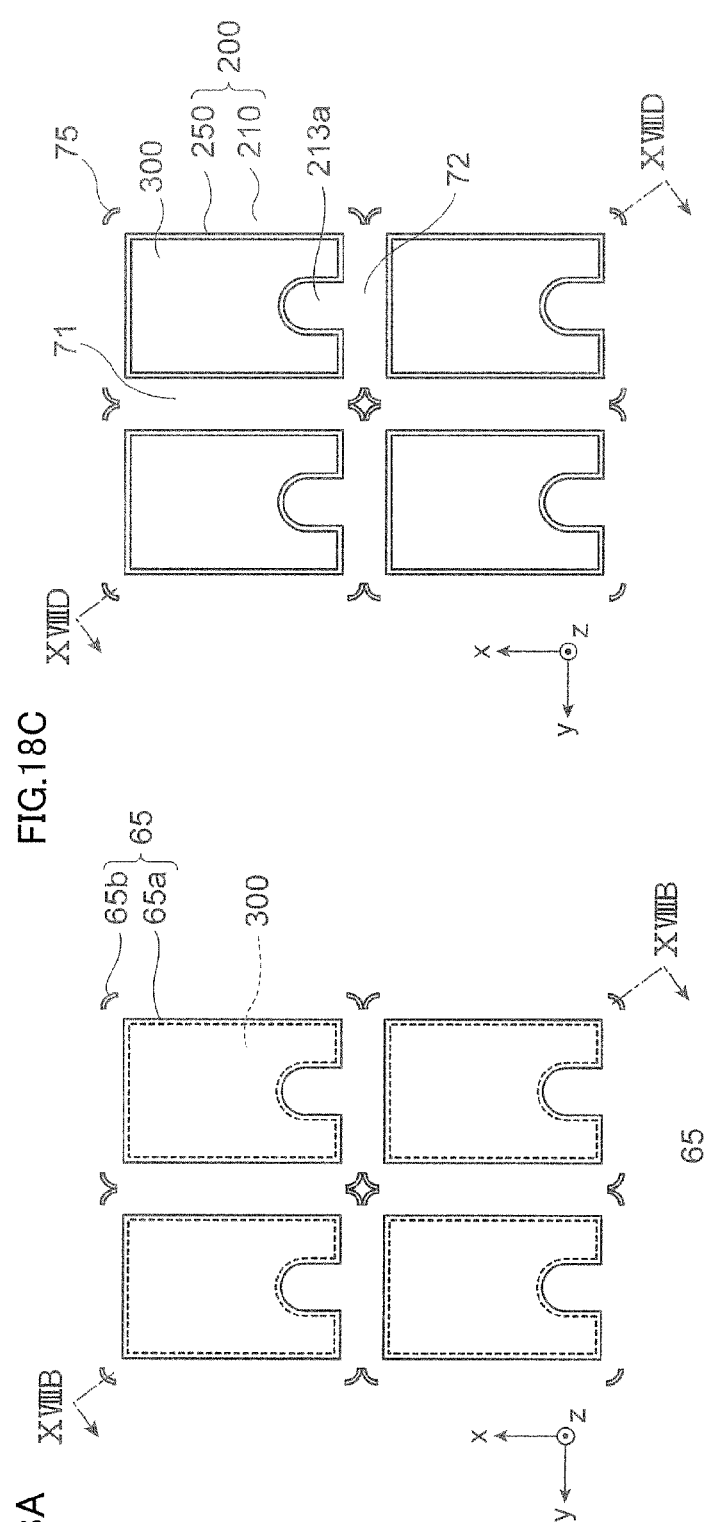
FIGS. 18A to 18D are diagrams for illustrating a method of manufacturing a semiconductor light emitting element in a third mode.

FIGS. 18A to 18D are diagrams for illustrating a method of manufacturing the semiconductor light emitting element 1 in a third mode. FIGS. 18A and 18B show the semiconductor lamination substrate 20, in which the transparent conductive layer 300 and the resists 65 have been formed, after the processes are carried out up to the resist forming process in step 104. FIG. 18A is a top view of part of the semiconductor lamination substrate 20, after the transparent conductive layer 300 and the resist 65 are formed, as viewed from the side where the resists 65 are formed, and FIG. 18B is a XVIIIB-XVIIIB cross-sectional view of FIG. 18A.

It should be noted that FIGS. 15C and 15D are diagrams showing the semiconductor lamination substrate 20 after the first etching process in step 105 is carried out, and details thereof will be described later.

The resist 65, as still another example of the covering portion in the third mode, includes: a first resist 65*a* provided on the transparent conductive layer 300 and the laminated semiconductor layer 200 positioned around the transparent conductive layer 300; and a second resist 65*b* provided at a position corresponding to the connecting portion 233 (refer to FIG. 1) in the semiconductor light emitting element 1 formed from the semiconductor lamination substrate 20.

The first resist 65*a* has a shape similar to that of the resist 61 in the first and second modes.

Moreover, the second resist 65*b* has a shape similar to that of the mask 55 in the second mode. Specifically, the second resists 65*b* are, as shown in FIG. 18A, when viewed from the third direction z, provided to enclose four corners of the expected formation position of the semiconductor light emitting element 1 corresponding to the positions of the connecting portions 233 (refer to FIG. 1) of the semiconductor light emitting element 1 (refer to FIG. 1) formed from the semiconductor lamination substrate 20.

Subsequently, the first etching process in step 105 in the third mode will be described.

FIGS. 18C and 18D are diagrams showing the semiconductor lamination substrate 20, in which part of the laminated semiconductor layer 200 has been removed by carrying out the first etching process in step 105 in the third mode. FIG. 18C is a top view of part of the semiconductor lamination substrate 20, in which part of the laminated semiconductor layer 200 has been removed, as viewed from the side where the transparent conductive layer 300 is formed, and FIG. 18D is a XVIIID-XVIIID cross-sectional view in FIG. 18C.

As shown in FIGS. 18C and 18D, in the first etching process in step 105 in the third mode, removal of the laminated semiconductor layer 200 is carried out in accordance with the shape of the resists 65 formed in the resist forming process in step 104.

In the first etching process in step 105 in the third mode, by removing part of the laminated semiconductor layer 200, similar to the second mode, the first groove portions 71, the second groove portions 72, the semiconductor exposure surfaces 213*a* and convex portions 75 projected from the first groove portions 71 and the second groove portions 72 are formed.

As the method of removing part of the laminated semiconductor layer 200 for forming the first groove portions 71, the second groove portions 72, the convex portions 73 and the semiconductor exposure surfaces 213*a*, similar to the first and second modes, the etching method, such as the dry etching, the wet etching or the like, is used.

As described in the first and second modes, the etching in the first etching process in step 105 proceeds from the top surface side (opposite side of the substrate 100) of the laminated semiconductor layer 200, and the laminated semiconductor layer 200 is removed from the top surface side.

Here, in the third mode, in the above-described resist forming process in step 104, the resists 65 (the first resists 65*a* and the second resists 65*b*) are formed on partial regions on the laminated semiconductor layer 200.

Accordingly, in the first etching process in step 105 in the third mode, in the semiconductor lamination substrate 20, the laminated semiconductor layer 200 in the regions where the resists 65 are not formed is removed, and the laminated semiconductor layer 200 and the transparent conductive layer 300, on which the resists 65 are formed, are left without being removed.

Here, in the third mode, the etching is finished when part of the laminated semiconductor layer 200 is removed and the n-contact layer 203*a* is exposed in the regions of the laminated semiconductor layer 200, where the resists 65 are not formed.

Consequently, as shown in FIGS. 18C and 18D, in the semiconductor lamination substrate 20, the first groove portions 71 and the second groove portions 72, where the n-contact layer 203*a* is exposed, and the semiconductor exposure surfaces 213*a* are formed in the regions where the resists 65 (the first resists 65*a* and the second resists 65*b*) are not formed.

Further, in the regions of the semiconductor lamination substrate 20, where the second resists 65*b* are formed, the convex portions 75, as an example of an asperity portion, projected from the first groove portions 71 and the second groove portions 72 are formed by leaving the laminated semiconductor layer 200 without removing thereof.

Moreover, in the semiconductor lamination substrate 20, on the laminated semiconductor layer 200 and the transparent conductive layer 300, on which the first resists 65 are formed, the laminated semiconductor layer 200 and the transparent conductive layer 300 are left without being removed.

Here, as shown in FIGS. 18C and 18D, the shape of the semiconductor lamination substrate 20 formed by the first etching process in step 105 in the third mode, in which the laminated semiconductor layer 200 has been removed, is equal to the shape of the semiconductor lamination substrate 20 formed by the first etching process in step in the second mode shown in FIGS. 15C and 15D.

Accordingly, similar to the second mode, the semiconductor light emitting element 1 shown in FIG. 1 can be obtained through the electrode forming process in step 106, the surface laser process in step 107, the second etching process in step 108 and the dividing process in step 109.

It should be noted that, in the third mode, in contrast to the first and second modes, the mask forming process in step 102 is not carried out. Consequently, in the third mode, manufacturing processes of the semiconductor light emitting element 1 can be simplified compared to the first and second modes.

Second Exemplary Embodiment

Subsequently, a second exemplary embodiment according to the present invention will be described. It should be noted that same symbols are assigned to configurations same as those in the above-described first exemplary embodiment, and detailed description thereof will be omitted.

(Structure of Semiconductor Light Emitting Element)

Figure 19:
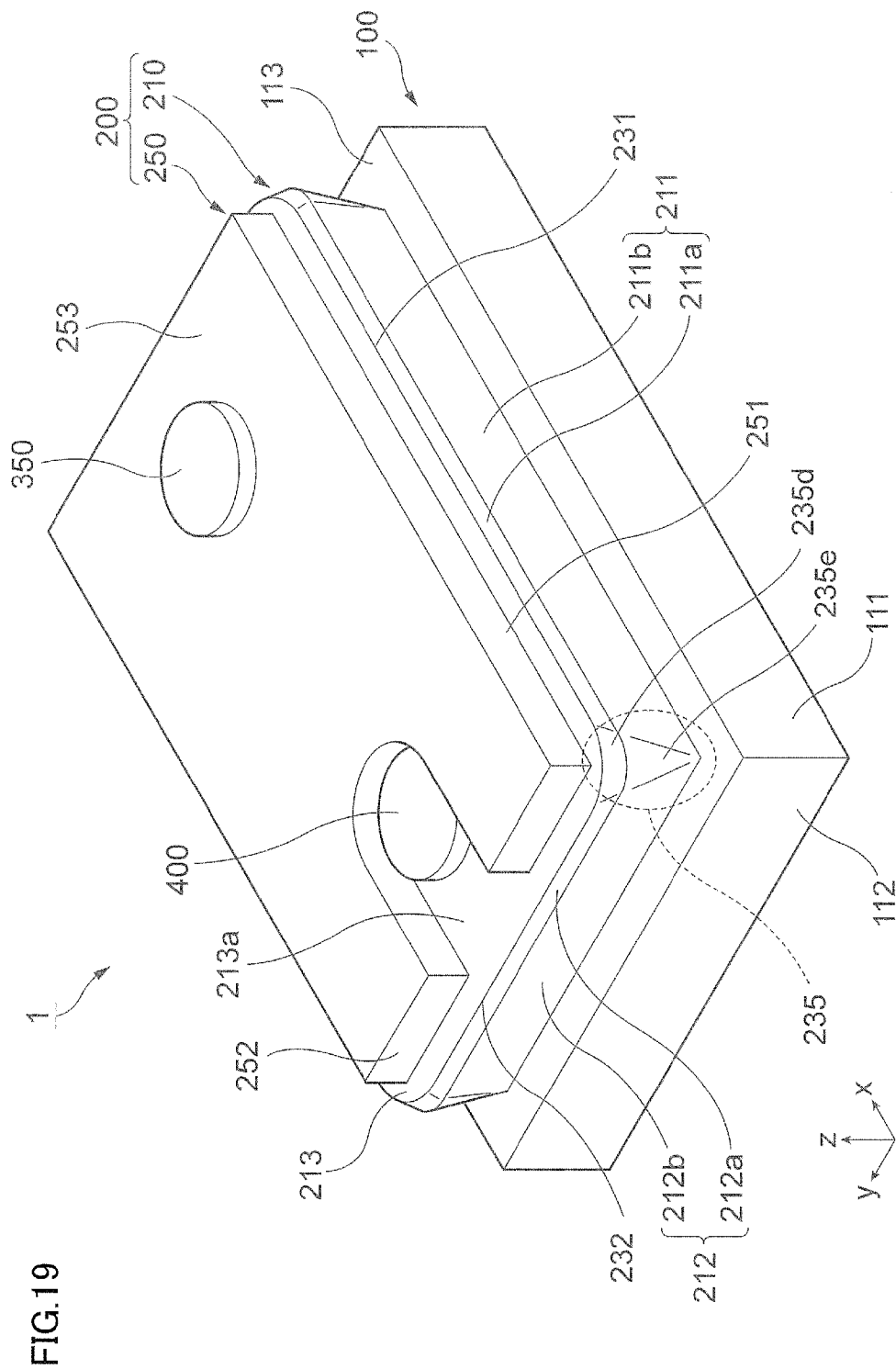
FIG. 19 is an example of a perspective view of a semiconductor light emitting element to which a second exemplary embodiment is applied.
Figure 20:
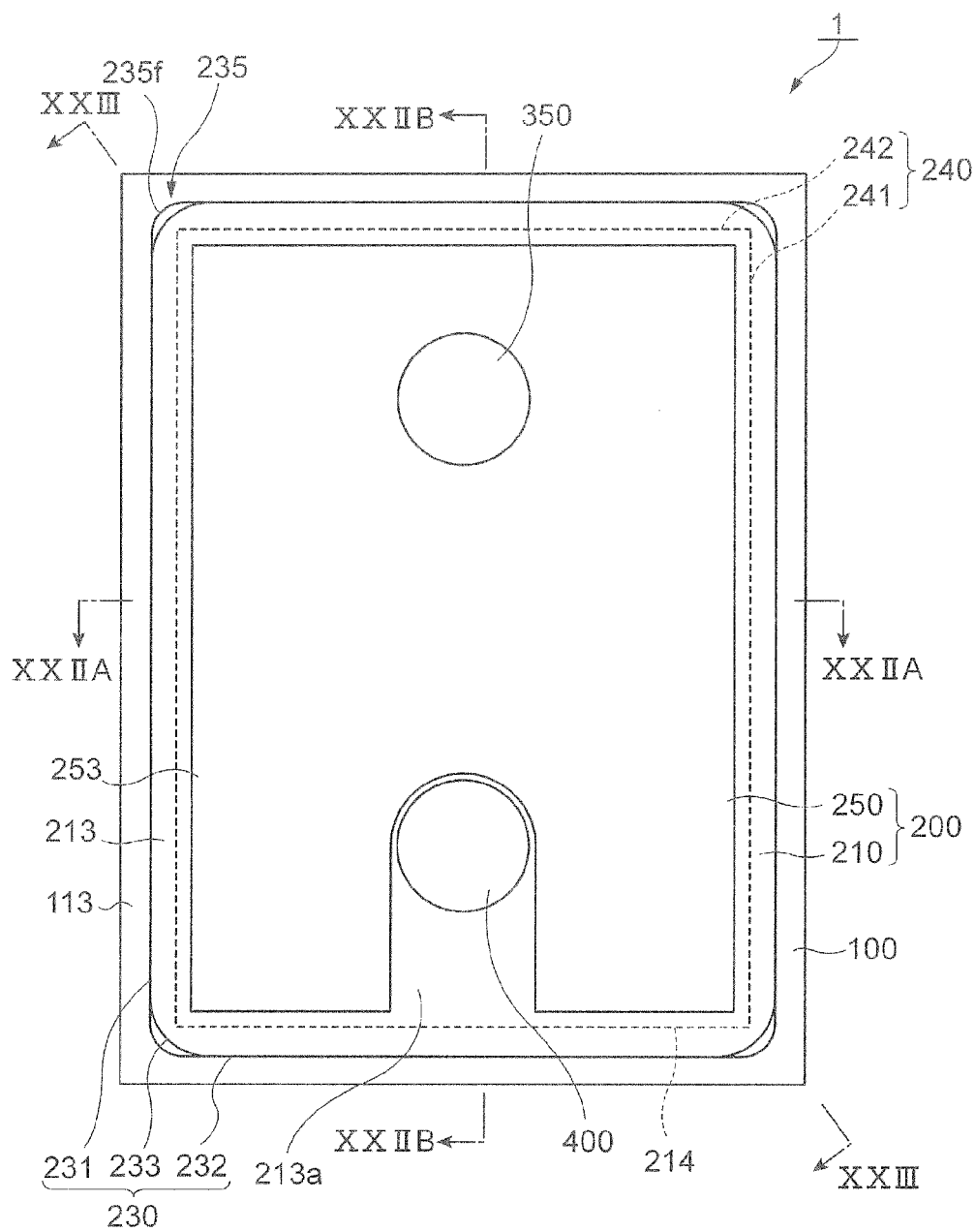
FIG. 20 is an example of a top view of the semiconductor light emitting element shown in FIG. 19.
Figure 21:
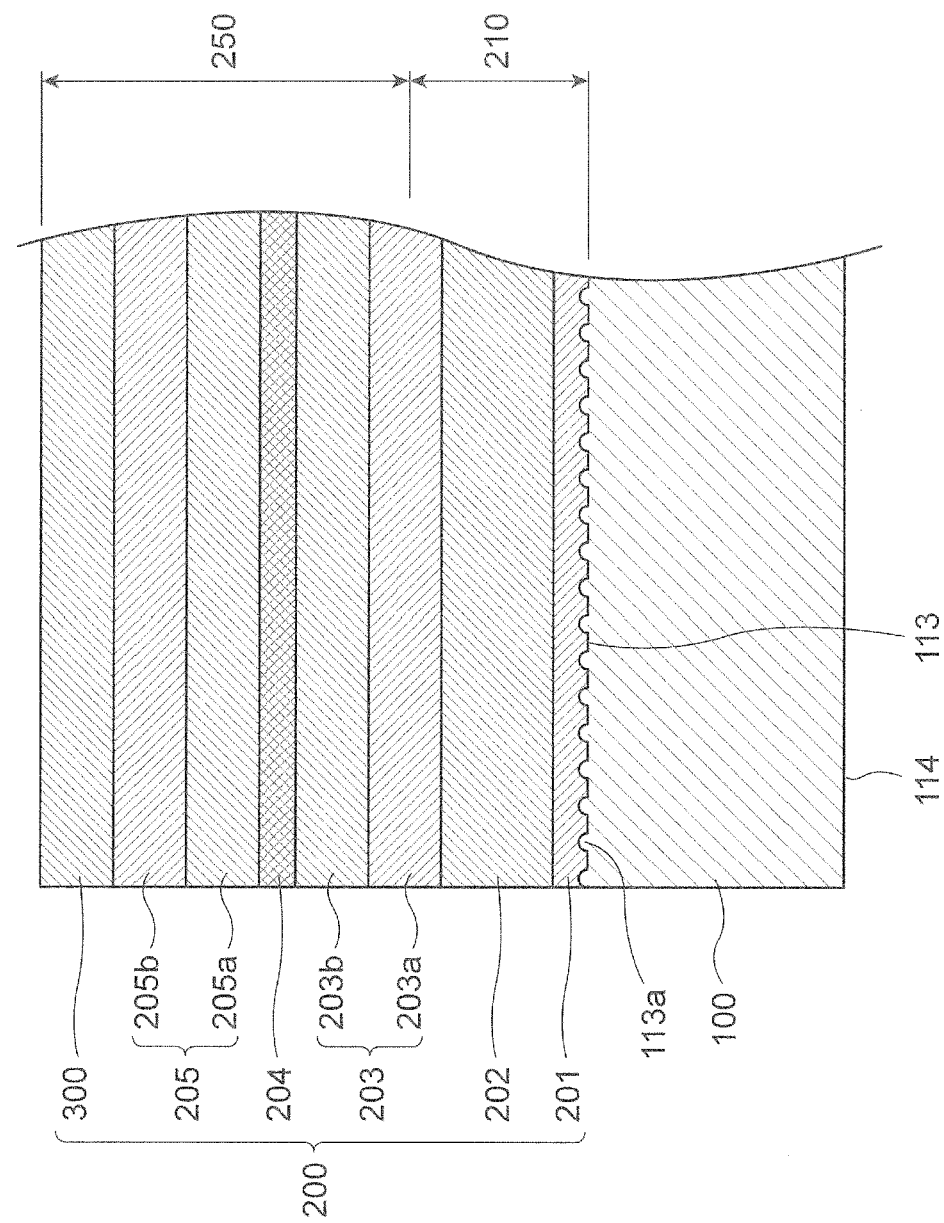
FIG. 21 is an example of a vertical cross-sectional view of a substrate and a laminated semiconductor layer to which the second exemplary embodiment is applied.

FIG. 19 is an example of a perspective view of a semiconductor light emitting element 1 to which a first exemplary embodiment is applied, and FIG. 20 is an example of a top view of the semiconductor light emitting element 1 shown in FIG. 19. Moreover, FIG. 21 is an example of a vertical cross-sectional view of a substrate 100 and a laminated semiconductor layer 200, to which the exemplary embodiment is applied.

As shown in FIGS. 19 and 20, the semiconductor light emitting element 1 of the exemplary embodiment includes: the substrate 100; the laminated semiconductor layer 200, which is an example of a semiconductor layer, laminated on the substrate 100; a p-electrode 350 and an n-electrode 400 formed on the laminated semiconductor layer 200.

In addition, the laminated semiconductor layer 200 of the exemplary embodiment includes a lower semiconductor layer 210 laminated on the substrate 100 and an upper semiconductor layer 250 laminated on the lower semiconductor layer 210. It should be noted that, in this example, as shown in FIG. 21, the upper semiconductor layer 250 includes a transparent conductive layer 300. The p-electrode 350 is formed on the upper semiconductor layer 250 (an upper semiconductor top surface 253), and the n-electrode 400 is formed on the lower semiconductor layer 210 (a semiconductor exposure surface 213a, which will be described later).

As shown in FIG. 20, the lower semiconductor top surface 213 of the exemplary embodiment has a shape that is analogous to a rectangle with arc-shaped four corners (a so-called rectangle with rounded corners). In other words, the top surface edge 230 of the lower semiconductor top surface 213 includes: a first linear portion 231 that is linear along the first direction x; a second linear portion 232 that is linear along the second direction y; and a connecting portion 233 having an arc shape to connect the first linear portion 231 and the second linear portion 232.

Here, the top surface edge 230 is an example of a second edge, and in the exemplary embodiment, the first linear portion 231 and the second linear portion 232 correspond to a linear portion.

Moreover, as shown in FIG. 19, the lower semiconductor side surface of the lower semiconductor layer 210 includes two first lower semiconductor side surfaces 211, two second lower semiconductor side surfaces 212, and four connecting side surfaces 235. It should be noted that, in the exemplary embodiment, the first lower semiconductor side surfaces 211 and the second lower semiconductor side surfaces 212 correspond to linear portion side surfaces.

Further, as shown in FIG. 2, a bottom surface edge 240 in the lower semiconductor bottom surface 214 in the exemplary embodiment is an example of a first edge, and has a rectangular shape as shown in FIG. 20.

It should be noted that a detailed structure of the lower semiconductor layer 210 will be described later.

Further, as shown in FIGS. 19 and 20, the upper semiconductor layer 250 in the exemplary embodiment includes: four upper semiconductor side surfaces (not shown); an upper semiconductor top surface 253 on which the p-electrode 350 is laminated; and an upper semiconductor bottom surface (not shown) that faces the upper semiconductor top surface 253 via the four upper semiconductor side surfaces and contacts the lower semiconductor top surface 213 of the lower semiconductor layer 210. In the exemplary embodiment, similar to the first exemplary embodiment, of the four upper semiconductor side surfaces in the upper semiconductor layer 250, each of the two upper semiconductor side surfaces extending along the first direction x is referred to as a first upper semiconductor side surface 251, and each of the two upper semiconductor side surfaces extending along the second direction y is referred to as a second upper semiconductor side surface 252.

Here, in the exemplary embodiment, an area of the upper semiconductor bottom surface in the upper semiconductor layer 250 is formed smaller than an area of the lower semiconductor top surface 213 in the lower semiconductor layer 210. Accordingly, a partial region in the lower semiconductor top surface 213 of the lower semiconductor layer 210 is exposed to the outside.

Moreover, though illustration is omitted in FIGS. 19 and 20, the upper semiconductor layer 250 in the exemplary embodiment is covered with a protecting film 151 (refer to FIGS. 28A to 28D, which will be described later) composed of, for example, $SiO_2$. Specifically, on the upper semiconductor top surface 253 of the upper semiconductor layer 250, the first upper semiconductor side surfaces 251 and the second upper semiconductor side surfaces 252, the protecting film 151 is laminated.

(Description of Detailed Structure of Lower Semiconductor Layer)

Subsequently, a detailed structure of the lower semiconductor layer 210 in the semiconductor light emitting element 1 of the exemplary embodiment will be described.

Figure 22A:
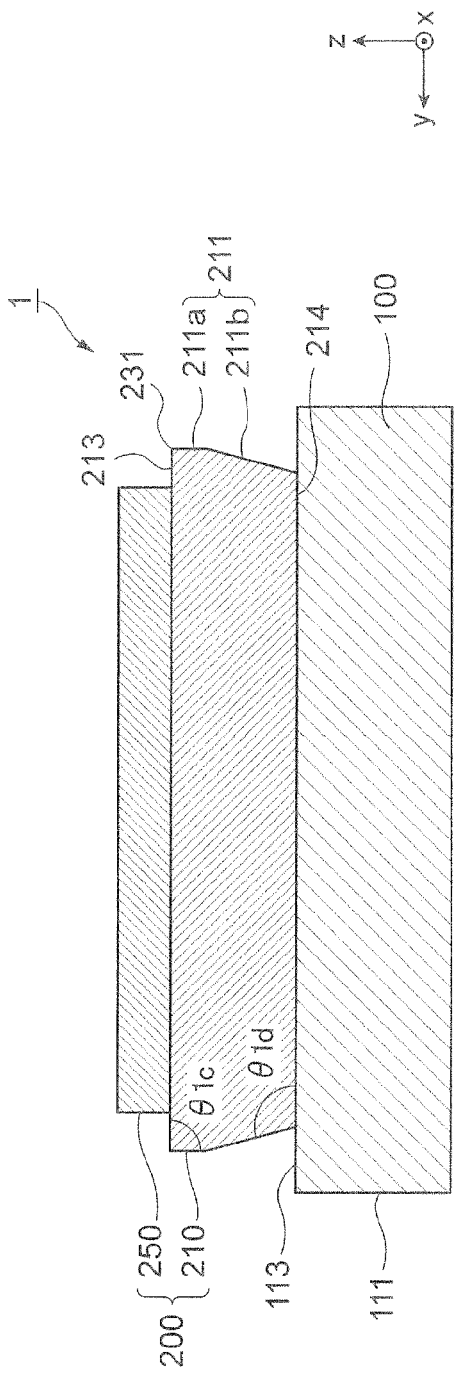
FIGS. 22A and 22B are examples of a vertical cross-sectional view of the semiconductor light emitting element to which the second exemplary embodiment is applied.
Figure 22B:
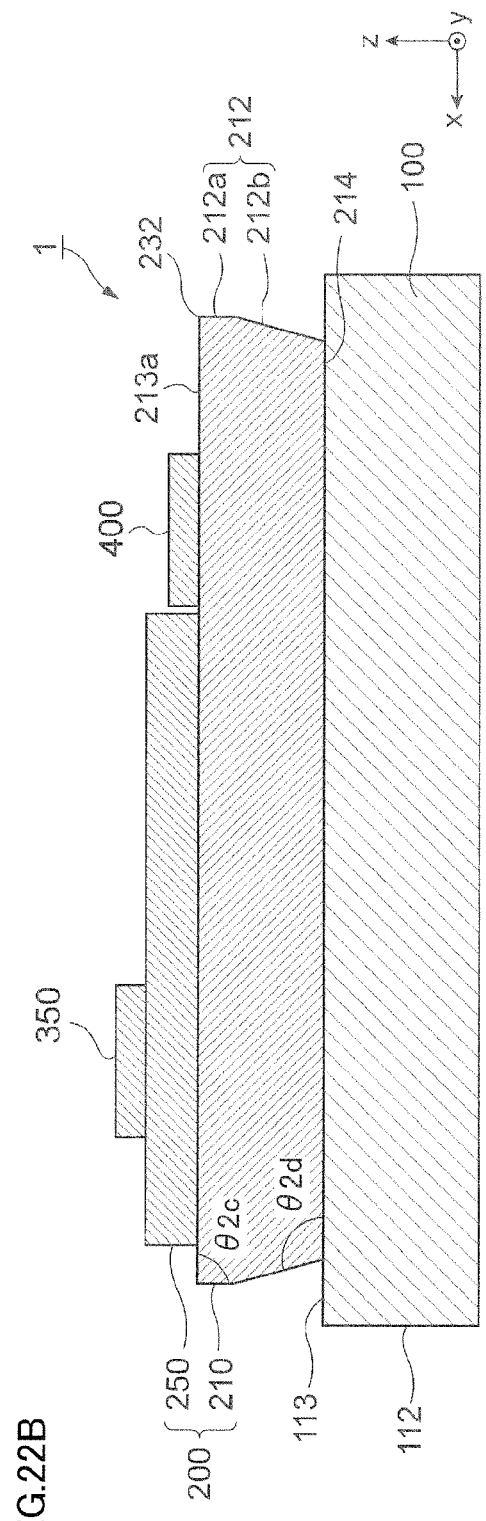

FIGS. 22A and 22B are examples of a vertical cross-sectional view of the semiconductor light emitting element 1 to which the exemplary embodiment is applied. FIG. 22A is a XXIIA-XXIIA cross-sectional view in FIG. 20, and FIG. 22B is a XXIIB-XXIIB cross-sectional view in FIG. 20.

The first lower semiconductor side surface 211 of the lower semiconductor layer 210 includes, as shown in FIG. 22A and FIG. 19: a first perpendicular surface 211a that extends from the first linear portion 231 of the lower semiconductor top surface 213 toward the substrate 100; and a first inclined surface 211b that is inclined to the first perpendicular surface 211a and extends from a lower end of the first perpendicular surface 211a toward the substrate top surface 113 with inclination inwardly of the lower semiconductor layer 210.

It should be noted that, in the exemplary embodiment, the first perpendicular surface 211a is provided along the third direction z, and an angle formed between the first perpendicular surface 211a and the first inclined surface 211b is an obtuse angle.

Moreover, as shown in FIG. 22A, if the angle formed between the lower semiconductor top surface 213 and the first perpendicular surface 211a of the first lower semiconductor side surface 211 is assumed to be θ1c, θ1c is substantially 90° in the exemplary embodiment.

Further, if the angle formed between the lower semiconductor bottom surface 214 and the first inclined surface 211b of the first lower semiconductor side surface 211 is assumed to be θ1d, θ1d is an obtuse angle (θ1d>90°). In other words, the first inclined surface 211b is provided to be inclined to a plane perpendicular to the substrate top surface 113.

The second lower semiconductor side surface 212 of the lower semiconductor layer 210 includes, as shown in FIG. 22B and FIG. 19: a second perpendicular surface 212a that extends from the second linear portion 232 of the lower semiconductor top surface 213 toward the substrate 100; and a second inclined surface 212b that is inclined to the second perpendicular surface 212a and extends from a lower end of the second perpendicular surface 212a toward the substrate top surface 113 with inclination inwardly of the lower semiconductor layer 210.

It should be noted that, in the exemplary embodiment, the second perpendicular surface 212a is provided along the third direction z, and an angle formed between the second perpendicular surface 212a and the second inclined surface 212b is an obtuse angle.

Moreover, as shown in FIG. 22B, if the angle formed between the lower semiconductor top surface 213 and the second perpendicular surface 212a of the second lower semiconductor side surface 212 is assumed to be θ2c, θ2c is substantially 90° in the exemplary embodiment.

Further, if the angle formed between the lower semiconductor bottom surface 214 and the second inclined surface 212b of the second lower semiconductor side surface 212 is assumed to be θ2d, θ2d is an obtuse angle (θ2d>90°). In other words, the second inclined surface 212b is provided to be inclined to a plane perpendicular to the substrate top surface 113.

Here, since the first lower semiconductor side surface 211 and the second lower semiconductor side surface 212 include the first perpendicular surface 211a and the second perpendicular surface 212a, respectively, the lower semiconductor layer 210 of the exemplary embodiment has a thickness in the first linear portion 231 and the second linear portion 232 as shown in FIGS. 22A and 22B (also refer to FIG. 19).

Figure 23:
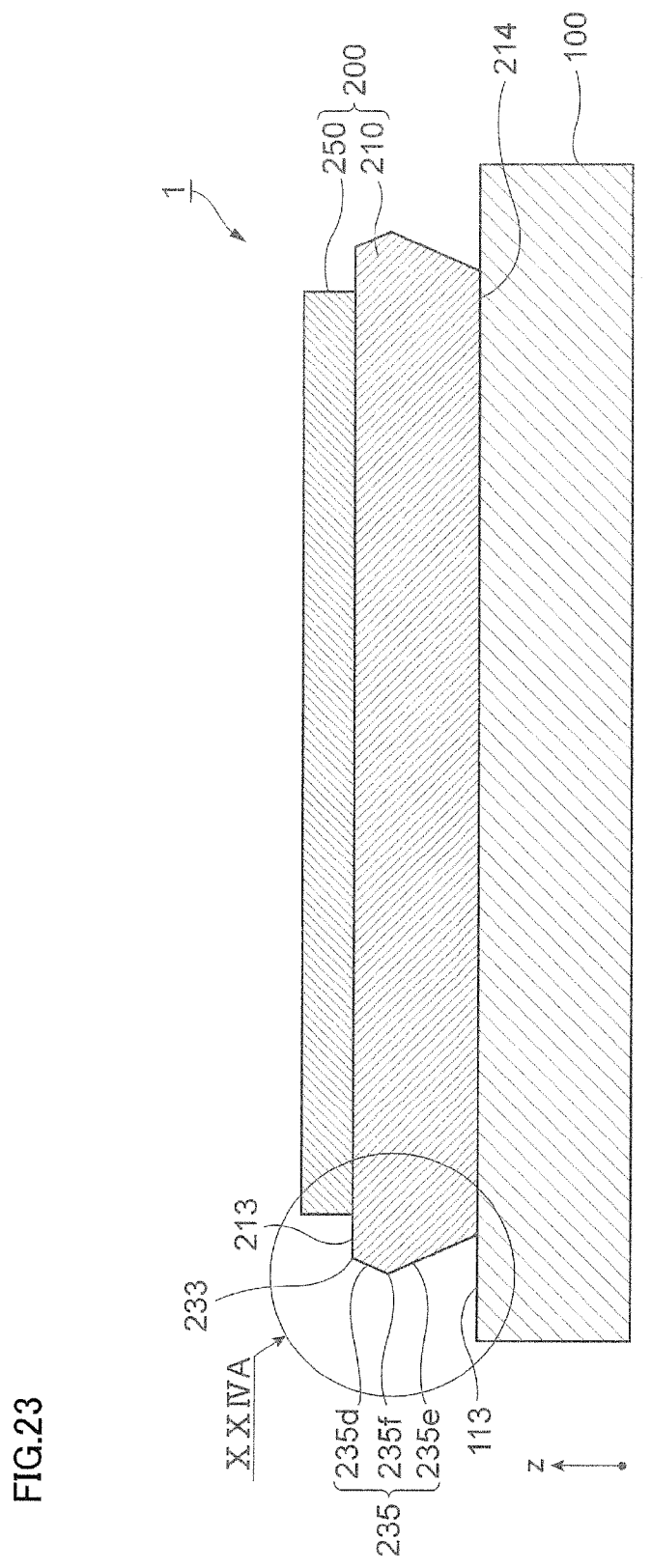
FIG. 23 is another example of the vertical cross-sectional view of the semiconductor light emitting element to which the second exemplary embodiment is applied.
Figure 24A:
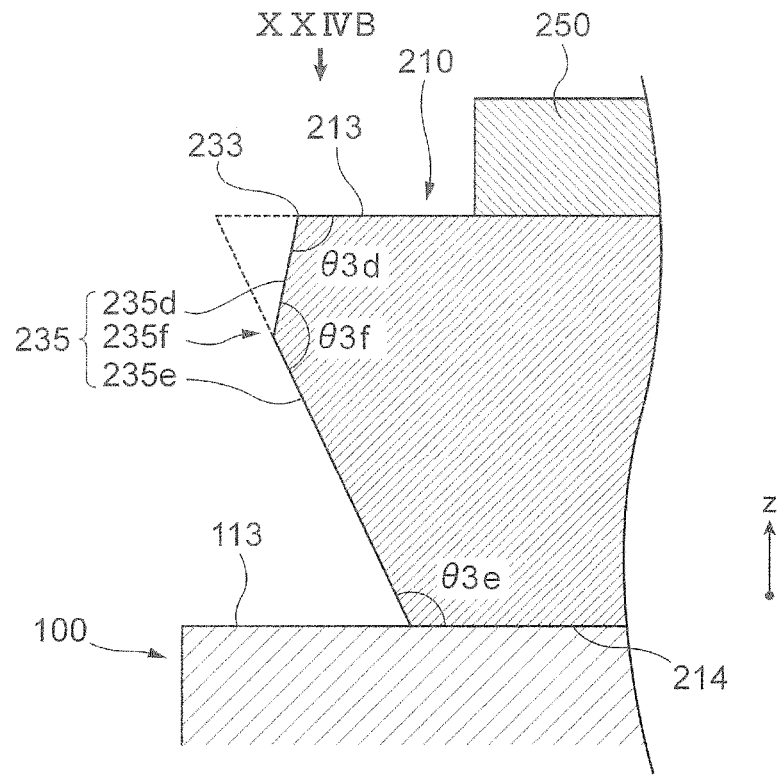
FIGS. 24A and 24B are diagrams for illustrating a structure in the vicinity of a connecting portion and a connecting side surface of a lower semiconductor layer to which the second exemplary embodiment is applied.
Figure 24B:
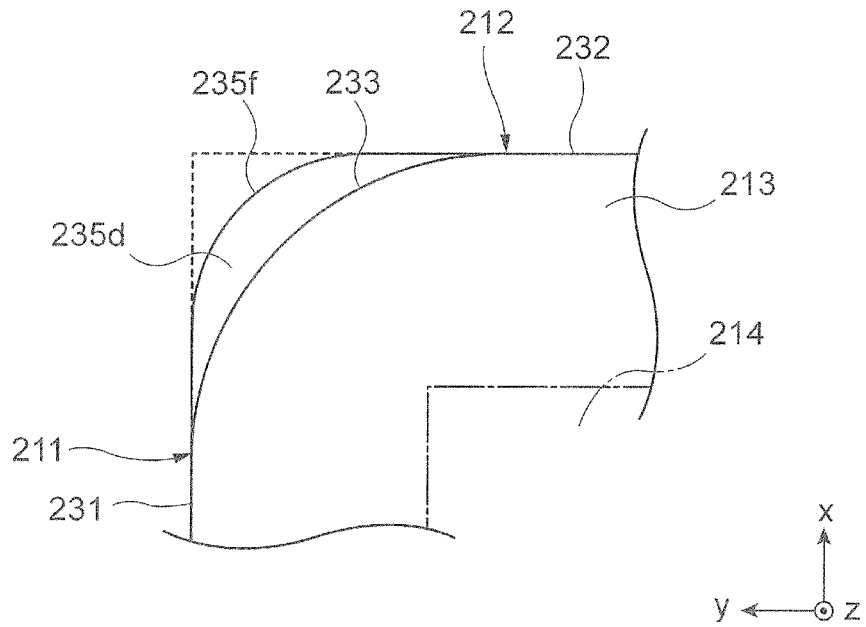

Subsequently, description will be given of a structure of the connecting portion 233 and the connecting side surface 235 in the lower semiconductor layer 210. FIG. 23 is a XXIII-XXIII cross sectional view in FIG. 20, which is a vertical cross-sectional view of the semiconductor light emitting element 1 that is cut to pass through the connecting portion 233 and the connecting side surface 235. FIGS. 24A and 24B are diagrams for illustrating the structure in the vicinity of the connecting portion 233 and the connecting side surface 235 of the lower semiconductor layer 210 to which the exemplary embodiment is applied, and FIG. 24A is an enlarged view of a XXIVA portion in FIG. 23, and FIG. 24B is a diagram showing the lower semiconductor layer 210 in FIG. 24A as viewed from the XXIVB direction.

It should be noted that, in FIG. 24B, illustration of the substrate 100 and the upper semiconductor layer 250 is omitted.

The connecting side surface 235 of the lower semiconductor layer 210 includes, as shown in FIG. 23 and FIG. 24A, a normal inclined surface 235d that extends from the connecting portion 233 toward the substrate 100 with inclination outwardly of the lower semiconductor layer 210; and a reverse inclined surface 235e that extends from a lower end of the normal inclined surface 235d toward the substrate top surface 113 with inclination inwardly of the lower semiconductor layer 210.

In other words, the connecting side surface 235 includes the reverse inclined surface 235e that rises from the substrate top surface 113 upwardly and outwardly of the lower semiconductor layer 210 and the normal inclined surface 235d that rises from an upper end of the reverse inclined surface 235e upwardly and inwardly of the lower semiconductor layer 210. It should be noted that, in the exemplary embodiment, the reverse inclined surface 235e corresponds to an outward inclined surface and the normal inclined surface 235d corresponds to an inward inclined surface.

In the connecting side surface 235, as shown in FIG. 24A, a boundary portion 235f, which is a boundary between the normal inclined surface 235d and the reverse inclined surface 235e, and projects outwardly of the lower semiconductor layer 210, is formed.

It should be noted that, in the semiconductor light emitting element 1 of the exemplary embodiment, in the vicinity of the connecting portion 233 in the lower semiconductor layer 210, part of the masks 155 (refer to FIGS. 27A to 27D, which will be described later), which are laminated on the lower semiconductor layer 210 in the method of manufacturing the semiconductor light emitting element 1 to be described later, is left and adhered in some cases.

As shown in FIG. 19, the normal inclined surface 235d connects the first perpendicular surface 211a in the first lower semiconductor side surface 211 and the second perpendicular surface 212a in the second lower semiconductor side surface 212. Similarly, the reverse inclined surface 235e connects the first inclined surface 211b in the first lower semiconductor side surface 211 and the second inclined surface 212b in the second lower semiconductor side surface 212.

Here, as shown in FIG. 24A, if an angle formed between the lower semiconductor top surface 213 and the normal inclined surface 235d of the connecting side surface 235 is assumed to be θ3d, in the exemplary embodiment, θ3d is an obtuse angle (θ3d>90°).

Moreover, if an angle formed between the lower semiconductor bottom surface 214 and the reverse inclined surface 235e of the connecting side surface 235 is assumed to be θ3e, θ3e is an obtuse angle (θ3e>90°).

Further, if an angle formed between the normal inclined surface 235d and the reverse inclined surface 235e in the connecting side surface 235 is assumed to be θ3f, θ3f is an obtuse angle (θ3f>90°).

Moreover, as described above, the connecting portion 233 of the lower semiconductor top surface 213 has a shape of an arc in the case where the lower semiconductor top surface 213 is viewed from the third direction z. Further, the boundary portion 235f of the connecting side surface 235 has a shape of an arc when viewed from the third direction z.

Then, as shown in FIG. 24B, in the case where the connecting portion 233 and the boundary portion 235f are viewed from the third direction z, the connecting portion 233 and the boundary portion 235f are positioned inside of a point of intersection of an extended line of the first linear portion 231 and an extended line of the second linear portion 232. Accordingly, in the case of being viewed along the third direction z, the connecting portion 233 and the boundary portion 235f are positioned inside of a rectangle enclosed by the first linear portion 231, the extended line of the first linear portion 231, the second linear portion 232 and the extended line of the second linear portion 232 (also refer to FIG. 20).

Moreover, as described above, the normal inclined surface 253d is provided to be inclined outwardly of the lower semiconductor layer 210 from the connecting portion 233. On the other hand, the reverse inclined surface 253e is provided to be inclined inwardly of the lower semiconductor layer 210 from the lower end of the normal inclined surface 235d.

Accordingly, in the case where the connecting side surface 235 is viewed from the third direction z, as shown in FIG. 24B, the connecting portion 233 is positioned inside of the boundary portion 235f. Then, in the case where the connecting side surface 235 is viewed from the third direction z, only the normal inclined surface 235d and the boundary portion 235f in the connecting side surface 235 can be observed, whereas the reverse inclined surface 235e cannot be observed.

Here, as described in the first exemplary embodiment, conventionally, in the semiconductor light emitting element 1 having a structure in which the first lower semiconductor side surface 211 and the second lower semiconductor side surface 212 of the lower semiconductor layer 210 are inclined to a direction that is perpendicular to the substrate top surface 113, there was a tendency that lower semiconductor layer 210 was easily broken on impact.

In contrast thereto, in the semiconductor light emitting element 1 in the exemplary embodiment, the connecting portion 233 is formed between the first linear portion 231 and the second linear portion 232 in the top surface edge 230 of the lower semiconductor top surface 213 (refer to FIG. 20). Further, in the semiconductor light emitting element 1 in the exemplary embodiment, the connecting side surface 235 including the normal inclined surface 235d, the reverse inclined surface 235e and the boundary portion 235f is formed between the first lower semiconductor side surface 211 and the second lower semiconductor side surface 212. Then, when viewed from the third direction z, the connecting portion 233 and the boundary portion 235f are positioned inside of a point of intersection of the extended line of the first linear portion 231 and the extended line of the second linear portion 232.

In other words, in the semiconductor light emitting element 1 of the exemplary embodiment, the lower semiconductor top surface 213, the first lower semiconductor side surface 211 and the second lower semiconductor side surface 212 do not cross directly one another in the lower semiconductor layer 210; and accordingly, the pointed end portion as in the conventional semiconductor light emitting element 1 is not formed. In the semiconductor light emitting element 1 of the exemplary embodiment, in comparison with the conventional semiconductor light emitting element 1, the amount of projection of the lower semiconductor layer 210 is small in the boundary portion among the lower semiconductor top surface 213, the first lower semiconductor side surface 211 and the second lower semiconductor side surface 212.

Consequently, in the semiconductor light emitting element 1 of the exemplary embodiment, it is possible to suppress collision of the lower semiconductor layer 210 with other semiconductor light emitting elements 1 or other members. Then, in the semiconductor light emitting element 1 of the exemplary embodiment, by suppressing collision of the lower semiconductor layer 210 with other members or the like, it becomes possible to suppress occurrence of chipping or cracking in the laminated semiconductor layer 200 (the lower semiconductor layer 210), compared to the case where the present configuration is not employed.

Then, in the semiconductor light emitting element 1 of the exemplary embodiment, since θ3d formed between the lower semiconductor top surface 213 and the normal inclined surface 235$d$ and θ3f formed between the normal inclined surface 235$d$ and the reverse inclined surface 235$e$ are obtuse angles, in the case where the lower semiconductor layer 210 is viewed from the direction perpendicular to the lower semiconductor top surface 213 (the third direction z), the connecting portion 233 is positioned inside the boundary portion 235$f$ in the connecting side surface 235 within the lower semiconductor layer 210.

Consequently, in the semiconductor light emitting element 1 of the exemplary embodiment, in comparison with the case where the connecting portion 233 is positioned outside of the boundary portion 235$f$ within the lower semiconductor layer 210, it is possible to suppress collision of the connecting portion 233 with other members or the like more effectively. As a result, compared to the case where the present configuration is not employed, it becomes possible to suppress occurrence of chipping or cracking in the laminated semiconductor layer 200 (the lower semiconductor layer 210) more effectively.

Further, in the semiconductor light emitting element 1 of the exemplary embodiment, the connecting portion 233 and the boundary portion 235$f$ in the lower semiconductor layer 210 have a shape of an arc when viewed from the third direction z. In other words, the connecting portion 233 and the boundary portion 235$f$ have a shape in which a force is apt to be dispersed in comparison with the case of having a pointed shape.

Consequently, in the exemplary embodiment, in a case where, for example, a force is applied to the vicinity of the connecting portion 233 or the boundary portion 235$f$ from the outside, it is possible to suppress concentration of the force to the connecting portion 233 or the boundary portion 235$f$, compared to a case where the present configuration is not employed. As a result, in the semiconductor light emitting element 1 of the exemplary embodiment, even in a case where other semiconductor light emitting elements 1 or other members or the like collide with the connecting portion 233 or the boundary portion 235$f$ in the lower semiconductor layer 210, it becomes possible to suppress occurrence of cracking or chipping in the laminated semiconductor layer 200 (the lower semiconductor layer 210), compared to a case where the present configuration is not employed.

Still further, in the semiconductor light emitting element 1 of the exemplary embodiment, as described above, the first lower semiconductor side surface 211 includes the first perpendicular surface 211$a$ and the first inclined surface 211$b$, and the second lower semiconductor side surface 212 includes the second perpendicular surface 212$a$ and the second inclined surface 212$b$.

Consequently, in the semiconductor light emitting element 1 of the exemplary embodiment, for example, in comparison with a case where the first lower semiconductor side surface 211 does not include the first perpendicular surface 211$a$ and thereby the first inclined surface 211$b$ and the lower semiconductor top surface 213 are directly connected, and the second lower semiconductor side surface 212 does not include the second perpendicular surface 212$a$ and thereby the second inclined surface 212$b$ and the lower semiconductor top surface 213 are directly connected, the thickness of the lower semiconductor layer 210 in the first linear portion 231 and the second linear portion 232 is increased.

As a result, in the semiconductor light emitting element 1 of the exemplary embodiment, compared to the case where the present configuration is not employed, it becomes possible to increase strength of the lower semiconductor layer 210 in the vicinity of the first linear portion 231 and the second linear portion 232, to thereby make it possible to suppress occurrence of cracking or chipping in the lower semiconductor layer 210.

It should be noted that, in the exemplary embodiment, the shape of the connecting portion 233 in the case of being viewed from the third direction z was an arc shape; however, the shape of the connecting portion 233 is not limited thereto. As described above, as long as the connecting portion 233 is positioned inside the point of intersection of the extended line of the first linear portion 231 and the extended line of the second linear portion 232, the shape of the connecting portion 233 as viewed from the third direction z may be, for example, a straight line shape, a curved line shape, a polygonal line shape or the like and a combination thereof.

Similarly, the shape of the boundary portion 235$f$ as viewed from the third direction z is not limited to the arc shape, and the shape may be, for example, a straight line shape, a curved line shape, a polygonal line shape or the like and a combination thereof.

Moreover, it is unnecessary for the above-described first linear portion 231, second linear portion 232 or the like to strictly form a perfect straight line shape; however, it is sufficient to have a form that is substantially approximate to a straight line as a whole.

Moreover, in the exemplary embodiment, description was given of an example in which the semiconductor light emitting element 1 had a shape of substantially a rectangular parallelepiped, and a shape of the semiconductor light emitting element 1 as viewed from the side on which the p-electrode 350 and the n-electrode 400 were formed was substantially a rectangle; however, the shape of the semiconductor light emitting element 1 is not limited thereto.

For example, as long as the lower semiconductor layer 210 includes the connecting portion 233 and the connecting side surface 235 as described above, the shape of the semiconductor light emitting element 1 as viewed from the side on which the p-electrode 350 and the n-electrode 400 were formed may be a shape that is approximate to a square or a parallelogram, or may be a shape that is approximate to a polygon other than a quadrangle (a triangle or a hexagon).
(Method of Manufacturing Semiconductor Light Emitting Element)

Figure 25:
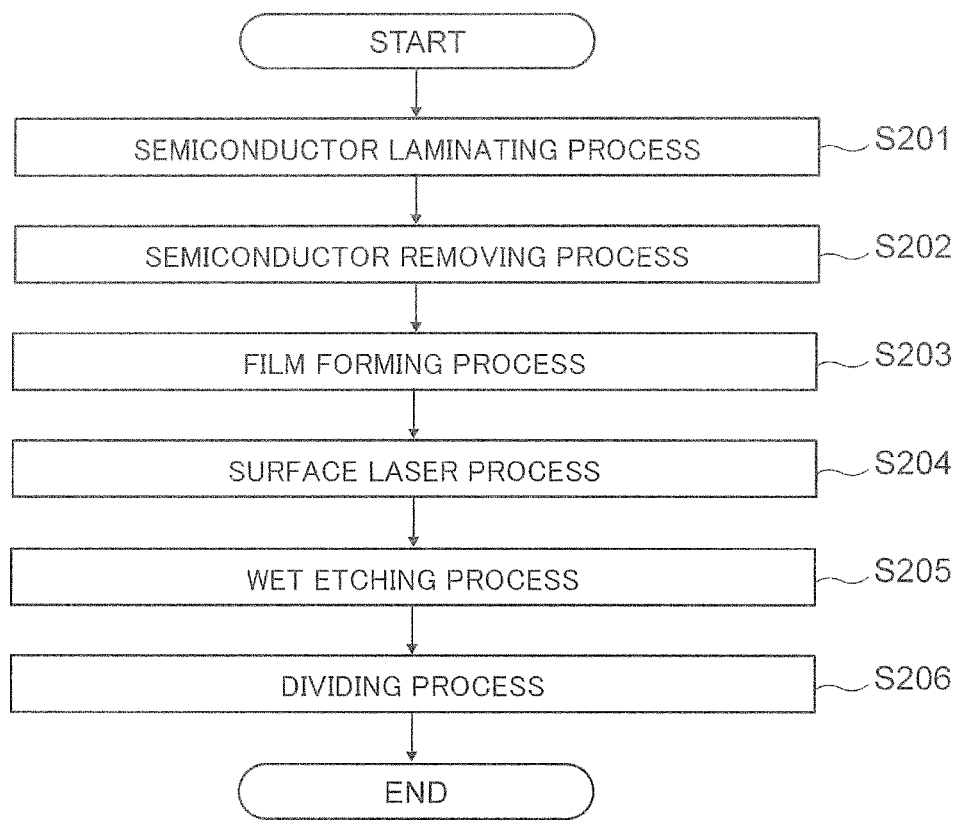
FIG. 25 is a flowchart showing an example of a method of manufacturing a semiconductor light emitting element to which the second exemplary embodiment is applied.

Subsequently, description will be given of a method of manufacturing the semiconductor light emitting element 1 of the exemplary embodiment. It should be noted that, in the method of manufacturing the semiconductor light emitting element 1, plural semiconductor light emitting elements 1 are obtained by laminating the laminated semiconductor layer 200 on the wafer-shaped substrate 100, forming plural p-electrodes 350 and plural n-electrodes 400 on the laminated semiconductor layer 200 and dividing thereof into plural portions. FIG. 25 is a flowchart showing an example of the method of manufacturing the semiconductor light emitting element 1 to which the exemplary embodiment is applied.

In this example, first, a semiconductor laminating process, in which the laminated semiconductor layer 200 is formed on the wafer-shaped substrate 100 to form a wafer-shaped semiconductor lamination substrate 20 (refer to FIGS. 26A and 26B, which will be described later), is carried out (step 201).

Next, a semiconductor removing process, in which, by removing part of the laminated semiconductor layer 200, plural first groove portions 171 and the plural second groove portions 172 (both refer to FIGS. 26A and 26B, which will be described later) are formed on the semiconductor lamination substrate 20 formed in step 201, and plural p-electrodes 350 and the plural n-electrodes 400 are formed on the laminated semiconductor layer 200, is carried out (step 202).

Subsequently, a film forming process, in which protecting films 151 (refer to FIGS. 27A to 27D, which will be described later) are formed on the top surface of the laminated semiconductor layer 200 enclosed by the first groove portions 171 and the second groove portions 172 in the semiconductor lamination substrate 20, in which the plural first groove portions 171 and the second groove portions 172 have been formed in step 202, and masks 155 are formed at intersecting portions 73 (refer to FIGS. 26A and 26B, and FIGS. 27A to 27D) where the first groove portion 171 and the second groove portion 172 intersect each other, is carried out (step 203).

Next, a surface laser process, in which a first irradiation line 81 and a second irradiation line 82 (both refer to FIGS. 28A to 28D, which will be described later) are formed by irradiating the semiconductor lamination substrate 20, on which the protecting films 151 and the masks 155 have been formed in step 203, from the front surface side of the semiconductor lamination substrate 20, on which the protecting films 151 and the masks 155 are formed, with laser light along the first direction x and the second direction y, is carried out (step 204).

Subsequently, a wet etching process, in which wet etching is performed on the semiconductor lamination substrate 20, on which the first irradiation line 81 and the second irradiation line 82 have been formed in step 204, is carried out (step 205).

Next, a dividing process, in which plural semiconductor light emitting elements 1 formed into individual pieces (refer to FIG. 19) are obtained by dividing the semiconductor lamination substrate 20, which has been subjected to the wet etching in step 205, along the first irradiation line 81 and the second irradiation line 82, is carried out (step 206).

It should be noted that, in the exemplary embodiment, the film forming process in step 203 corresponds to a covering portion forming process and an altered region forming process, and the surface laser process in step 204 corresponds to a dividing groove forming process.

Subsequently, the above-described processes of the respective steps will be described in order.
(Semiconductor Laminating Process)

The semiconductor laminating process in step 201 corresponds to the semiconductor laminating process in step 101 described in the first mode of the first exemplary embodiment.

In other words, in the semiconductor laminating process in step 201, first, for example, the wafer-shaped substrate 100 (refer to FIG. 19) composed of a sapphire single crystal, in which C-plane is a principal plane, is prepared, and a surface treatment is applied. As the surface treatment, plural concave portions 113a (refer to FIG. 21) are formed on the substrate top surface 113 (refer to FIG. 19) in the wafer-shaped substrate 100 by use of, for example, the wet etching, the dry etching, the sputtering method or the like.

Next, the intermediate layer 201 (refer to FIG. 21) composed of AlN is formed on the wafer-shaped substrate 100, which has been subjected to the surface treatment, by the sputtering method or the like. It should be noted that the intermediate layer 201 is formed not only by the sputtering method, but also by an MOCVD method.

Subsequently, on the wafer-shaped substrate 100 on which the intermediate layer 201 has been formed, the base layer 202, the n-type semiconductor layer 203 (the n-contact layer 203a and the n-cladding layer 203b), the light emitting layer 204, the p-type semiconductor layer 205 (the p-cladding layer 205a and the p-contact layer 205b) and the transparent conductive layer 300, which are composed of the group III nitride, are sequentially laminated to form the semiconductor lamination substrate 20 (refer to FIGS. 26A and 26B, which will be described later), in which the laminated semiconductor layer 200 is laminated on the wafer-shaped substrate 100 (refer to FIG. 21).
(Semiconductor Removing Process)

Subsequently, the semiconductor removing process in step 202 will be described.

Figure 26A:
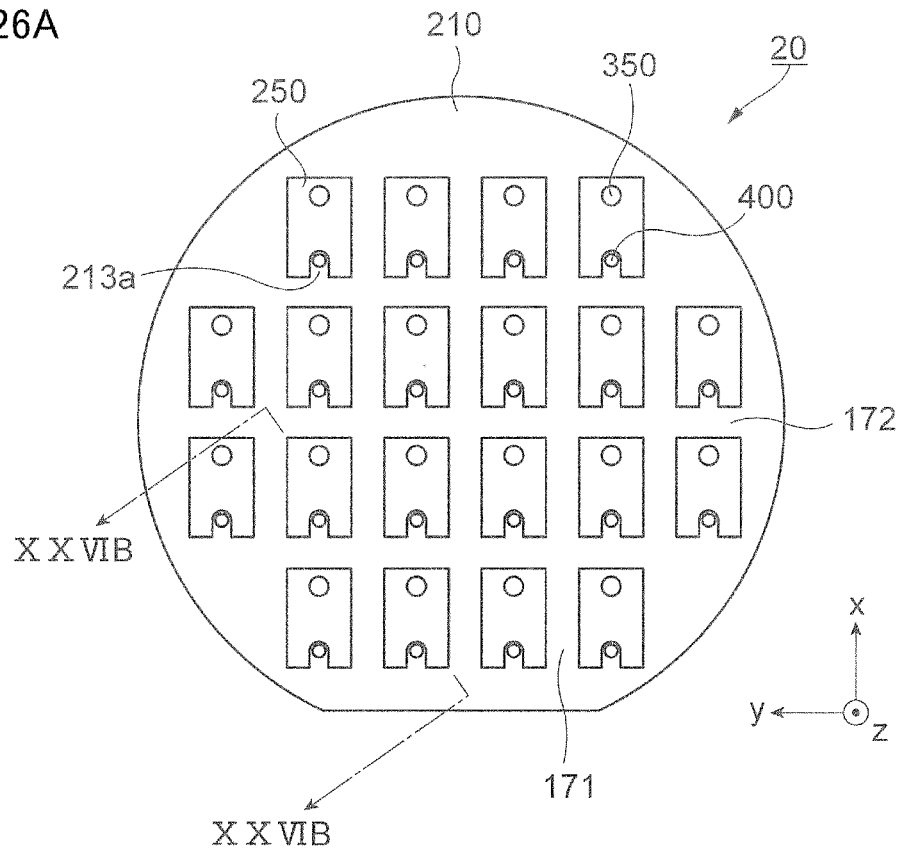
FIGS. 26A and 26B are diagrams showing a semiconductor lamination substrate, in which first groove portions, second groove portions, p-electrodes and n-electrodes are formed, obtained by executing a semiconductor removing process.
Figure 26B:
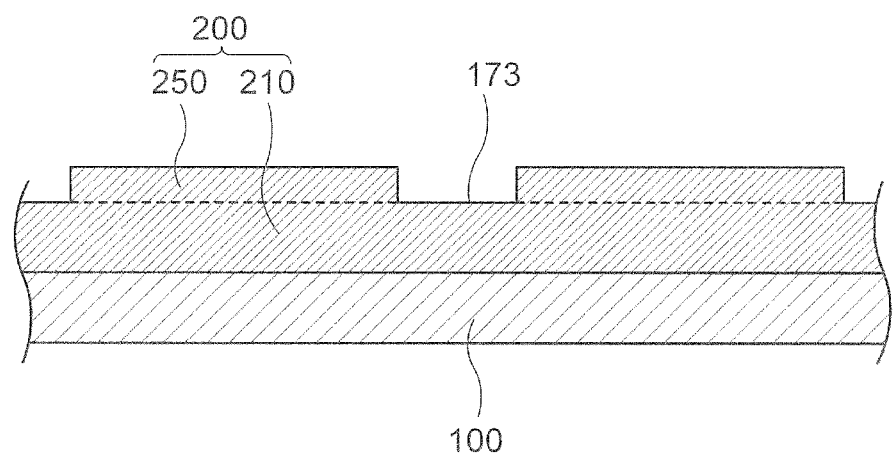

FIGS. 26A and 26B are diagrams showing the semiconductor lamination substrate 20, in which the first groove portions 71, the second groove portions 72, the p-electrodes 350 and the n-electrodes 400 have been formed, obtained by executing the semiconductor removing process in step 202. FIG. 26A is a top view of the semiconductor lamination substrate 20, after the first groove portions 71, the second groove portions 72, the p-electrodes 350 and the n-electrodes 400 are formed, as viewed from the side where the p-electrodes 350 and the n-electrodes 400 are formed, and FIG. 26B is a XXVIB-XXVIB cross-sectional view of FIG. 26A.

In the semiconductor removing process in step 202, first, part of the laminated semiconductor layer 200 in the semiconductor laminated substrate 20, which has been obtained by the semiconductor laminating process in step 201, is locally removed from the opposite side of the substrate 100, to thereby expose part of the c-contact layer 203a (refer to FIG. 21). Consequently, the first groove portions 171, the second groove portions 172 and the semiconductor exposure surfaces 213a are formed.

In the exemplary embodiment, the first groove portion 171 and the second groove portion 172 correspond to a groove portion.

As shown in FIG. 26A, the plural first groove portions 171 are formed, each of which is provided along the first direction x. The plural first groove portions 171 are arranged substantially in parallel with one another so as to cause the intervals between the adjacent first groove portions 171 to be equal with one another. Similarly, the plural second groove portions 172 are formed, each of which is provided along the second direction y. The plural second groove portions 172 are arranged substantially in parallel with one another so as to cause the intervals between the adjacent second groove portions 172 to be equal with one another.

Still further, as shown in FIG. 26A, the plural semiconductor exposure surfaces 213a are formed. In this example, the plural semiconductor exposure surfaces 213a are arranged in line along the second direction y, each of which is provided to be connected to the second groove portion 172.

As shown in FIGS. 26A and 26B, by forming the plural first groove portions 171 and the plural second groove portions 172, in the laminated semiconductor layer 200, the lower semiconductor layer 210, which is provided over an entire region of the substrate top surface 113, and the upper semiconductor layer 250, which is provided on the lower semiconductor layer 210 and divided into plural regions by the plural first groove portions 171 and the plural second groove portions 172, are formed.

Here, in the exemplary embodiment, the interval between the adjacent first groove portions 171 is smaller than the interval between the adjacent second groove portions 172. Consequently, as shown in FIG. 26A, the shape of the upper semiconductor layer 250 divided into plural regions as viewed from the direction perpendicular to the substrate top surface 113 (the third direction z) is a rectangle including a long side along the first direction x and a short side along the second direction y.

In this example, the interval between the adjacent first groove portions 171 is 270 μm, and the interval between the adjacent second groove portions 172 is 700 μm. Moreover, in the exemplary embodiment, the width of each of the first groove portions 171 and each of the second groove portions 172 is 20 μm. In other words, each of the plural divided regions of the upper semiconductor layer 250 is, in the case of being viewed from the third direction z, a rectangle having a short side of 250 μm and a long side of 680 μm.

As a method for removing part of the laminated semiconductor layer 200 to form the first groove portions 171, the second groove portions 172 and the semiconductor exposure surfaces 213a, a known photolithographic method and a known etching method can be used. In particular, as a method for forming the first groove portions 171, the second groove portions 172 and the semiconductor exposure surfaces 213a, the etching method, such as wet etching and dry etching, is preferably used. This is because the etching is hard to cause damage to the portion of the laminated semiconductor layer 200 which is not removed, compared to other methods.

As the etching method, in the case of the dry etching, for example, the method such as reactive ion etching, ion milling, focused beam etching or ECR etching can be used, and in the case of the wet etching, for example, mixed acid of sulfuric acid and phosphoric acid can be used. However, prior to performing etching, predetermined resists or the like are formed on the surface of the laminated semiconductor layer 200 so that a desired chip shape is provided.

It should be noted that, as the method of forming the first groove portions 171 and the second groove portions 172, other than the etching method, any known methods such as a dicing method, a method by laser irradiation and the like can be used without any limitation.

Moreover, in the exemplary embodiment, the semiconductor exposure surfaces 213a were formed at the same time with forming the first groove portions 171 and the second groove portions 172; however, these may be formed by different processes.

In the semiconductor removing process in step 202, the p-electrode 350 is formed on a predetermined position on each of the upper semiconductor layer 250, and the n-electrode 400 is formed on each of the semiconductor exposure surfaces 213a.

As the p-electrode 350 and the n-electrode 400, various types of compositions and structures are known, and these known compositions and structures can be used without any limitation.

Moreover, as the methods of forming the p-electrode 350 and the n-electrode 400, known methods such as a vacuum deposition method and the sputtering method can be employed without any limitation.

(Film Forming Process)

Subsequently, the film forming process in step 203 will be described.

FIGS. 27A to 27D are diagrams showing the semiconductor lamination substrate 20, in which the masks 155 and protecting films 151 have been formed, obtained by executing the film forming process in step 203. FIG. 27A is a top view of part of the semiconductor lamination substrate 20 (refer to FIGS. 26A and 26B), in which the masks 155 and the protecting films 151 have been formed, as viewed from the side where the masks 155 and the protecting films 151 are formed. Moreover, FIG. 27B is a XXVIIB-XXVIIB cross-sectional view of FIG. 27A, FIG. 27C is a XXVIIC-XXVIIC cross-sectional view of FIG. 27A, and FIG. 27D is a XXVIID-XXVIID cross-sectional view of FIG. 27A.

In the film forming process in step 203, on partial regions on the laminated semiconductor layer 200 of the semiconductor lamination substrate 20 obtained in the semiconductor removing process in step 202, the masks 155, as an example of a covering portion, and the protecting films 151, as another example of the covering portion, are formed.

As shown in FIGS. 27A and 27B, the mask 155 is provided at an intersecting portion 173 where the first groove portion 171 and the second groove portion 172 intersect each other.

In the exemplary embodiment, each of the masks 155 has a circular shape as viewed from the third direction z. The diameter of each mask 155 is, for example, 12 μm. It should be noted that the shape and the size of the mask 155 are not limited thereto. The shape and the size of the mask 155 will be described later. Moreover, in this example, the thickness of the mask 155 is 87 μm. The thickness of the mask 155 is, for example, preferably in a range of 2 nm to 5 μm, and more preferably, in a range of 10 nm to 1 μm.

Moreover, as shown in FIGS. 27A to 27D, the protecting films 151 are provided to cover substantially an entire surface of the upper semiconductor layer 250 except for partial regions on the p-electrodes 350 and partial regions on the n-electrodes 400 (opening portions; not shown in the figures). Specifically, as shown in FIGS. 27B to 27D, the protecting film 151 is provided on a top surface (the upper semiconductor top surface 253; refer to FIG. 19) and a side surface (the first upper semiconductor side surface 251 and the second upper semiconductor side surface 252; refer to FIG. 19) in the upper semiconductor layer 250. Moreover, as shown in FIG. 27A, the shape of the protecting film 151 as viewed from the third direction z is a rectangular shape that follows the shape of the upper semiconductor layer 250.

In this example, the interval between the adjacent protecting films 151 is 14 μm.

It should be noted that, in the exemplary embodiment, each of the masks 155 and each of the protecting films 151 are not connected, and provided independent from each other.

The mask 155 is used for adjusting the shape, thickness or the like of the laminated semiconductor layer 200 (the lower semiconductor layer 210) to be removed by the wet etching treatment in the wet etching process in step 205, which will be described later.

Here, by forming the mask 155 on the intersecting portion 173 in the film forming process in step 203, the lower semiconductor layer 210 in the intersection portion 173, on which the mask 155 is formed, is altered. Accordingly, in the intersecting portion 173, an altered region 210a (refer to FIGS. 32A and 32B, which will be described later), in which the lower semiconductor layer 210 is altered, is formed.

As the mask 155, a material capable of altering the lower semiconductor layer 210 and forming the altered region 210a is used. In the exemplary embodiment, $SiO_2$ is used as the mask 155. However, the material for constituting the mask 155 is not limited thereto, and, for example, a metal thin film or the like may be used.

The protecting film 151 is provided to protect the upper semiconductor layer 250.

As the protecting film 151, a material having an insulating property is used. Further, in a case where a semiconductor light emitting element 1 of a so-called face-up type is manufactured as the semiconductor light emitting element 1, it is preferable to use a material having transparency to light outputted from the light emitting layer 204 (refer to FIG. 21) as the protecting film 151. In the exemplary embodiment, similar to the mask 155, $SiO_2$ is used as the protecting film 151.

Since the mask 155 and the protecting film 151 are configured with the same material, the mask 155 and the protecting film 151 can be formed in the same process, and accordingly, it becomes possible to simplify the manufacturing processes of the semiconductor light emitting element 1, compared to the case where the present configuration is not employed.

As the method of forming the mask 155 and the protecting film 151, a conventionally known CVD method, deposition method, sputtering method or the like can be used.

Specifically, after forming $SiO_2$ on an entire surface of the laminated semiconductor layer 200 in the semiconductor lamination substrate 20, a resist pattern is formed on $SiO_2$ by a conventionally known photolithographic method, and $SiO_2$ in the portion not covered with the resist is removed by the conventionally known etching method or the like, to be thereby capable of forming the mask 155 and the protecting film 151.

It should be noted that the method of forming the mask 155 and the protecting film 151 is not limited thereto, and the conventionally known method may be appropriately used.
(Surface Laser Process)

Subsequently, the surface laser process in step 204 will be described.

FIGS. 28A to 28D are diagrams showing the semiconductor lamination substrate 20, in which the first irradiation lines 81 and the second irradiation lines 82 have been formed, obtained by carrying out the surface laser process in step 204. FIG. 28A is a top view of part of the semiconductor lamination substrate 20, after the first irradiation lines 81 and the second irradiation lines 82 are formed, as viewed from the side where the first irradiation lines 81 and the second irradiation lines 82 are formed. FIG. 28B is a XXVIIIB-XXVIIIB cross-sectional view of FIG. 28A, FIG. 28C is a XXVIIIC-XXVIIIC cross-sectional view of FIG. 28A, and FIG. 28D is a XXVIIID-XXVIIID cross-sectional view of FIG. 28A.

In the surface laser process in step 204, the first irradiation lines 81 and the second irradiation lines 82 are formed by irradiating the semiconductor lamination substrate 20 with laser light along the first groove portions 171 and the second groove portions 172 formed in the semiconductor removing process in step 202 from the laminated semiconductor layer 200 side to remove part of the laminated semiconductor layer 200 so as to reach the substrate 100.

In the exemplary embodiment, the first irradiation line 81 and the second irradiation line 82 correspond to a dividing groove.

The first irradiation line 81 is, as shown in FIG. 28A, formed along the first groove portion 171 and the first direction x. Moreover, each of the first irradiation lines 81 is, as shown in FIG. 28D, formed to divide the laminated semiconductor layer 200 (the lower semiconductor layer 210) and reaches the inside of the substrate 100.

Similarly, the second irradiation line 82 is, as shown in FIG. 28A, formed along the second groove portion 172 and the second direction y. Then, each of the second irradiation lines 82 is, as shown in FIG. 28C, formed to divide the laminated semiconductor layer 200 and reaches the inside of the substrate 100.

Accordingly, the lower semiconductor layer 210 is divided into the plural portions, each of which has a rectangular shape in the case of being viewed from the third direction x, by the plural first irradiation lines 81 and the plural second irradiation lines 82.

Moreover, as described above, at the intersecting portion 173 where the first groove portion 171 and the second groove portion 172 intersect each other, the mask 155 is provided, and the first irradiation line 81 and the second irradiation line 82 are provided to intersect each other at the mask 155. Then, as shown in FIGS. 28A and 28B, the mask 155 is divided into plural (in this example, four) regions by the first irradiation line 81 and the second irradiation line 82. Moreover, with this, the altered region 210a (refer to FIGS. 31A and 31B) formed below the mask 155 in the intersecting portion 173 is also divided into plural (in this example, four) regions by the first irradiation line 81 and the second irradiation line 82.

It should be noted that, as shown in FIG. 28A, the plural regions of the divided mask 155 are positioned at respective four corners of each of the plural regions of the divided lower semiconductor layer 210, each showing a rectangular shape.
(Wet Etching Process)

Subsequently, the wet etching process in step 205 will be described.

FIGS. 29A to 29D are diagrams showing the semiconductor lamination substrate 20 obtained by carrying out the wet etching process in step 205. FIG. 29A is a top view of part of the semiconductor lamination substrate 20 (refer to FIGS. 26A and 26B), after the wet etching is finished, as viewed from the side where the protecting film 151 is formed. FIG. 29B is a XXIXB-XXIXB cross-sectional view of FIG. 29A, FIG. 29C is a XXIXC-XXIXC cross-sectional view of FIG. 29A, and FIG. 29D is a XXIXD-XXIXD cross-sectional view of FIG. 29A.

In the wet etching process in step 205, by performing the wet etching on the semiconductor lamination substrate 20, in which the first irradiation lines 81 and the second irradiation lines 82 have been formed in the surface laser process in step 204, the first lower semiconductor side surfaces 211, each of which includes the first perpendicular surface 211a and the first inclined surface 211b, the second lower semiconductor side surfaces 212, each of which includes the second perpendicular surface 212a and the second inclined surface 212b, and the connecting side surfaces 235, each of which includes the normal inclined surface 235d, the reverse inclined surface 235e and the boundary portion 235f, are formed.

The wet etching is carried out by dipping the semiconductor lamination substrate 20, in which the first irradiation lines 81 and the second irradiation lines 82 have been formed, into an etching solution, such as orthophosphoric acid, that is heated to a predetermined temperature.

When the semiconductor lamination substrate 20, in which the first irradiation lines 81 and the second irradiation lines 82 have been formed, is dipped into the etching solution, the etching solution enters into the first irradiation lines 81 and the second irradiation lines 82. In the first irradiation lines 81 and the second irradiation lines 82, the lower semiconductor layer 210 is exposed. Accordingly, the exposed lower semiconductor layer 210 erodes by the etching solution entered into the first irradiation lines 81 and the second irradiation lines 82. On the other hand, the upper semiconductor layer 250 covered with the protecting film 151 does not erode by the etching solution.

Here, in the exemplary embodiment, as described in the first exemplary embodiment, in the lower semiconductor layer 210, there is a difference in a degree of erosion by the etching solution between a side in contact with the upper semiconductor layer 250 (the lower semiconductor top surface 213 side) and the other side in contact with the substrate 100 (the lower semiconductor bottom surface 214 side). Specifically, the lower semiconductor bottom surface 214 side in the lower semiconductor layer 210 easily erodes by the etching solution compared to the lower semiconductor top surface 213 side in the lower semiconductor layer 210.

As a result, in the case where the etching solution enters into the first irradiation lines 81 and the second irradiation lines 82, usually, of the exposed lower semiconductor layer 210, erosion by etching solution proceeds from an interface between the lower semiconductor layer 210 and the substrate 100 (namely, the lower semiconductor bottom surface 214) as a starting point.

Figure 30A:
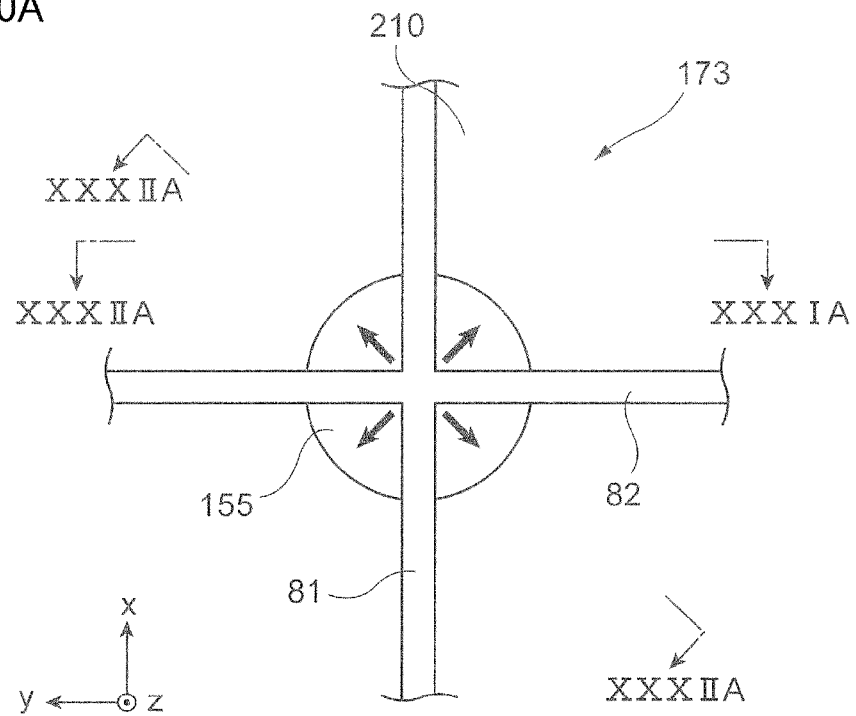
FIGS. 30A and 30B are diagrams for illustrating proceeding of wet etching in the lower semiconductor layer.
Figure 30B:
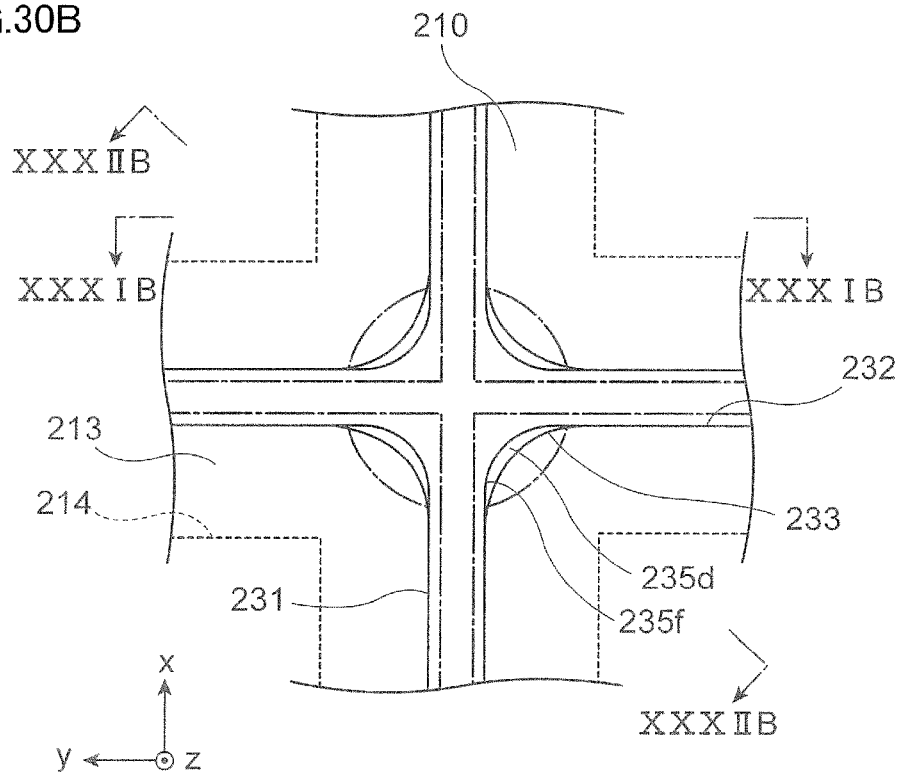

FIGS. 30A and 30B, 31A and 31B, and 32A and 32B are diagrams for illustrating proceeding of the wet etching in the lower semiconductor layer 210. Specifically, FIGS. 30A and 30B are diagrams showing the vicinity of a region of the lower semiconductor layer 210 in the semiconductor lamination substrate 20, where the mask 155 is formed, as viewed from the third direction z, and FIG. 30A shows the lower semiconductor layer 210 before the wet etching treatment is performed, whereas FIG. 30B shows the lower semiconductor layer 210 after the wet etching treatment is performed.

Figure 31A:
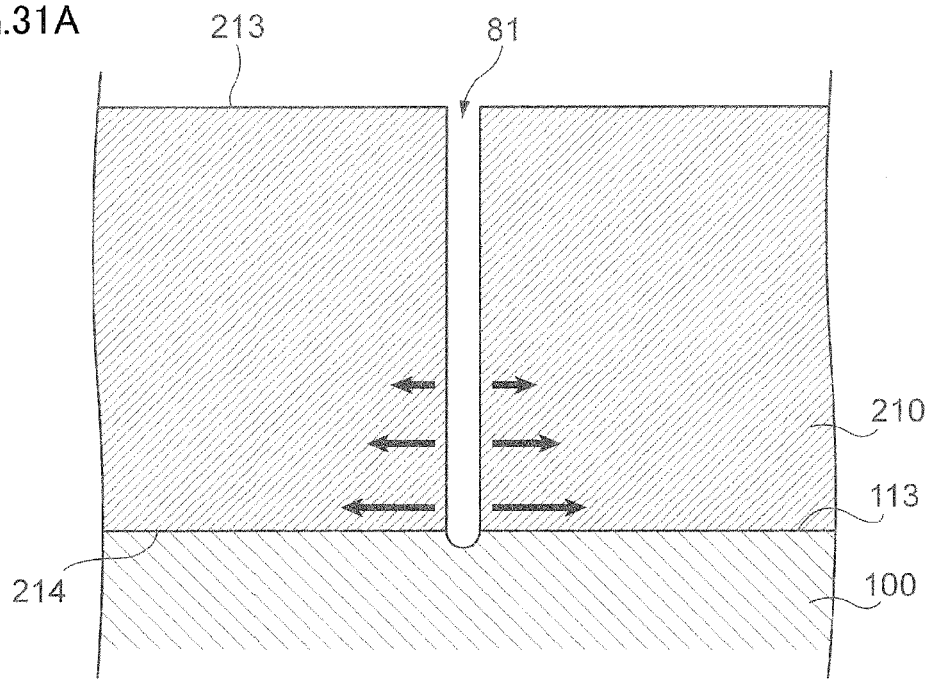
FIGS. 31A and 31B are other diagrams for illustrating the proceeding of the wet etching in the lower semiconductor layer.
Figure 31B:
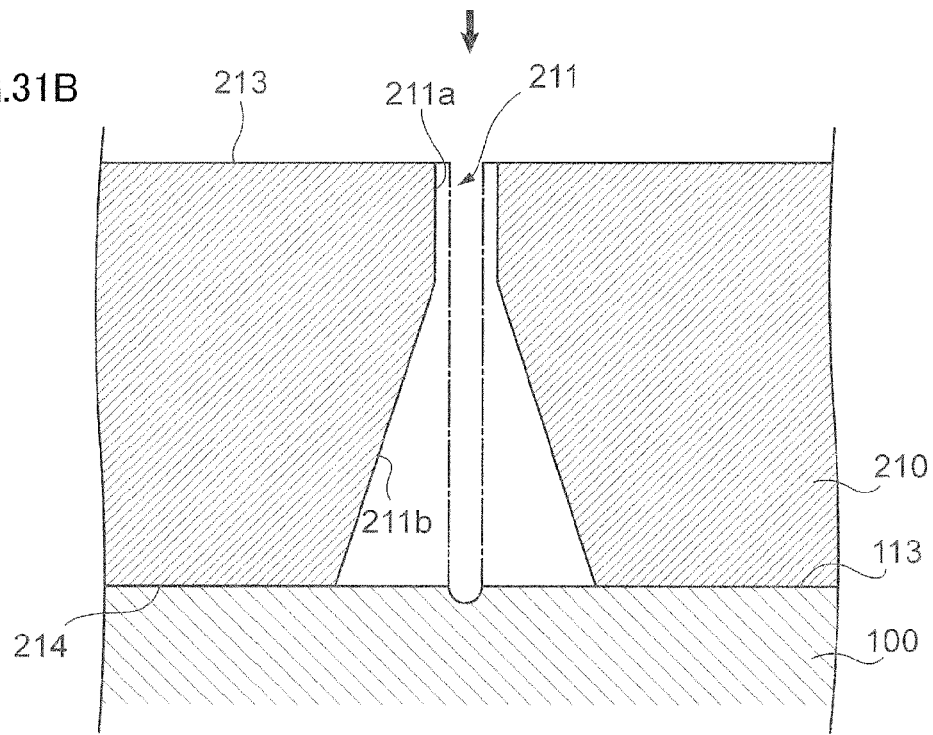

FIG. 31A is a XXXIA-XXXIA cross-sectional view in FIG. 30A, and FIG. 31B is a XXXIB-XXXIB cross-sectional view in FIG. 30B.

Figure 32A:
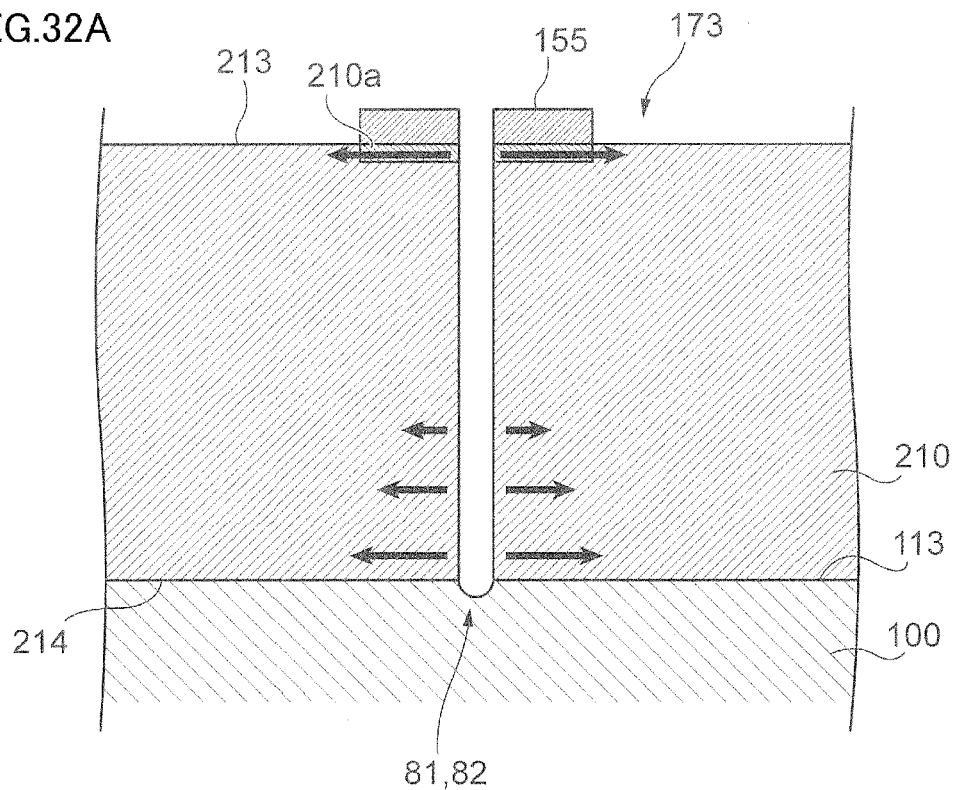
FIGS. 32A and 32B are still other diagrams for illustrating proceeding of the wet etching in the lower semiconductor layer.
Figure 32B:
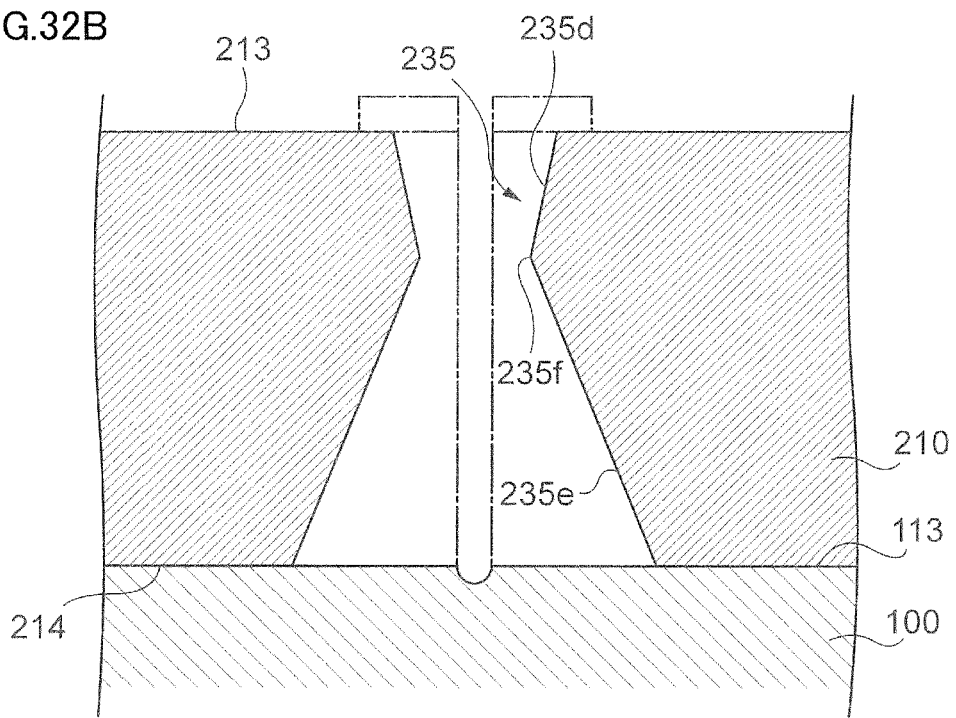

Further, FIG. 32A is a XXXIIA-XXXIIA cross-sectional view in FIG. 30A, and FIG. 32B is a XXXIIB-XXXIIB cross-sectional view in FIG. 30B.

First, description will be given of proceeding of the wet etching in the region of the lower semiconductor layer 210, where the mask 155 is not formed, as viewed from the third direction z.

As described above, the lower semiconductor layer 210 easily erodes by the etching solution in the lower semiconductor bottom surface 214 side, compared to the lower semiconductor top surface 213 side. Accordingly, in the case where the semiconductor lamination substrate 20 is dipped into the etching solution, and the etching solution enters into the first irradiation lines 81, in the lower semiconductor layer 210 exposed in the first irradiation lines 81, the wet etching proceeds from the lower semiconductor bottom surface 214 as a starting point.

Consequently, as shown in FIG. 31A, of the lower semiconductor layer 210, in the regions on the lower semiconductor bottom surface 214 side, the closer to the lower semiconductor bottom surface 214, the larger the amount of the lower semiconductor layer 210 shaved by the wet etching treatment.

As a result, as shown in FIG. 31B, on the lower semiconductor bottom surface 214 side of the lower semiconductor layer 210, the first inclined surface 211b, which extends toward the lower semiconductor bottom surface 214 with inclination inwardly of the lower semiconductor layer 210, is formed.

On the other hand, in the regions on the lower semiconductor top surface 213 side of the lower semiconductor layer 210, as described above, the lower semiconductor layer 210 hardly erodes by the wet etching, compared to the lower semiconductor bottom surface 214 side. Moreover, in the regions on the lower semiconductor top surface 213 side of the lower semiconductor layer 210, since crystallinity is better than in the lower semiconductor bottom surface 214 side, there is a little difference in susceptibility to the wet etching due to deterioration of crystallinity.

As a result, on the lower semiconductor top surface 213 side of the lower semiconductor layer 210, the lower semiconductor layer 210 is substantially shaved uniformly by the wet etching treatment, to thereby form the first perpendicular surface 211a that extends from the upper end of the first inclined surface 211b toward the lower semiconductor top surface 213 along the third direction z, as shown in FIG. 31B.

From above, via the first irradiation lines 81, the first lower semiconductor side surface 211, which includes the first inclined surface 211b on the lower semiconductor bottom surface 214 side and the first perpendicular surface 211a on the lower semiconductor top surface 213 side, is formed.

It should be noted that, FIGS. 31A and 31B show the case where the first lower semiconductor side surface 211 is formed by the wet etching treatment via the first irradiation lines 81; however, the second lower semiconductor side surface 212 is formed by the wet etching treatment in the same way as the first lower semiconductor side surface 211.

Accordingly, similar to the first lower semiconductor side surface 211 shown in FIG. 31B, the etching solution enters into the second irradiation lines 82 by the wet etching treatment and the lower semiconductor layer 210 erodes via the second irradiation lines 82, and thereby the second lower semiconductor side surface 212, which includes the second perpendicular surface 212a on the lower semiconductor top surface 213 side and the second inclined surface 212b on the lower semiconductor bottom surface 214 side, is formed.

Subsequently, description will be given of proceeding of the wet etching in the region of the lower semiconductor layer 210, where the mask 155 is formed, as viewed from the third direction z.

As shown in FIG. 32A, in the region of the lower semiconductor layer 210, where the masks 155 are formed, the altered regions 210a are formed. Here, in the altered region 210a, the lower semiconductor layer 210 easily erodes by the etching solution, compared to the lower semiconductor layer 210 in other regions, since the lower semiconductor layer 210 in the altered region 210a is altered.

Consequently, in the case where the etching solution enters into the first irradiation lines 81 and the second irradiation lines 82 in the wet etching process in step 205, the wet etching proceeds from the lower semiconductor top surface 213, in addition to the lower semiconductor bottom surface 214, on which the altered regions 210a are formed, as the starting point.

In other words, in the regions on the lower semiconductor bottom surface 214 side of the lower semiconductor layer 210, as shown in FIG. 32A, the closer to the lower semiconductor bottom surface 214, the larger the amount of the lower semiconductor layer 210 shaved by the wet etching treatment.

On the other hand, in the regions on the lower semiconductor top surface 213 side of the lower semiconductor layer 210, as shown in FIG. 32A, the closer to the lower semiconductor top surface 213 (the altered region 210a), the larger the amount of the lower semiconductor layer 210 shaved by the wet etching treatment.

Accordingly, on the lower semiconductor bottom surface 214 side of the lower semiconductor layer 210, as shown in FIG. 32B, the reverse inclined surface 235e that extends toward the lower semiconductor bottom surface 214 with inclination inwardly of the lower semiconductor layer 210 is formed.

Moreover, on the lower semiconductor top surface 213 side of the lower semiconductor layer 210, as shown in FIG. 32B, the normal inclined surface 235d that extends from the lower semiconductor top surface 213 toward the upper end of the reverse inclined surface 235e with inclination outwardly of the lower semiconductor layer 210, and the boundary portion 235f that is a boundary between the normal inclined surface 235d and the reverse inclined surface 235e are formed.

Here, when the region of the lower semiconductor layer 210 where the mask 155 is formed is viewed from the third direction z, as shown in FIG. 30A, on the lower semiconductor top surface 213, the wet etching proceeds inwardly of the lower semiconductor layer 210 from the corner portion of the lower semiconductor layer 210, where the mask 155 (the altered region 210a; refer to FIG. 32A) is formed, as the starting point.

Then, in the region where the mask 155 I formed, as shown in FIG. 30B, the lower semiconductor layer 210 is shaved to be an arc shape. As a result, the normal inclined surface 235d and the boundary portion 235f has a shape curved to be an arc as viewed from the third direction z, and, at the boundary between the lower semiconductor top surface 213 and the normal inclined surface 235d, the connecting portion 233 having an arc shape (refer to FIG. 12) is formed.

As described above, in the wet etching process in step 205, by performing the wet etching treatment on the semiconductor lamination substrate 20, the first lower semiconductor side surface 211 including the first perpendicular surface 211a and the first inclined surface 211b, the second lower semiconductor side surface 212 including the second perpendicular surface 212a and the second inclined surface 212b, and the connecting side surface 235 including the normal inclined surface 235d, the reverse inclined surface 235e and the boundary portion 235f are formed, and also the connecting portion 233, which is a boundary between the lower semiconductor top surface 213 and the connecting side surface 235, is formed.

(Dividing Process)

In the dividing process in step 206, the semiconductor lamination substrate 20, in which the first lower semiconductor side surface 211, the second lower semiconductor side surface 212 and the connecting side surface 235 have been formed in the lower semiconductor layer 210 by the wet etching process in step 205, is cut and divided into the plural semiconductor light emitting elements 1.

It should be noted that, before dividing the semiconductor lamination substrate 20 into the plural semiconductor light emitting elements 1, a process of grinding and polishing the substrate bottom surface 114 (refer to FIG. 21) of the substrate 100 may be provided so as to cause the substrate 100 in the semiconductor lamination substrate 20 to have a predetermined thickness.

The thickness of the substrate 100 after grinding and polishing is in a range of 60 µm to 300 µm, preferably in a range of 80 µm to 250 µm, and more preferably in a range of 100 µm to 200 µm. By providing the thickness of the substrate 100 within the above ranges, the semiconductor lamination substrate 20 can be efficiently divided in the dividing process in step 206.

In the dividing process in step 206, first, laser irradiation is applied to the inside of the substrate 100 along the first irradiation lines 81 and the second irradiation lines 82 from the substrate bottom surface 114 (refer to FIG. 21) side of the wafer-shaped substrate 100 in the semiconductor lamination substrate 20. Accordingly, inside the substrate 100, plural modified regions, in which sapphire single crystal is modified along the first irradiation lines 81 and the second irradiation lines 82, are formed.

Subsequently, by pressing a blade from the substrate bottom surface 114 side of the wafer-shaped substrate 100 along the modified regions formed along the first irradiation lines 81 and the second irradiation lines 82, cracks starting on the modified regions are caused, to thereby divide the wafer-shaped substrate 100 into plural substrates 100. At this time, on each of the divided substrates 100, there exist the lower semiconductor layer 210, the upper semiconductor layer 250, the p-electrode 350 and the n-electrode 400.

By the division, the first substrate side surfaces 111 and the second substrate side surfaces 112 (both refer to FIG. 19) in the substrate 100 are formed.

Then, through the above processes, the semiconductor light emitting element 1 shown in FIG. 19 can be obtained.

Here, conventionally, when the semiconductor lamination substrate 20 is divided into the plural semiconductor light emitting elements 1, there are some cases where vibration or the like occurs to the semiconductor lamination substrate 20, and also there are some cases where the lower semiconductor layers 210 in the semiconductor lamination substrate 20 collide with each other, and thereby chipping or the like occurs in the lower semiconductor layer 210.

In the semiconductor lamination substrate 20 in the exemplary embodiment, as described above, the connecting side surface 235 is formed at a portion that connects the first lower semiconductor side surface 211 and the second lower semiconductor side surface 212 in the lower semiconductor layer 210, which has been divided into the plural regions by the surface laser process in step 204 and the wet etching process in step 205, and therefore, the projection amount of the lower semiconductor layer 210 is small.

Accordingly, compared to the case where the present configuration is not provided, in the dividing process in step 206, the lower semiconductor layers 210 hardly collide with each other, and moreover, even in the case where the lower semiconductor layers 210 collide with each other, it is possible to suppress occurrence of cracking or chipping in the lower semiconductor layer 210, compared to the case where the corners of the lower semiconductor layer 210 have pointed shapes, as in the conventional way.

It should be noted that, in the manufacturing process of the semiconductor light emitting element 1 in the exemplary embodiment, the shape of the mask 155 formed in the intersecting portion 173 in the film forming process in step 203 was a circular shape; however, the shape of the mask 155 is not limited thereto.

FIGS. 33A to 33F are diagrams showing other shapes of the mask 155 formed in the film forming process in step 203 in the manufacturing process of the semiconductor light emitting element 1 in the exemplary embodiment, in which the mask 155 is viewed from the third direction z. It should be noted that the shapes of the masks 155 shown in FIGS. 33 A to 33F are merely examples, and the shape of the mask 155 is not limited thereto.

The shape of the mask 155 as viewed from the third direction z may be, as shown in FIG. 33A, a quadrangle (a square) in which each side extends along the first direction x or the second direction y.

Moreover, the shape of the mask 155 as viewed from the third direction z may be, as shown in FIG. 33B, a quadrangle (a square) in which each diagonal line extends along the first direction x or the second direction y.

Further, the shape of the mask 155 as viewed from the third direction z may be, as shown in FIGS. 33C and 33D, a cross shape extending along the first direction x and the second direction y.

Still more, in a case where the mask 155 is configured with the same material as the protecting film 151, as shown in FIGS. 33E and 33F, the mask 155 may be formed in connection with the protecting film 151.

However, the shape of the mask 155 as viewed from the third direction z is preferably a circular shape, a square in which each side extends along the first direction x or the second direction y, or a square in which each diagonal line extends along the first direction x or the second direction y, and more preferably, a circular shape or a square in which each side extends along the first direction x or the second direction y by the following reason.

That is, if the mask 155 is in the above-described shape, for example, even in a case where the position to form the first irradiation line 81 or the second irradiation line 82 is deviated from an expected predetermined position in the surface laser process in step 204, the first irradiation line 81 and the second irradiation line 82 are apt to cross each other on the mask 155.

Here, for example, in a case where the first irradiation line 81 and the second irradiation line 82 do not cross each other on the mask 155 in the surface laser process in step 204, in the lower semiconductor layer 210 divided into the plural regions by the first irradiation line 81 and the second irradiation line 82, there formed some regions in which the mask 155 is not placed. Then, in the regions of the lower semiconductor layer 210, in which the mask 155 is not placed, since the altered region 210a altered by the mask 155 is not formed, there is a possibility that the normal inclined surface 235d in the connecting side surface 235 is not formed in the wet etching process in step 205.

Accordingly, it is preferable to form the mask 155 in the above-described shape.

It should be noted that, in the case where the mask 155 is in a circular shape (refer to FIGS. 27A to 27D), it is preferable that the diameter of the mask 155 is, for example, in a range larger than the widths of the first irradiation line 81 and the second irradiation line 82 formed in the surface laser process in step 204 and not more than the widths of the first groove portion 171 and the second groove portion 172 formed in the semiconductor removing process in step 202.

Moreover, in the case where the mask 155 is in a square shape in which each side extends along the first direction x or the second direction y (refer to FIG. 33A), it is preferable that the length of each side of the mask 155 is, for example, in a range larger than the widths of the first irradiation line 81 and the second irradiation line 82, and not more than the distance between the adjacent protecting films 151.

Still further, in the case where the mask 155 is in a square shape in which each diagonal line extends along the first direction x or the second direction y (refer to FIG. 33B), it is preferable that the length of each diagonal line of the mask 155 is, for example, in a range larger than the widths of the first irradiation line 81 and the second irradiation line 82, and not more than twice of the distance between the adjacent protecting films 151.

Here, if the diameter of the mask 155 is excessively large, since an area of the altered region 210a formed in the lower semiconductor layer 210 becomes large with increase of the diameter, the lower semiconductor layer 210 is largely shaved in the lower semiconductor top surface 213 side in the wet etching process in step 205. Then, in the case where the lower semiconductor layer 210 is largely shaved in the lower semiconductor top surface 213 side, the shape of the connecting portion 233 or the normal inclined surface 235d of the connecting side surface 235 as viewed from the third direction z is apt to be an arc shape with a large curvature.

When the curvature of the connecting portion 233 or the normal inclined surface 235d becomes large, in comparison with the case of small curvature, for example, in a case where other members or the like collide with the lower semiconductor layer 210, force tends to concentrate on the connecting portion or the like, and accordingly, there is a concern about occurrence of cracking or chipping in the lower semiconductor layer 210.

Moreover, if the diameter of the mask 155 is excessively small, since the area of the altered region 210a also becomes small with decrease of the diameter, there are some cases where erosion of the lower semiconductor layer 210 in the lower semiconductor top surface 213 side from the altered region 210a as the starting point is not sufficiently performed in the wet etching process in step 205. Then, in the case where the erosion starting from the altered region 210a is insufficient, there is a tendency that the above-described connecting portion 233 or the normal inclined surface 235d in the connecting side surface 235 is not formed, or the shape of the connecting portion 233 or the normal inclined surface 235d becomes an arc shape with a large curvature.

Further, when the diameter of the mask 155 is excessively small, since the area of the altered region 210a also becomes small with decrease of the diameter, there is a tendency that the first irradiation line 81 and the second irradiation line 82 formed in the surface laser process in step 204 become difficult to cross each other on the mask 155. In the case where the first irradiation line 81 and the second irradiation line 82 do not cross each other on the mask 155, as described above, in the lower semiconductor layer 210 divided into the plural regions by the first irradiation line 81 and the second irradiation line 82, there are some regions in which the altered region 210a is not formed. Then, in the lower semiconductor layer 210 in which the altered region 210a is not formed, since the lower semiconductor top surface 213 side does not become the starting point of the etching in the wet etching process in step 205, the above-described normal inclined surface 235d is not formed in some cases.

It should be noted that, in the manufacturing process of the semiconductor light emitting element 1 in the exemplary embodiment, the altered region 210a, in which the laminated semiconductor layer 200 (the lower semiconductor layer 210) was altered, was formed in the intersecting portion 173 by laminating the mask 155 on the intersecting portion 173 in the film forming process in step 203. However, as a method of forming the altered region 210a is not limited to lamination of the mask 155, and for example, the altered region 210a, in which the laminated semiconductor layer 200 (the lower semiconductor layer 210) is altered, may be formed by applying a treatment such as oxidation-reduction to the laminated semiconductor layer 200 (the lower semiconductor layer 210) exposed at the intersecting portion 173.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light emitting element provided with a semiconductor layer including a light emitting layer that emits light by passing a current, wherein
   the semiconductor layer has a semiconductor bottom surface, a semiconductor side surface that rises from a first edge of the semiconductor bottom surface upwardly and outwardly of the semiconductor layer, and a semiconductor top surface that faces upward by extending inwardly of the semiconductor layer from a second edge in an upper portion of the semiconductor side surface, and
   the second edge includes a plurality of linear portions that extend linearly and a plurality of connecting portions, each of which connects adjacent linear portions, and from a view in a direction perpendicular to the semiconductor top surface, each of the plurality of connecting portions is positioned inside a point of intersection of extended lines of two linear portions that are connected to the connecting portions, wherein
   the semiconductor side surface includes a linear portion side surface that rises from the first edge toward the linear portion in the second edge and a connecting side surface that rises from the first edge toward the connecting portion in the second edge, and
   the connecting side surface includes an inclined portion that rises from the first edge upwardly and outwardly of the semiconductor layer and a vertical portion that rises from the inclined portion upwardly to the connecting portion in the second edge.

2. The semiconductor light emitting element according to claim 1, wherein
   from the view in a direction perpendicular to the semiconductor to surface, the plurality of linear portions include, the semiconductor layer, a first linear portion that extends in a first direction and a second linear portion that extends in a second direction perpendicular to the first direction and is connected to the first linear portion via a connecting portion, and X, Y and L satisfy the following relation:

$$L^2 = A \times (X^2 + Y^2),\ 0 < A \leq 0.95$$

where a shortest distance from the first linear portion to the first edge is X, a shortest distance from the second linear portion to the first edge is Y, and a shortest distance from a point of intersection of a straight line and the connecting portion to the first edge is L, the straight line connecting a shortest distance from a point of intersection of an extended line of the first linear portion and an extended line of the second linear portion to the first edge.

3. The semiconductor light emitting element according to claim 1, wherein
   the connecting portions have an arc shape in the view of the semiconductor layer from the direction perpendicular to the semiconductor top surface.

4. The semiconductor light emitting element according to claim 1, wherein
   the semiconductor side surface includes a linear portion side surface that rises from the first edge toward the linear portion in the second edge and a connecting side surface that rises from the first edge toward the connecting portion in the second edge, and
   the connecting side surface includes an outward inclined surface that is inclined upwardly and outwardly of the semiconductor layer from the first edge and an inward inclined surface that is inclined upwardly and inwardly of the semiconductor layer from an upper end of the outward inclined surface toward the connecting portion in the second edge.

* * * * *